(12) United States Patent
Tani et al.

(10) Patent No.: US 9,040,975 B2
(45) Date of Patent: May 26, 2015

(54) ORGANIC ELECTROLUMINESCENCE ELEMENT, ILLUMINATION DEVICE, AND DISPLAY DEVICE

(75) Inventors: Kunio Tani, Hachioji (JP); Rie Katakura, Hino (JP); Satoru Inoue, Hino (JP)

(73) Assignee: KONICA MINOLTA, INC., Tokyo (JP)

(*) Notice: Subject to any disclaimer, the term of this patent is extended or adjusted under 35 U.S.C. 154(b) by 4 days.

(21) Appl. No.: 14/119,533

(22) PCT Filed: Jun. 11, 2012

(86) PCT No.: PCT/JP2012/064884
§ 371 (c)(1),
(2), (4) Date: Nov. 22, 2013

(87) PCT Pub. No.: WO2012/173079
PCT Pub. Date: Dec. 20, 2012

(65) Prior Publication Data
US 2014/0091299 A1    Apr. 3, 2014

(30) Foreign Application Priority Data
Jun. 15, 2011 (JP) .................. 2011-133044

(51) Int. Cl.
*H01L 35/24* (2006.01)
*H01L 51/00* (2006.01)
(Continued)

(52) U.S. Cl.
CPC .......... *H01L 51/0052* (2013.01); *C09K 11/06* (2013.01); *Y02B 20/181* (2013.01);
(Continued)

(58) Field of Classification Search
CPC ............ G09G 2310/0262; G09G 3/3233; G09G 3/3258; G09G 3/3266; G09G 3/3275; H01L 33/50; H01L 33/58; H01L 33/60; H01L 21/02521; H01L 21/02546; H01L 21/02579; H01L 21/0262; H01L 21/02642; H01L 21/02647; H01L 33/007; H01L 33/641; H01L 21/0237; H01L 21/0242; H01L 21/02458; H01L 33/36; H01L 33/64; H01L 21/0254; Y10S 977/742
USPC ......... 257/12–13, 40, 81, 84, 87–89, 98–100, 257/347–348, 433–434; 345/76, 85, 345/211–212
See application file for complete search history.

(56) References Cited

U.S. PATENT DOCUMENTS 6,097,147 A    8/2000    Baldo et al.
2008/0003455 A1 *   1/2008    Li et al. ................... 428/690
(Continued)

FOREIGN PATENT DOCUMENTS

JP    5-326149 A    12/1993
JP    6-207170 A    7/1994
(Continued)

OTHER PUBLICATIONS

International Search Report of PCT/JP2012/064884 dated Sep. 11, 2012.
(Continued)

*Primary Examiner* — Dung Le
(74) *Attorney, Agent, or Firm* — Lucas & Mercanti, LLP

(57) ABSTRACT

The purpose of the present invention is to provide: an organic electroluminescence element having a plurality of light-emitting dopants of different light-emitting wavelengths and emitting white light, the white-light-emitting organic electroluminescence element having excellent longevity, low-voltage driving, and chromatic stability, and also having a few dark spots; as well as an illumination device and a display device that use the element. This organic electroluminescence element contains at least one light-emitting layer sandwiched between a positive electrode and a negative electrode, the organic electroluminescence element characterized in that the light-emitting layer contribution ratio, defined as the ratio ΔPL/ΔEL of the photoluminescence intensity decay rate to the electroluminescence intensity decay rate, is 0.3 to 1.0.

15 Claims, 5 Drawing Sheets

(51) Int. Cl.
*C09K 11/06* (2006.01)
*H05B 33/14* (2006.01)
*H01L 51/50* (2006.01)
*C08L 65/00* (2006.01)

(52) U.S. Cl.
CPC ........ *H01L51/0059* (2013.01); *H01L 51/0067* (2013.01); *H01L 51/0072* (2013.01); *H01L 51/0073* (2013.01); *H01L 51/0085* (2013.01); *H01L 2251/308* (2013.01); *H05B 33/14* (2013.01); *C09K 2211/1029* (2013.01); *C09K 2211/1044* (2013.01); *C09K 2211/1059* (2013.01); *C09K 2211/1074* (2013.01); *C09K 2211/1088* (2013.01); *C09K 2211/1092* (2013.01); *C09K 2211/1466* (2013.01); *C09K 2211/1475* (2013.01); *C09K 2211/1491* (2013.01); *C09K 2211/185* (2013.01); *C09K 2211/186* (2013.01); *H01L 51/006* (2013.01); *H01L 51/0081* (2013.01); *H01L 51/0084* (2013.01); *H01L 51/5012* (2013.01); *H01L 51/004* (2013.01); *H01L 51/0043* (2013.01); *H01L 51/0074* (2013.01); *H01L 51/5036* (2013.01); *H01L 2251/55* (2013.01); *C08L 65/00* (2013.01); *C08G 2261/3223* (2013.01); *C08G 2261/794* (2013.01); *C08G 2261/95* (2013.01)

(56) References Cited

U.S. PATENT DOCUMENTS

2008/0093987 A1* 4/2008 Park et al. ............... 313/504
2008/0182129 A1* 7/2008 Klubek et al. ............. 428/704
2010/0108984 A1* 5/2010 Cho et al. ................. 257/13
2010/0155711 A1* 6/2010 Hasegawa et al. ......... 257/40

FOREIGN PATENT DOCUMENTS

| JP | 2004-6066 A | 1/2004 |
|---|---|---|
| JP | 2004-235168 A | 8/2004 |
| JP | 2004-311424 A | 11/2004 |
| JP | 2004-335438 A | 11/2004 |
| JP | 2008-147398 A | 6/2008 |
| JP | 2008-147399 A | 6/2008 |
| JP | 2008-147400 A | 6/2008 |
| JP | 2009-108053 A | 5/2009 |
| JP | 2011-84531 A | 4/2011 |
| JP | 2011-109120 A | 6/2011 |
| WO | WO 2004/077886 A1 | 9/2004 |
| WO | WO 2005/122702 A2 | 12/2005 |
| WO | WO 2011/065137 A1 | 6/2011 |

OTHER PUBLICATIONS

M.A. Baldo et al; Highly Efficient Phosphorescent Emission From Organic Electroluminescent Devices; Letters to Nature; vol. 395; Sep. 10, 1998; pp. 151-154.

M.A. Baldo et al; High-Efficiency Fluorescent Organic Light-Emitting Devices Using a Phosphorant Sensitizer; Letters to Nature; vol. 48; Feb. 17, 2000; pp. 750-753.

International Preliminary Report on Patentability with Written Opinion in Japanese and English. Date of report: Dec. 17, 2013.

* cited by examiner

A

B

C

D

E

ORGANIC ELECTROLUMINESCENCE ELEMENT, ILLUMINATION DEVICE, AND DISPLAY DEVICE

CROSS REFERENCE TO RELATED APPLICATION

This Application is a 371 of PCT/JP2012/064884 filed on Jun. 11, 2012, which claims the priority of Japanese Patent Application No. 2011-133044 filed on Jun. 15, 2011, both applications being incorporated herein by reference in their entirety.

TECHNICAL FIELD

The present invention relates to an organic electroluminescence element, and an illumination device and a display device that use the organic electroluminescence element(s).

BACKGROUND ART

As a light-emitting electronic display device, there is an electroluminescent display (hereinafter abbreviated as ELD). A constituent element of an ELD is, for example, an inorganic electroluminescent element (hereinafter also referred to as an inorganic EL element) or an organic electroluminescent element (hereinafter also referred to as an organic EL element). An inorganic electroluminescent element has been used as a flat-type light source, but high-voltage alternating current is required to drive this light-emitting element.

On the other hand, an organic electroluminescent element has a configuration that a light-emitting layer including a light-emitting compound(s) is provided between an anode and a cathode. An organic electroluminescent element emits light through light emission (luminescence or phosphorescence) upon inactivation of excitons generated by recombining electrons and holes injected into the light-emitting layer. Further, an organic electroluminescent element can emit light with a voltage of several to several dozen volts. Still further, an organic electroluminescent element is a self-light-emitting type and thus achieves rich view angle and high visibility. In addition, because an organic electroluminescent element is a thin film type all-solid element, it is expected for its abilities to save space and to achieve portability.

In addition, an organic electroluminescent element is especially characterized by being a surface light source, different from a practically-used conventional light source such as a light-emitting diode and a cold-cathode tube. As applications effectively utilizing this characteristic, light sources for illumination and backlights of various displays are given as examples. It is also preferable to apply an organic electroluminescent element to a backlight of a liquid crystal full-color display being in significant demand increasing especially in recent years.

When an organic electroluminescent element is used for a light source for illumination such as the above or for a backlight of a display, the organic electroluminescent element is used as a light source emitting white light or light of a so-called light bulb color (hereinafter collectively called white light). Methods for obtaining white light emission in an organic electroluminescent element are exemplified by a method for obtaining white light by mixing colors through using a plurality of light-emitting dopants having different emission wavelengths in a single element, a method for obtaining white light by mixing colors through using light-emitting pixels with different colors such as blue, green and red and making the light-emitting pixels simultaneously emit light, and a method for obtaining white light by using color conversion pigment(s) (for example, a combination of a blue light-emitting material(s) and a color conversion pigment(s)).

However, judging from requirements for a light source for illumination and a backlight such as low cost, high productivity and easy driving method, a method for obtaining white light by mixing colors through using a plurality of light-emitting dopants having different emission wavelengths in a single element is effective for these applications. Thus, research and development regarding this method have been ambitiously conducted.

Giving a detailed description of this method for obtaining white light, a method for obtaining white light by mixing colors of two light-emitting dopants, the colors being complementary color, such as a blue light-emitting dopant and a yellow light-emitting dopant, and a method for obtaining white light by mixing colors of a blue light-emitting dopant, a green light-emitting dopant and a red light-emitting dopant.

For example, a method for obtaining a white light-emitting organic electroluminescence element through doping a blue fluorescent body, a green fluorescent body and a red fluorescent body, all of which are efficient, as light-emitting materials (see Patent Documents 1 and 2, for example).

In addition, in a white light-emitting organic electroluminescence element, there is a method for obtaining emission of light of different colors through, using two or more light-emitting dopants, each of which emits light of color different from each other, in a single layer so as to efficiently transfer energy from a light-emitting dopant with a high emission energy to a light-emitting dopant with a relatively low emission energy, instead of using separate light-emitting layers each emitting light of color different from each other. This method reduces the amounts of light-emitting dopants to be used, and thus is an effective method. For example, Patent Document 3 discloses an organic electroluminescence element characterized by being configured to include an anode, a red light-emitting layer and a blue light-emitting layer in sequence, the red light-emitting layer including at least one green light-emitting dopant.

On the other hand, development of a phosphorescent dopant, which provides an organic electroluminescence element with a higher luminance compared to a fluorescent material (fluorescent dopant), has been vigorously conducted (see Patent Document 4 and Non-Patent Documents 1 and 2, for example), Light emission from a conventional fluorescent material is emission from an excited singlet state. Because the ratio of generating singlet excitons to generating triplet excitons is 1:3, the probability of generation of light-emitting excited species is 25%. In contrast, in the case of a phosphorescent dopant utilizing light emission from an excited triplet state, the maximum internal quantum efficiency is 100% because of the probability of generation of light-emitting excited species and an internal conversion of singlet excitons to triplet excitons. Thus, in principle, a phosphorescent dopant shows efficiency of light emission up to four times as high as that of a fluorescence-emitting dopant.

However, in the case where phosphorescent dopants are used and two or more dopants emitting light of two or more different colors are used in a single layer to emit light of different colors by energy transfer from a dopant having a relatively higher energy level to a dopant having a relatively lower energy level for obtaining a white light-emitting organic electroluminescence element, stability of chromaticity, a length of lifetime and a voltage required for driving according to conditions of driving, a time period of driving and/or a time period of storing are not satisfactory, compared to the case where white light is obtained by stacking a plurality of layers emitting light of colors different from each other. Light sources for illumination are especially demanding for stability of emission color, and therefore ensuring the stability of chromaticity is very important for practical realization of an organic electroluminescence element(s) in light sources for illumination. In addition, dark spots (non-light-emitting spots) are generated resulted from a long-term driving, which requires further technical improvements.

Patent Documents 5, 6 and 7 disclose methods for providing an element not causing pixel defects, requiring low voltage and achieving high efficiency by using a metal complex(es) as a hole-injecting material or a hole-transporting material. However, these documents do not disclose any examples regarding constitutions of a white light-emitting element using a phosphorescent material that emits blue light, and objectives of these documents do not relate to change in chromaticity over time that is important point in use for illumination. Further, these documents do not disclose ionization potentials (hereinafter referred to as IP) of a phosphorescent dopant and a metal complex.

PRIOR ART DOCUMENT

Patent Document

Patent document 1: Japanese Patent Application Laid-Open Publication No. Hei6-207170
Patent Document 2: Japanese Patent Application Laid-Open Publication No. 2004-235168
Patent Document 3: International Publication No. WO2004/077886
Patent Document 4: U.S. Pat. No. 6,097,147
Patent Document 5: Japanese Patent Application Laid-Open Publication No. 2008-147398
Patent Document 6: Japanese Patent Application Laid-Open Publication No. 2008-147399
Patent Document 7: Japanese Patent Application Laid-Open Publication No. 2008-147400

Non-Patent Document

Non-Patent Document 1: M. A. Baldo et al., Nature, Vol. 395, pp. 151-154 (1998)
Non-Patent Document 2: M. A. Baldo et al., Nature, Vol. 403(17), pp. 750-753 (2000)

SUMMARY OF THE INVENTION

Problem to be Solved by the Invention

The present invention is made given the above problems, and objects of the present invention is to provide a white light-emitting organic electroluminescence element including a plurality of light-emitting dopants, each of which emits light of wavelength different from each other, which element achieves a long lifetime, driving requiring low voltage, excellent stability and few dark spots, and to provide an illumination device a display device that use the organic electroluminescence element(s).

Means for Solving Problem

The above objects are accomplished by the following configurations.

1. An organic electroluminescence element including at least one light-emitting layer provided between an anode and a cathode, wherein a contribution ratio of the light-emitting layer is 0.3 or more and 1.0 or less, the contribution ratio ($\Delta PL/\Delta EL$) of the light-emitting layer being defined as a ratio of a decay rate of photoluminescence intensity ($\Delta PL$) to a decay rate of electroluminescence intensity ($\Delta EL$).

2. The organic electroluminescence element of the above 1, wherein
the light-emitting layer includes at least one phosphorescent compound.

3. The organic electroluminescence element of the above 1 or 2, wherein
a UV degradation resistance ratio of the at least one light-emitting layer as a single film is 0.6 or more.

4. The organic electroluminescence element of the above 2 or 3, wherein
a hole-transporting layer is provided between the anode and the light-emitting layer and adjacent to the light-emitting layer, and
an ionization potential of the at least one phosphorescent compound ranges from −0.3 to 0.2 eV relative to an ionization potential of at least one hole-transporting material contained in the hole-transporting layer.

5. The organic electroluminescence element of the above 4, wherein
a hole-injecting layer is provided between the anode and the hole-transporting layer, and
an ionization potential of at least one hole-injecting material contained in the hole-injecting layer ranges from −0.2 to 0.3 eV relative to a work function of the anode and ranges from −0.3 to 0.2 eV relative to the ionization potential of the at least one hole-transporting material contained in the hole-transporting layer.

6. The organic electroluminescence element of any one of the above 2 to 5, wherein
the at least one of the phosphorescent compound(s) has a maximum emission wavelength of 480 nm or less.

7. The organic electroluminescence element of any one of the above 4 to 6, wherein
the hole-transporting layer includes at least one organic metal complex.

8. The organic electroluminescence element of the above 7, wherein
the organic metal complex is represented by a general formula (1);

[Chemical Formula 1]

General formula (1)

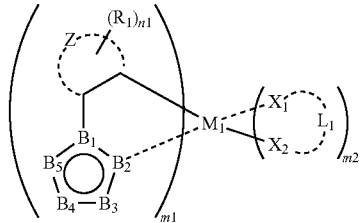

wherein $R_1$ represents a substituent; Z represents a group of non-metal atoms necessary for forming a five to seven-membered ring; n1 represents an integer from 0 to 5; $B_1$ to $B_5$ each represent a carbon atom, a nitrogen atom, an oxygen atom or a sulfur atom and at least one of $B_1$ to $B_5$ represents a nitrogen atom, wherein a monocyclic nitrogen-containing aromatic hetero ring consists of these five atoms; $M_1$ represents a metal of Group 8 to 10 of the periodic table; $X_1$ and $X_2$ each represent a carbon atom, a nitrogen atom or an oxygen atom; $L_1$ represents a group of atoms forming a bidentate ligand together with $X_1$ and $X_2$; m1 represents an integer from 1 to 3; m2 represents an integer from 0 to 2; and m1+m2 equals to 2 or 3.

9. The organic electroluminescence element of any one of the above 2 to 8, wherein
the phosphorescent compound in the light-emitting layer is represented by the general formula (1).

10. The organic electroluminescence element of any one of the above 7 to 9, wherein
the phosphorescent compound in the light-emitting layer adjacent to the hole-transporting layer and the at least one organic metal complex in the hole-transporting layer are the same.

11. The organic electroluminescence element of any one of the above 2 to 10, wherein
the light-emitting layer including the at least one phosphorescent compound includes a compound represented by a general formula (2);

[Chemical Formula 2]

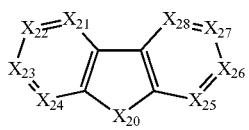

General formula (2)

wherein $X_{20}$ represents O or S; $X_{21}$ to $X_{28}$ each represent $C(R_{20})$ or N; $R_{20}$ represents a hydrogen atom or a substituent; and at least one $R_{20}$ is represented by a following general formula (b1);

[Chemical Formula 3]

$Ar_{20}-(L_{20})_{n23}-*$   General formula (b1)

wherein $L_{20}$ represents a divalent liking group derived from an aromatic hydrocarbon ring or an aromatic hetero ring; n23 represents an integer from 0 to 3; in the case where n23 is 2 or more, $L_{20}$s may be the same or different from each other; * represents a linking site to a scaffold of the general formula (2); and $Ar_{20}$ represents a group represented by a following general formula (b2);

[Chemical Formula 4]

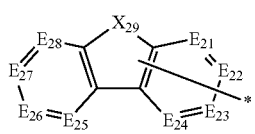

General formula (b2)

wherein $X_{29}$ represents $N(R_{21})$, O or S; $E_{21}$ to $E_{28}$ each represent $C(R_{22})$ or N; $R_{21}$ and $R_{22}$ each represent a hydrogen atom, a substituent or a linking site to $L_{20}$; and * represents a linking site to $L_{20}$.

12. The organic electroluminescence element of the above 11, wherein
a layer including the compound represented by the general formula (2) is formed by a wet method.

13. The organic electroluminescence element of any one of the above 1 to 12, wherein
the organic electroluminescence element emits white light.

14. An illumination, device including the organic electroluminescence element of any one of the above 1 to 13.

15. A display device including the organic electroluminescence element of any one of the above 1 to 13.

Effect of the Invention

The present invention can provide a white light-emitting organic electroluminescence element including a plurality of light-emitting dopants, each of which emits light of wavelength different from each other, the organic electroluminescence element being characterized by achieving a long lifetime, driving requiring low voltage, excellent stability and few dark spots, and an illumination device and a display device that use the organic electroluminescence element(s).

EMBODIMENT FOR CARRYING OUT THE INVENTION

Figure 1:
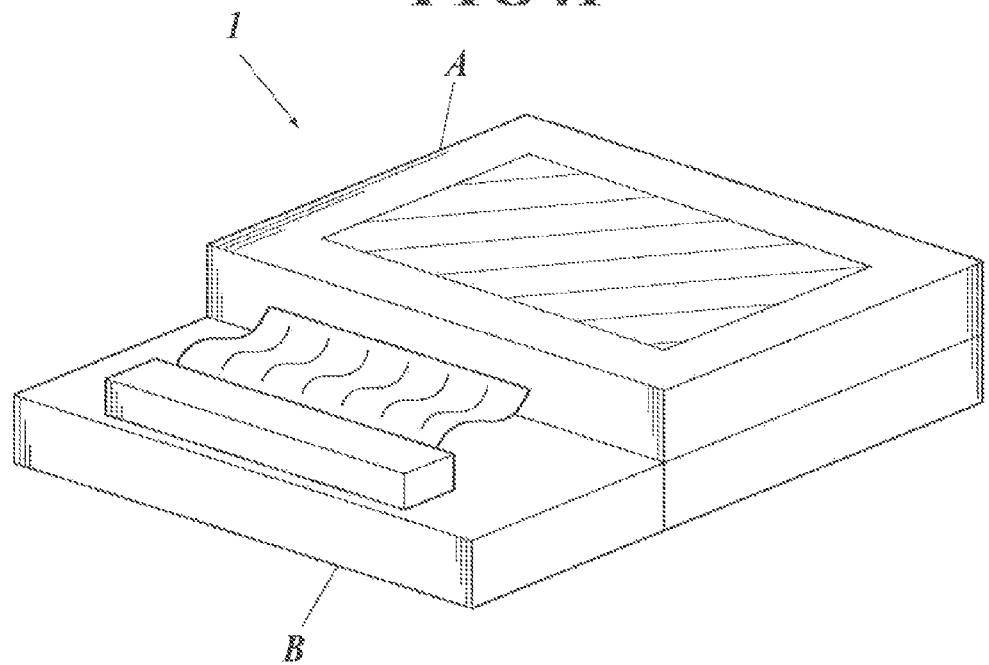
FIG. 1 This is a schematic diagram illustrating an example of a display device constituted by an organic EL element(s).

Embodiments for carrying out the present invention will now be described.

<<Contribution Ratio of Light-Emitting Layer>>

The present inventors have been eagerly studied and revealed that an organic electroluminescence element including one or more light-emitting layers between an anode and a cathode wherein a contribution ratio of the light-emitting layer is 0.3 or more and 1.0 or less, the contribution ratio ($\Delta PL/\Delta EL$) of the light-emitting layer being defined as a ratio of a decay rate of photoluminescence intensity ($\Delta PL$) to a decay rate of electroluminescence intensity ($\Delta EL$) achieves the effects to be obtained, and the present invention has thus been made.

$\Delta EL$ and $\Delta PL$ mean a decay rate of electroluminescence (EL) intensity after driving and a decay rate of photoluminescence (PL) intensity after driving, respectively, and can be represented by the following equations.

$\Delta EL = 1-[EL(\text{after driving})/EL(\text{initial state})]$ $\Delta PL = 1-[PL(\text{after driving})/PL(\text{initial state})]$ In the present invention, values at the time when $\Delta EL$ decreases by half are used. An organic EL element is driven until electroluminescence intensity decreases by half compared to the initial intensity (at this stage, $\Delta EL=0.5$), and then intensity at maximum photoluminescence is obtained by measuring PL (i.e., photoluminescence) spectrum. Thereafter, a decay rate is calculated from this intensity and an initial PL intensity before the organic EL element is driven.

A contribution ratio of the light-emitting layer, $\Delta PL/\Delta EL$, ranges preferably from 0.4 to 1.0, and more preferably from 0.5 to 1.0. Its upper limit is 1.0.

Being in the above range, light emission may effectively occur in a light-emitting layer. In the case of driving causing photoluminescence, an area of an element is irradiated with light and light emission occurs areally. On the other hand, in the case of driving causing electroluminescence, light emission occurs locally (especially at an interface of a light-emitting layer). When such a local light emission highly contributes to light emission, load on such local spots emitting light is high, which is thought to decrease a life time and stability of light emission. The above-defined contribution ratio of the light-emitting layer may be an indicator of contribution of light emission except for local light emission at, for example, an interface to light emission.

PL spectrum can be measured using USB2000 (manufactured by Ocean Optics, Inc.) at 23° C. and at an excitation wavelength of 365 nm. The measurement can be performed within 2 hours after the time at which an organic EL element has been driven until the intensity decreases by half.

The effects are achieved more greatly in the case where a light-emitting layer is thick. The thickness of a light-emitting layer ranges preferably from 20 to 150 nm. Particularly, a thickness ranging from 50 to 130 nm is preferable. One or more light-emitting layers may be provided, but in terms of ΔPL/ΔEL and stability of chromaticity, it is preferable that a single light-emitting layer is provided. Employing these configurations is thought to largely decrease local light emission by electroluminescence in driving. In addition, the effects are achieved more greatly when a compound(s) represented by the general formula (1) or (2) is used. These configurations are preferably employed in combination.

<<UV Degradation Resistance Ratio>>

In the present invention, a UV degradation resistance ratio is represented by the equation; UV degradation ratio=PL (after irradiation with UV)/PL (before irradiation with UV). This ratio is a ratio of intensity of maximum luminescence before and after irradiating a 50 nm-thick single light-emitting layer having been formed by deposition or a wet method as typified by spin coating on a quartz substrate, on which only the light-emitting layer is provided, with light having maximum luminance at 365 nm at an irradiation distance of 1 cm for 20 minutes using LIGHTNINGCURE LC8 which is a spot light source (manufactured by Hamamatsu Photonics K.K.), the intensity of maximum luminescence being measured by PL spectrum measurement (using USE 2000). Power of the spot light source is adjusted so that the number of photons absorbed by each element is fixed. Evaluations are thus conducted using light of wavelength 365 nm because a blue phosphorescent dopant of the present invention has a maximum absorption wavelength of about 365 nm.

It is revealed that when a UV degradation resistance ratio is 0.6 or more, not only a life time is significantly lengthened but also stability of chromaticity is significantly improved. This ratio is thought to relate to non-locality of light-emitting portions except for portions at an interface of a light-emitting layer in driving causing EL, and ranges preferably from 0.7 to 1.0.

<<Work Function and Ionization Potential>>

The more similar the values from the work function (eV) of indium tin oxide (ITO) to the IP (ionization potential, eV) of the light-emitting layer are, the greater the effects of the present invention are. In such a case, it is preferable that the light-emitting layer is adjacent to a hole-transporting layer and an IP of at least one phosphorescent compound in the light-emitting layer ranges from −0.3 to 0.2 eV relative to an IP of at least one hole-transporting material. In this case, it is surprisingly revealed that defect in light emission (i.e., dark spots) is decreased. Adjusting difference between IPs of layers from an EML (light-emitting layer) to an HTL (hole-transporting layer) may decrease Joule heating derived from an energy barrier between the EML and HTL and thus may decrease degradation of the material(s) by heat, and crystallization and reorientation of a material(s) having low Tg. Dark spots may be thus decreased. Further, it is revealed that when a light-emitting dopant(s) and an HT (hole-transporting) material(s) are both metal complexes, the effects are achieved more greatly. Charge transportation at an interface may be improved and may provide the above effects.

In an organic EL element that emits white light, at least one phosphorescent compound has the minimum IP. Among dopants in a light-emitting layer, a dopant having the minimum IP tends to be a carrier trap, and thus has a large influence on performance of an element.

In the case where phosphorescent compounds are used in a single layer in a multicolor organic EL element that emits white light, a dopant having the minimum IP is preferably a blue phosphorescent dopant. This is because energy transfers from a blue light-emitting material at a highest triplet excitation state to a green and/or red light-emitting material, which is one of the principles of white light emission.

It is also preferable that a hole-injecting layer is provided between the anode and the hole-transporting layer, and further an IP of a hole-injecting material in the hole-injecting layer ranges from −0.2 to 0.3 eV relative to a work function of the anode and also ranges from −0.3 to 0.2 eV relative to an IP of at least one hole-transporting material in the hole-transporting layer.

An ionization potential (ionizaonization energy) is defined as an energy required to remove an electron of a compound from a HOMO (highest occupied molecular orbital) level to a vacuum level. In the present invention, an ionization potential can be obtained by the following way.

An ionization potential can be obtained by direct measurement using photoelectron spectrometry. For example, "Model AC-1", which is a low-energy electron spectrometer manufactured by RIKEN KEIKI Co., Ltd. and ESCA 5600 UPS (ultraviolet photoemission spectroscopy) manufactured by ULVAC-PHI, Inc. are preferably used. A method known as Ultraviolet Photoelectron Spectroscopy is also preferably used.

Ionization potentials (highest occupied molecular orbitals, HOMOs) of a metal complex, a hole-transporting material and a hole-injecting material can be measured using Ultraviolet Photoelectron Spectroscopy (UPS), for example. A film consisting of one of the above materials formed on a glass substrate is measured by UPS to obtain its IP value.

<<Compound Represented by General Formula (1)>>

In the present invention, a metal complex represented by the general formula (1) is preferably a phosphorescent compound in the light-emitting layer described later.

It is also preferable to include an organic metal complex represented by the general formula (1) as the hole-transporting material.

[Chemical Formula 5]

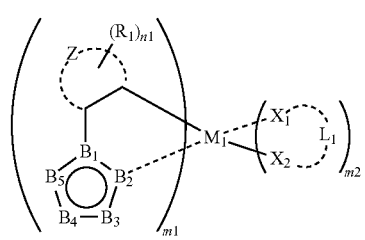

General Formula (1)

In the formula, $R_1$ represents a substituent; Z represents a group of non-metal atoms necessary for forming a five to seven-membered ring; n1 represents an integer from 0 to 5; $B_1$ to $B_5$ each represent a carbon atom, a nitrogen atom, an oxygen atom or a sulfur atom and at least one of $B_1$ to $B_5$ represents a nitrogen atom, wherein a monocyclic nitrogen-containing aromatic hetero ring consists of these five atoms; M represents a metal of Group 8 to 10 of the periodic table; $X_1$ and $X_2$ each represent a carbon atom, a nitrogen atom or an oxygen atom; $L_1$ represents a group of atoms forming a bidentate ligand together with $X_1$ and $X_2$; m1 represents an integer from 1 to 3; m2 represents an integer from 0 to 2; and m1+m2 equals to 2 or 3.

Examples of the substituent represented by $R_1$ include alkyl groups (such as a methyl group, ethyl group, propyl group, isopropyl group, tert-butyl group, pentyl group, hexyl group, octyl group, dodecyl group, tridecyl group, tetradecyl group, pentadecyl group), cycloalkyl groups (such as a cyclopentyl group and cyclohexyl group), alkenyl groups (such as a vinyl group and allyl group), alkynyl groups (such as an ethynyl group and propargyl group), aromatic hydrocarbon ring groups (also referred to as aromatic carbon ring groups or aryl groups, such as a phenyl group, p-chlorophenyl group, mesityl group, tolyl group, xylyl group, naphthyl group, anthryl group, azulenyl group, acenaphthenyl group, fluorenyl group, phenanthryl group, indenyl group, pyrenyl group and biphenyl group), aromatic hetero ring groups (such as a pyridyl group, pyrimidinyl group, furyl group, pyrrolyl group, imidazolyl group, benzoimidazolyl group, pyrazolyl group, pyrazinyl group, triazolyl group (exemplified by 1,2,4-triazole-1-yl group and 1,2,3-triazole-1-yl group), oxazolyl group, benzoxazolyl group, thiazolyl group, isoxazolyl group, isothiazolyl group, furazanyl group, thienyl group, quinolyl group, benzofuryl group, dibenzofuryl group, benzothienyl group, dibenzothienyl group, indolyl group, carbazolyl group, carbolinyl group, diazacarbazolyl group (a group where one of the carbon atoms of the carboline ring of the carbolinyl group is substituted with a nitrogen atom), quinoxalinyl group, pyridazinyl group, triazinyl group, quinazolinyl group and phthalazinyl group), hetero ring groups (such as a pyrrolidyl group, imidazolidyl group, morpholyl group and oxazolidyl group), alkoxy groups (such as a methoxy group, ethoxy group, propyloxy group, pentyloxy group, hexyloxy group, octyloxy group and dodecyloxy group), cycloalkoxy groups (such as cyclopentyloxy group and cyclohexyloxy group), aryloxy groups (such as a phenoxy group and naphthyloxy group), alkylthio groups (such as a methylthio group, ethylthio group, propylthio group, pentylthio group, hexylthio group, octylthio group and dodecylthio group), cycloalkylthio groups (such as a cyclopentylthio group and cyclohexylthio group), arylthio groups (such as a phenylthio group and naphthylthio group), alkoxycarbonyl groups (such as a methyloxycarbonyl group, ethyloxycarbonyl group, butyloxycarbonyl group, octyloxycarbonyl group and dodecyloxycarbonyl group), aryloxycarbonyl groups (such as a phenyloxycarbonyl group and naphthyloxycarbonyl group), sulfamoyl groups (such as an aminosulfonyl group, methylaminosulfonyl group, dimethylaminosulfonyl group, butylaminosulfonyl group, hexylaminosulfonyl group, cyclohexylaminosulfonyl group, octylaminosulfonyl group, dodecylaminosulfonyl group, phenylaminosulfonyl group, naphthylaminosulfonyl group and 2-pyridylaminosulfonyl group), acyl groups (such as an acetyl group, ethylcarbonyl group, propylcarbonyl group, pentylcarbonyl group, cyclohexyl carbonyl group, octylcarbonyl group, 2 ethylhexylcarbonyl group, dodecylcarbonyl group, phenylcarbonyl group, naphthylcarbonyl group and pyridylcarbonyl group), acyloxy groups (such as an acetyloxy group, ethylcarbonyloxy group, butylcarbonyloxy group, octylcarbonyloxy group, dodecylcarbonyloxy group and phenylcarbonyloxy group), amide groups (such as a methylcarbonylamino group, ethylcarbonylamino group, dimethylcarbonylamino group, propylcarbonylamino group, pentylcarbonylamino group, cyclohexylcarbonylamino group, 2-ethyhexylcarbonylamino group, octylcarbonylamino group, dodecylcarnobylamino group, phenylcarbonylamino group and naphthylcarbonylamino group), carbamoyl groups (such as aminocarbonyl group, methylaminocarbonyl group, dimethylaminocarbonyl group, propylaminocarbonyl group, pentylaminocarbonyl group, cyclohexyl carbonylamino group, octylaminocarbonyl group, 2-ethylhexylaminocarbonyl group, dodecylaminocarbonyl group, phenylaminocarbonyl group, naphthylaminocarbonyl group and 2-pyridylaminocarbonyl group) ureido groups (such as a methylureido group, ethylureido group, pentylureido group, cyclohexylureido group, octylureido group, dodecylureido group, phenylureido group, naphthylureido group and 2-pyridylaminoureido group), sulfinyl groups (such as a methylsulfinyl group, ethylsulfinyl group, butylsulfinyl group, cyclohexylsulfinyl group, 2-ethylhexylsulfinyl group, dodecylsulfinyl group, phenylsulfinyl group, naphthylsulfinyl group and 2-pyridylsulfinyl group), alkylsulfonyl groups (such as a methylsulfonyl group, ethylsulfonyl group, butylsulfonyl group, cyclohexylsulfonyl group, 2-ethylhexylsulfonyl group and dodecylsulfonyl group), arylsulfonyl or heteroarylsulfonyl groups (such as a phenylsulfonyl group, naphthylsulfonyl group and 2-pyridylsulfonyl group), amino groups (such as an amino group, ethylamino group, dimethylamino group, butylamino group, cyclopentylamino group, 2-ethylhexylamino group, dodecylamino group, anilino group, naphthylamino group and 2-pyridylamino group), a cyano group, a nitro group, a hydroxy group, a mercapto group, silyl groups (such as a trimethylsilyl group, triisopropylsilyl group, triphenylsilyl group and phenyldimethylsilyl group).

A plurality of $R_1$s may be bound to each other to form a fused ring(s).

Among these substituents, alkyl groups and aryl groups are preferable, and non-substituted alkyl groups and non-substituted aryl groups are more preferable.

Z represents a group of non-metal atoms necessary for forming a five to seven-membered ring. Examples of the five to seven-membered ring formed with 2 include a benzene ring, naphthalene ring, pyridine ring, pyrimidine ring, pyrrole ring, thiophene ring, pyrazole ring, imidazole ring, oxazole ring and thiazole ring. Among them, a benzene ring is most preferable.

$B_1$ to $B_5$ each represent a carbon atom, a nitrogen atom, an oxygen atom or a sulfur atom and at least one of B1 to B5 represents a nitrogen atom. Examples of a nitrogen-containing aromatic hetero ring consists of these five atoms include a pyrrole ring, pyrazole ring, imidazole ring, triazole ring, tetrazole ring, oxazole ring, isoxazole ring, thiazole ring, isothiazole ring, oxadiazole ring and thiadiazole ring. Among them, a pyrazole ring and imidazole ring are preferable, and an imidazole ring is particularly preferable.

The nitrogen-containing aromatic hetero ring consists of these five atoms may have a substituent(s). Examples of such substituents include substituents as described for $R_1$. Such substituents may be bound to each other to form a fused ring(s), or may be bound to a five to seven-membered ring containing Z to form a fused ring derived from three rings.

$L_1$ represents a group of atoms forming a bidentate ligand together with $X_1$ and $X_2$. Examples of the bidentate ligand represented by $X_1$-$L_1$-$X_2$ include phenylpyridine, phenylpyrazole, phenylimidazole, phenyltriazole, phenyltetrazole, pyrazabole and acetyl acetone that are substituted or non-substituted. These groups may be substituted with the above substituent(s).

In the formula, m1 represents an integer from 1 to 3, and m2 represents an integer from 0 to 2, wherein m1+m2 equals to 2 or 3. Preferably, m2 is 0.

As a metal represented by $M_1$, a transition metal element of Group 8 to 10 of the periodic table (also referred to simply as a transition metal) is used. Iridium and platinum is preferable. Iridium is more preferable.

Specific examples of the phosphorescent dopant represented by the general formula (1) will now be described, but not limited thereto.

[Chemical Formula 6]

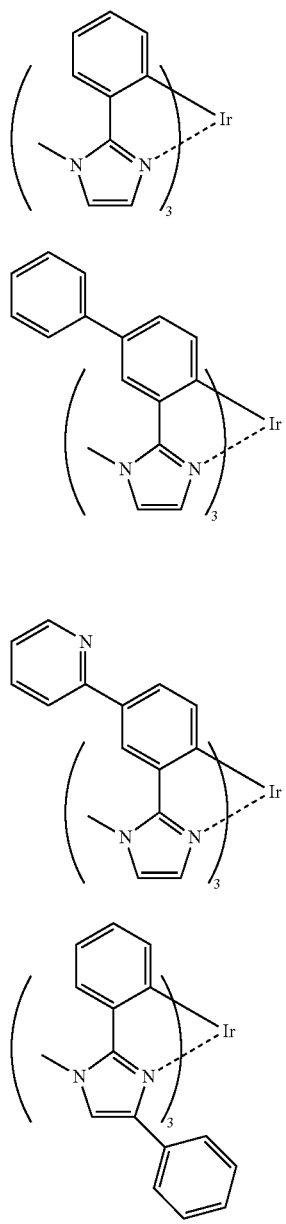

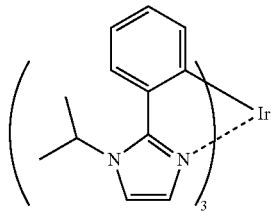

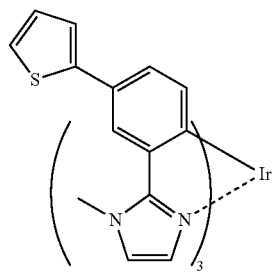

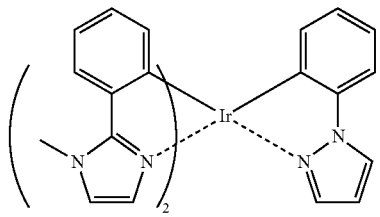

[Chemical Formula 7]
1-11
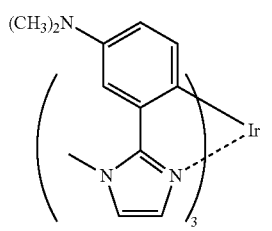
1-12
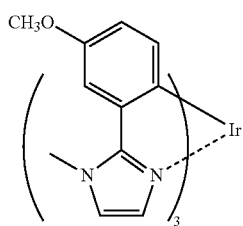
1-13
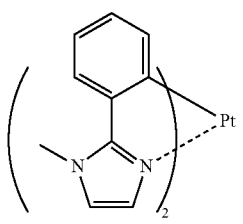
1-14
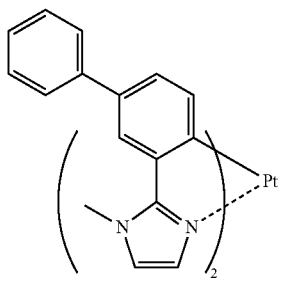
1-15
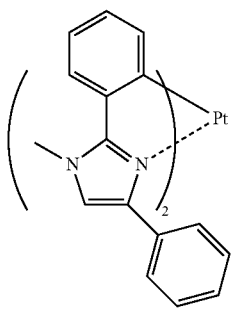
1-16
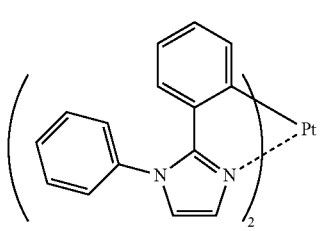
1-17
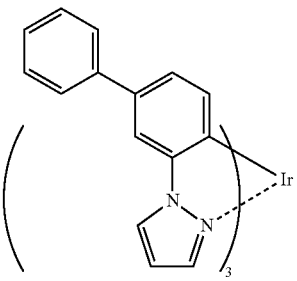
1-18
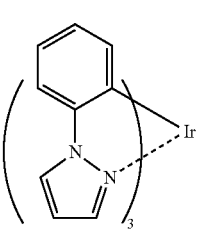
1-19
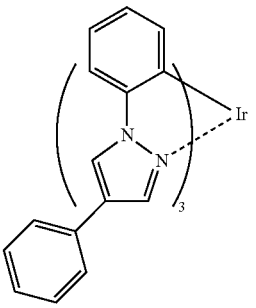
1-20
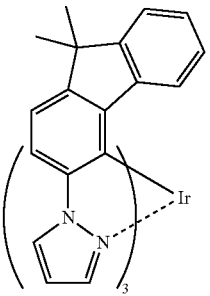
[Chemical Formula 8]
1-21
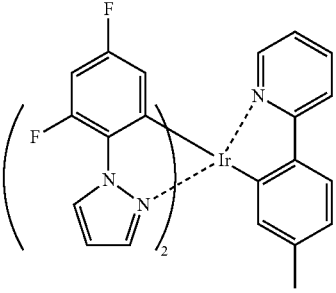

1-22
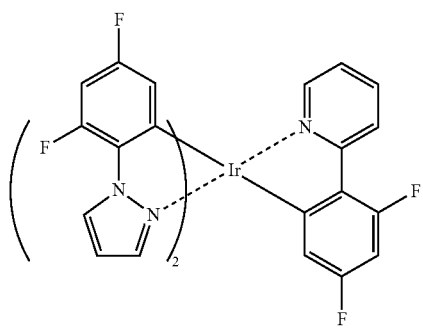
1-23
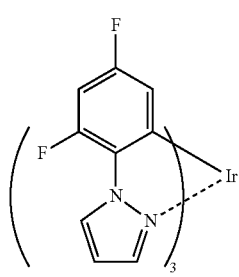
1-24
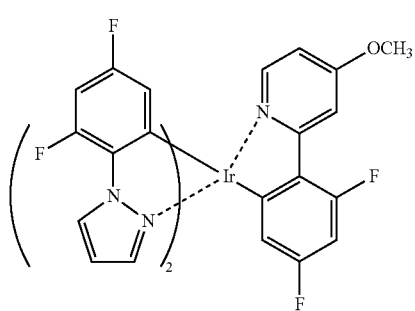
1-25
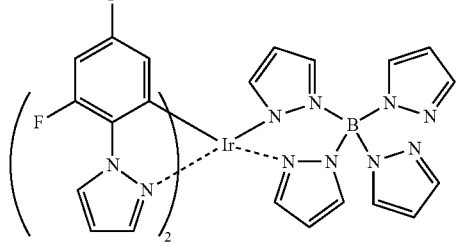
1-26
1-27
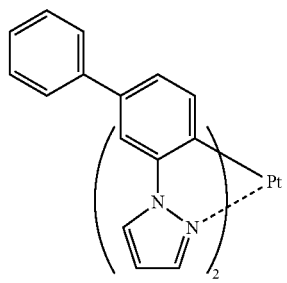
1-28
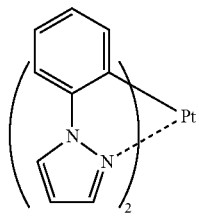
1-29
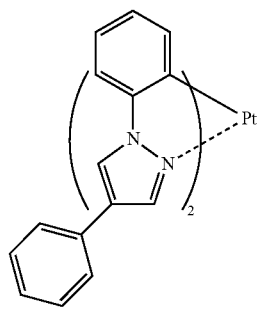
1-30
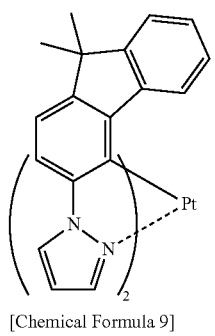
[Chemical Formula 9]
1-31
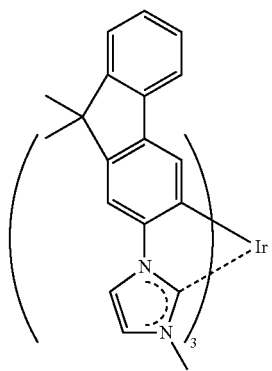

1-32 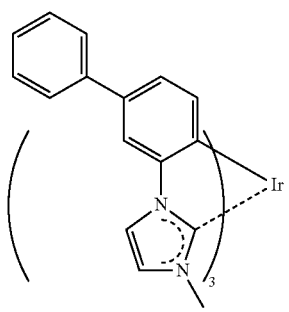
1-33 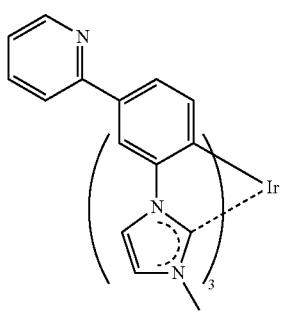
1-34 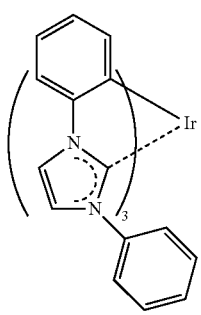
1-35 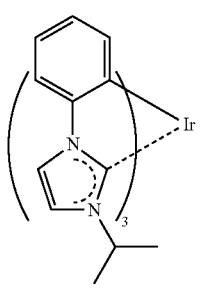
1-36 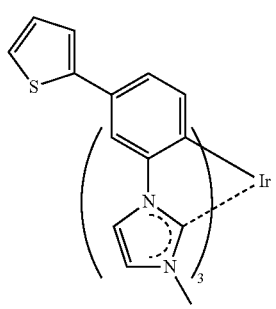
1-37 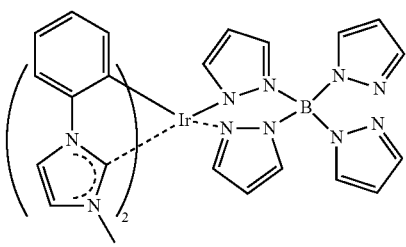
1-38 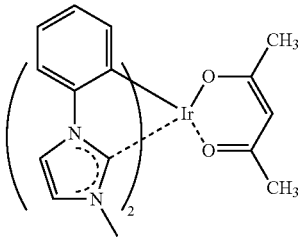
1-39 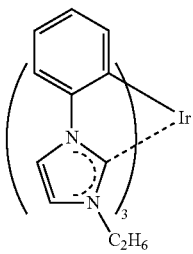
1-40 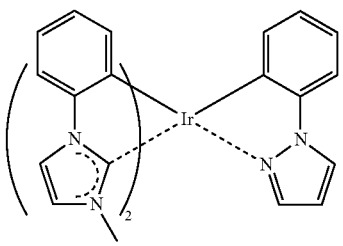
[Chemical Formula 10]
1-41 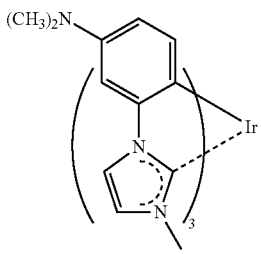
1-42 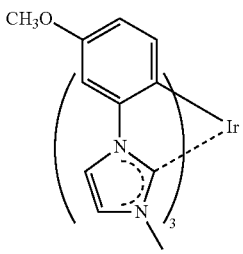

1-43 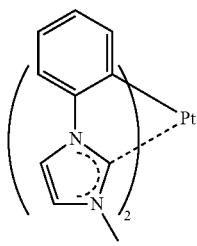
1-44 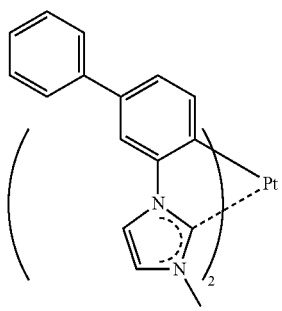
1-45 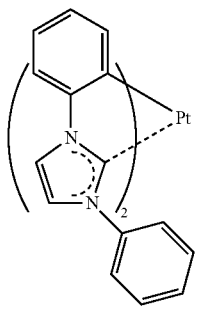
1-46 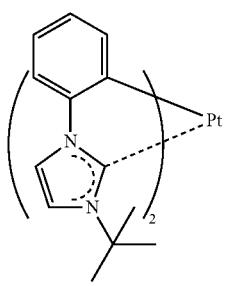
1-47 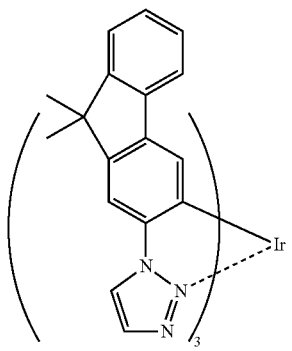
1-48 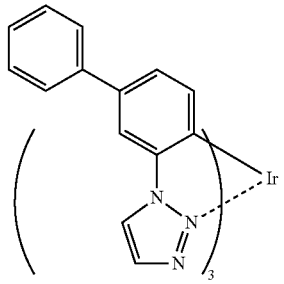
1-49 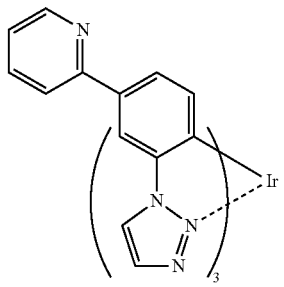
1-50 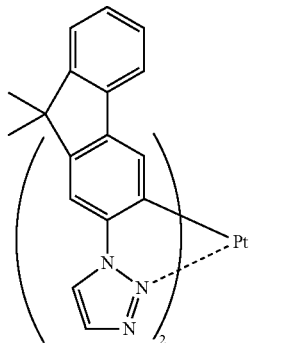
[Chemical Formula 11]
1-51 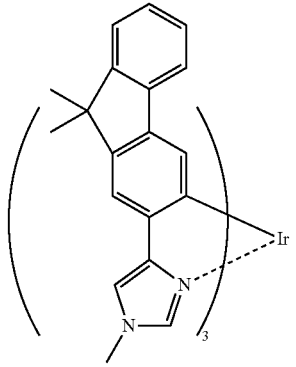

1-52
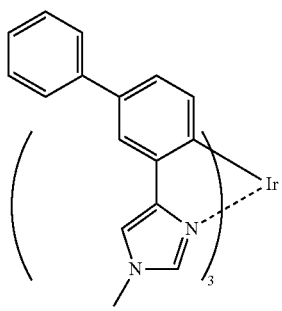
1-53
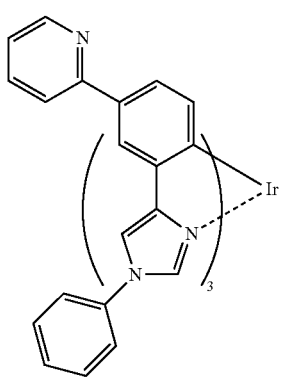
1-54
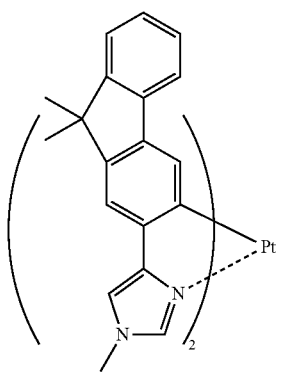
1-55
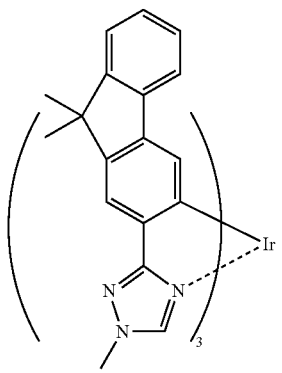
1-56
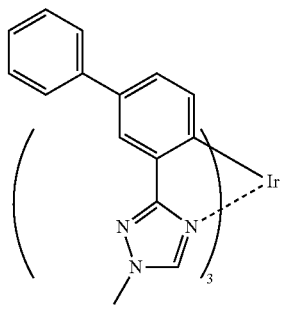
1-57
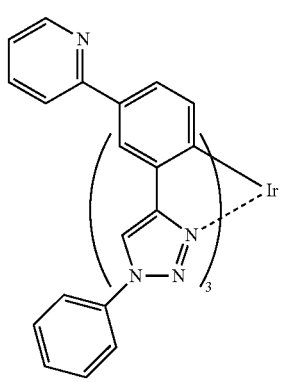
1-58
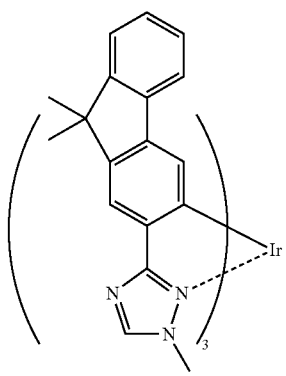
[Chemical Formula 12]
1-59
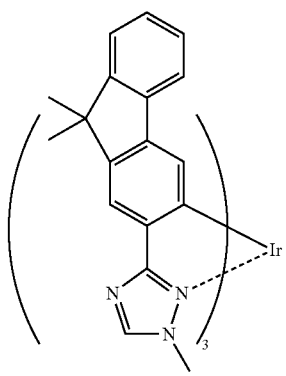

1-60
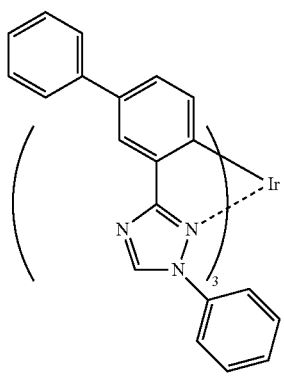
1-61
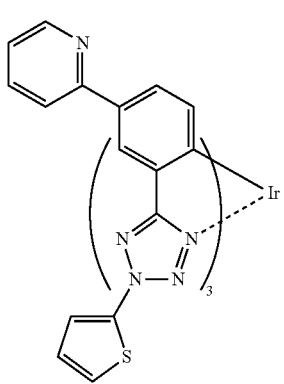
1-62
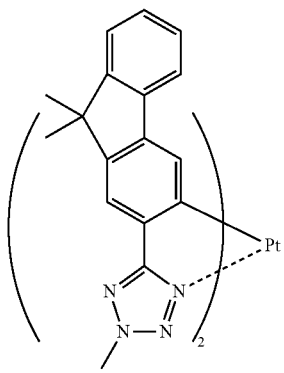
1-63
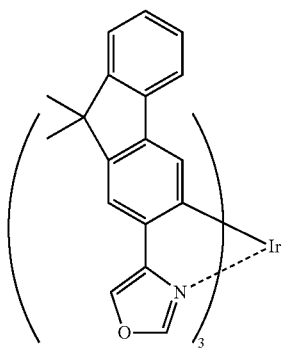
1-64
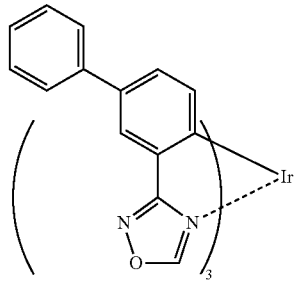
1-65
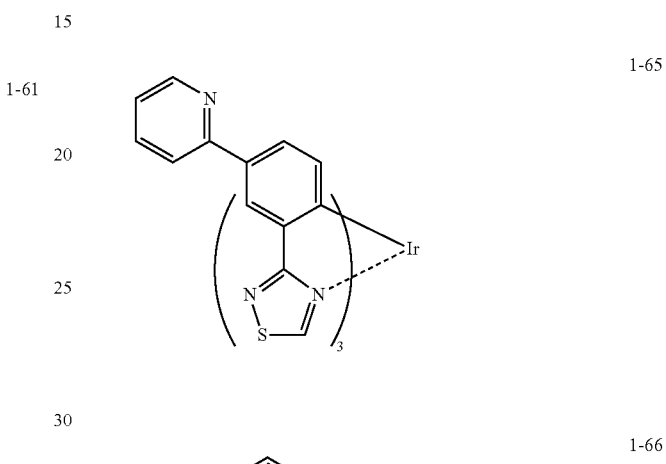
1-66
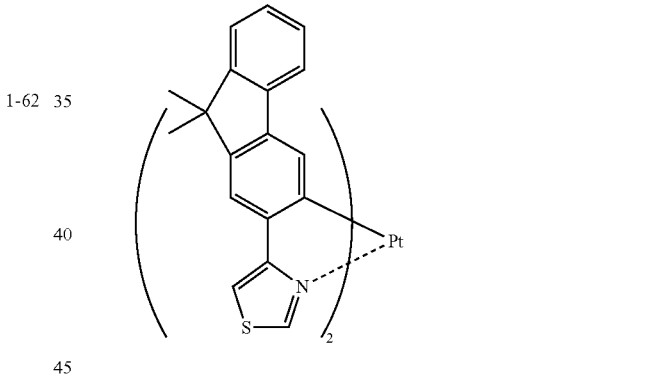
[Chemical Formula 13]
1-67
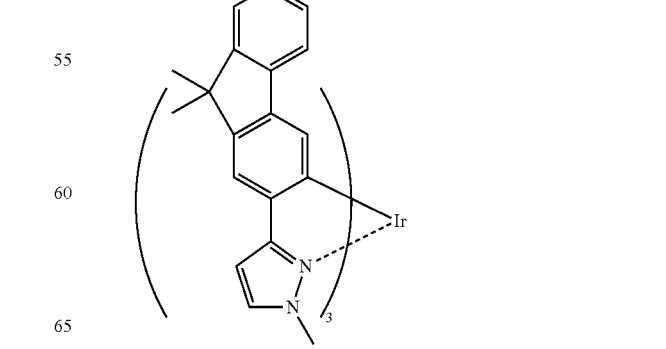

1-68
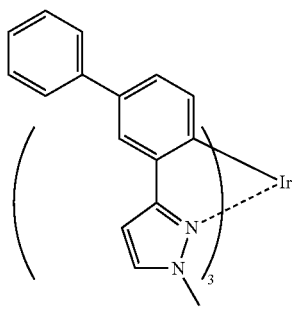
1-69
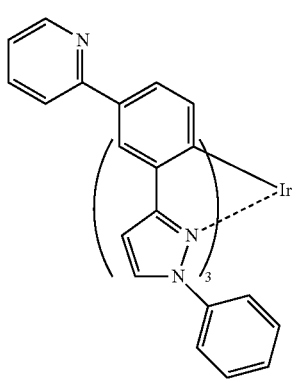
1-70
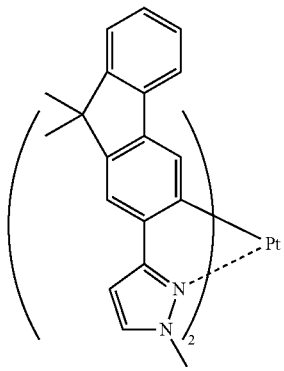
1-71
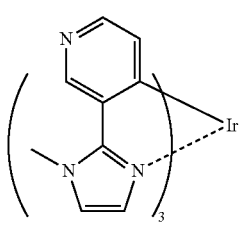
1-72
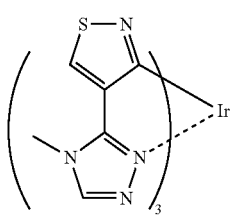
1-73
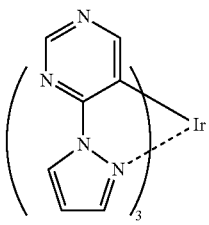
1-74
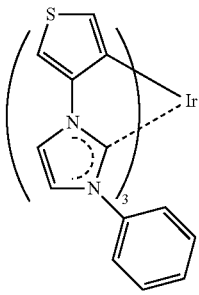
[Chemical Formula 14]
1-75
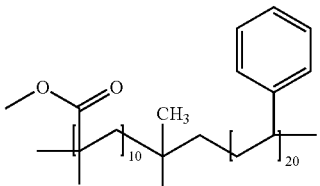
1-76
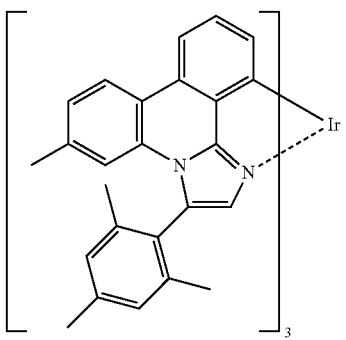

1-77
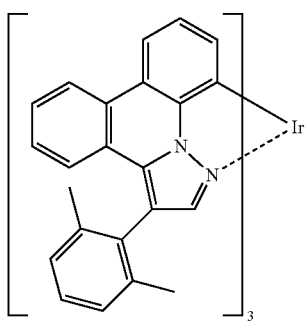
1-78
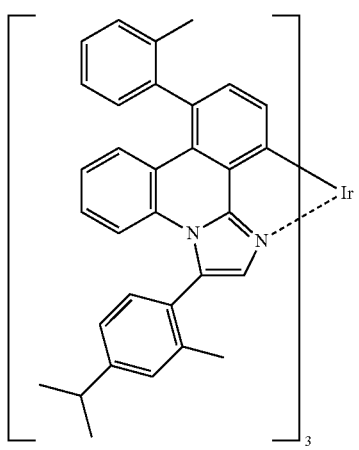
[Chemical Formula 15]
1-79
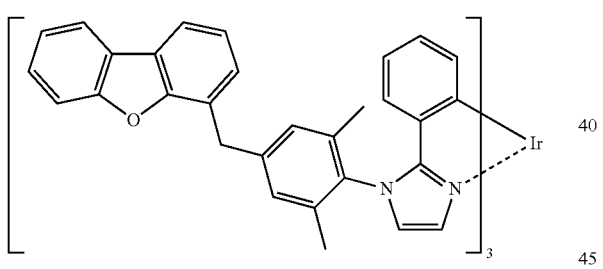
1-80
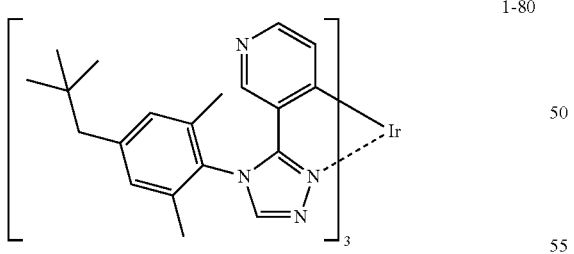
1-81
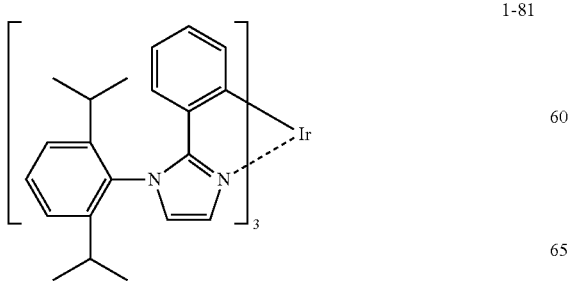
1-82
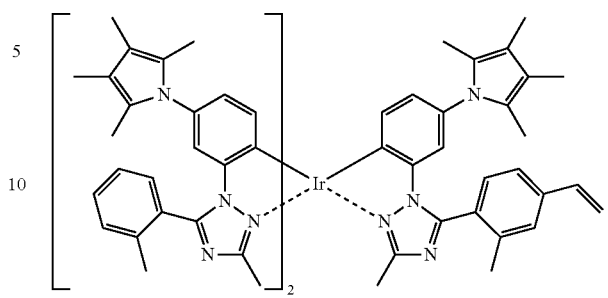
1-83
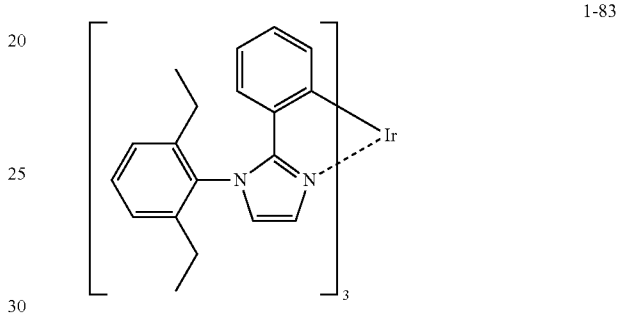
1-84
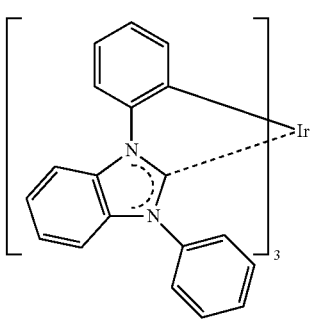
1-85
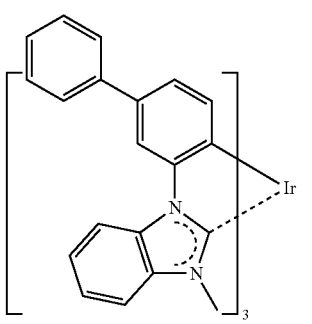

[Chemical Formula 16]
1-86
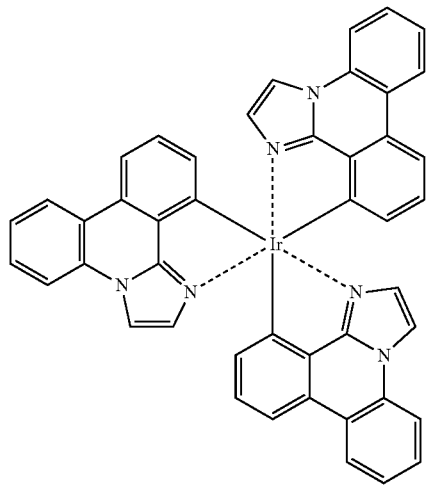
1-87
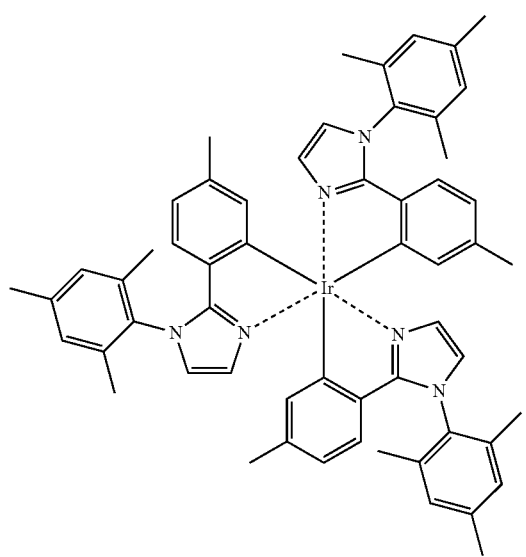
1-88
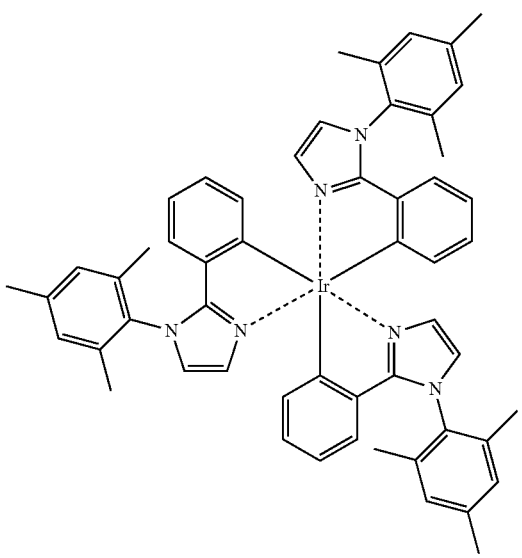
1-89
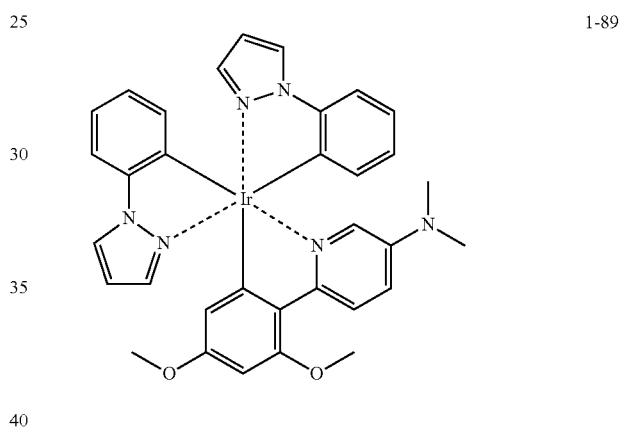
1-90
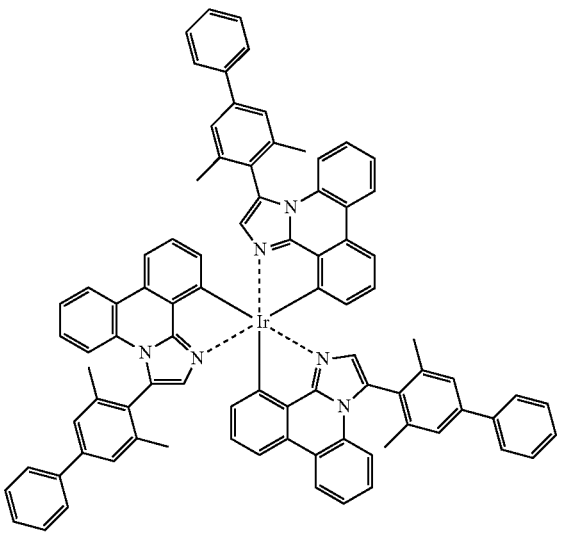

-continued

[Chemical Formula 17]

1-91
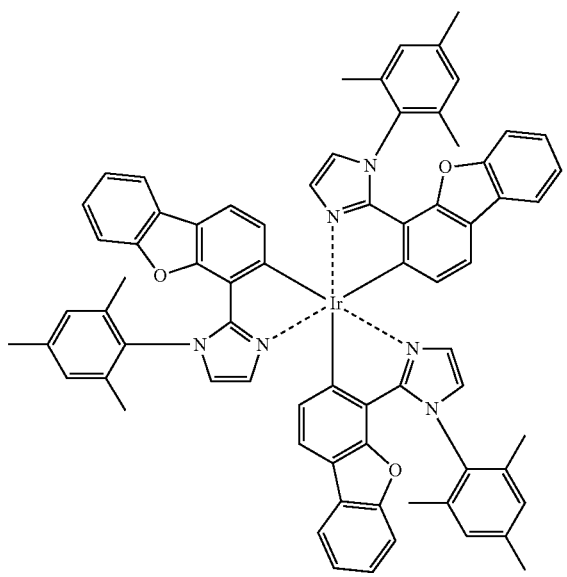

1-92
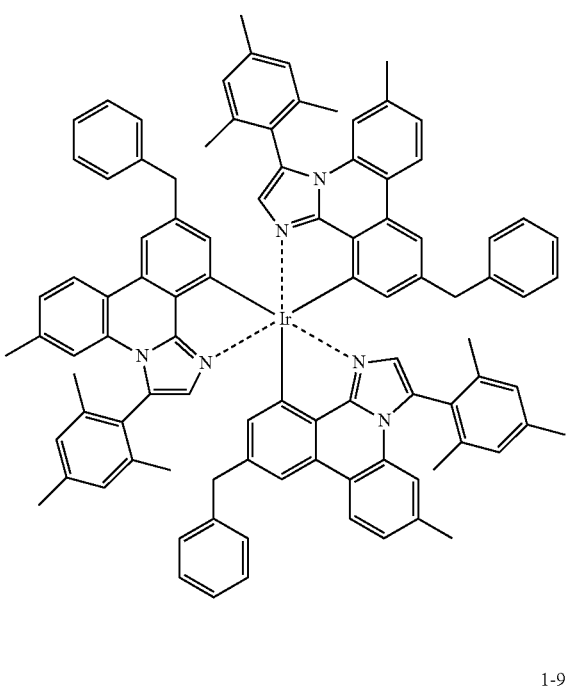

1-93
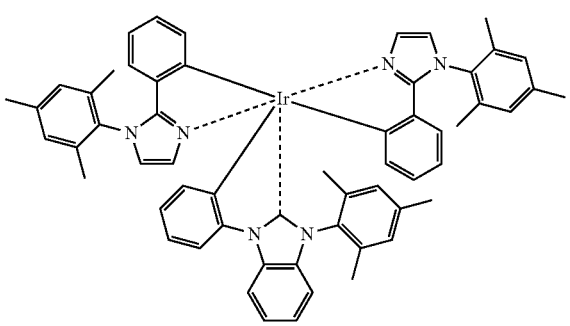

These metal complexes can be synthesized by any method such as a method described in *Organic Letter*, vol. 3, No. 16, pp. 2579 to 2581 (2001); *Inorganic Chemistry, Vol.* 30, No. 8, pp. 1685 to 1687 (1991); *J. Am. Chem. Soc.*, Vol. 123, p. 4304 (2001); *Inorganic Chemistry, Vol.* 40, No. 7, pp. 1.704 to 1711 (2001); *Inorganic Chemistry*, Vol. 41, No. 12, pp. 3055 to 3066 (2002); *New Journal of Organic Chemistry*, Vol. 26, p. 1171 (2002); *European Journal of Organic Chemistry*, Vol. 4, pp. 695 to 709 (2004); and documents in cited these documents.

<<Compound Represented by General Formula (2)>>

The light-emitting layer including the phosphorescent compound(s) preferably includes a compound(s) represented by the general formula (2).

[Chemical Formula 18]

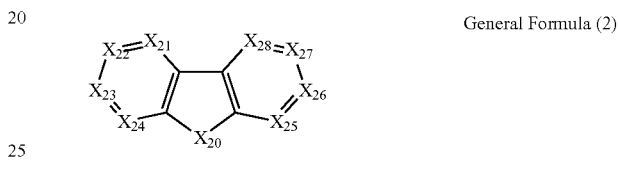

General Formula (2)

In the formula, $X_{20}$ represents O or S; $X_{21}$ to $X_{28}$ each represent $C(R_{20})$ or N; $R_{20}$ represents a hydrogen atom or a substituent; and at least one $R_{20}$ is represented by the following general formula (b1).

[Chemical Formula 19]

$Ar_{20}$-$(L_{20})_{n23}$-*  General Formula (b1)

In the formula, $L_{20}$ represents a divalent liking group derived from an aromatic hydrocarbon ring or an aromatic hetero ring; n23 represents an integer from 0 to 3; in the case where n23 is 2 or more, $L_{20}$s may be the same or different from each other; * represents a linking site to a scaffold of the general, formula (2); and $Ar_{20}$ represents a group represented by the following general formula (b2).

[Chemical Formula 20]

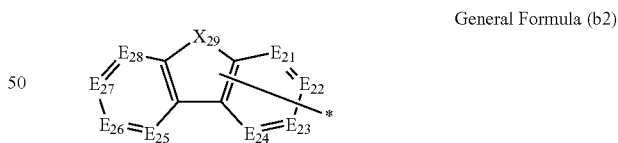

General Formula (b2)

In the formula, $X_{29}$ represents $N(R_{21})$, O or S; $E_{21}$ to $E_{28}$ each represent $C(R_{22})$ or N; $R_{21}$ and $R_{22}$ each represent a hydrogen atom, a substituent or a linking site to $L_{20}$; and * represents a linking site to $L_{20}$.

More preferably, a compound represented by the general formula (2) includes in its molecule a fused ring that contains a six-membered aromatic hetero ring containing at least one nitrogen atom, or a fused ring that contains a six-membered aromatic hetero ring that contains at least one nitrogen atom and is one of the rings forming the fused ring.

Specific examples of the compound represented by the general formula (2) will now be described below.

[Chemical Formula 21]
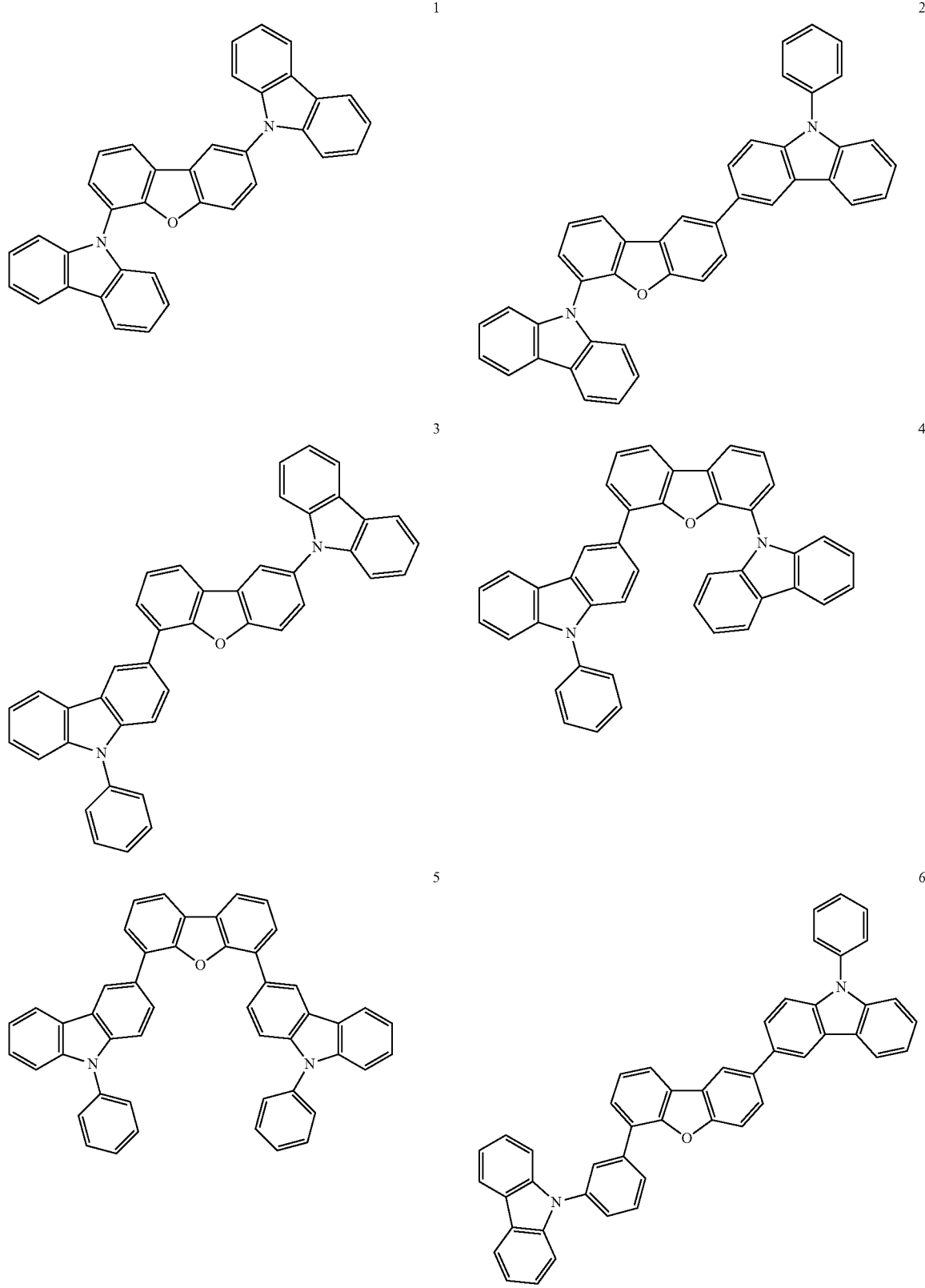

-continued
[Chemical Formula 22]
7
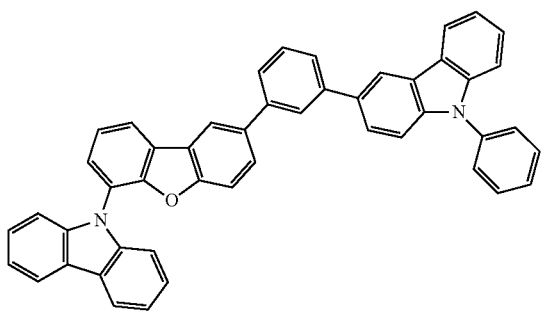
8
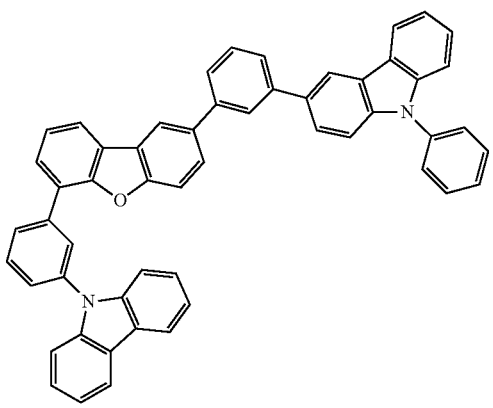
9
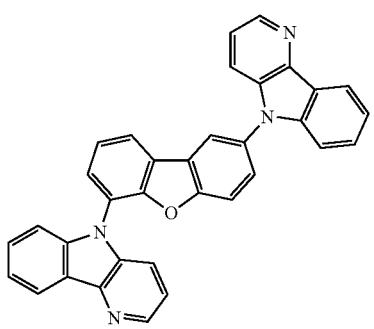
10
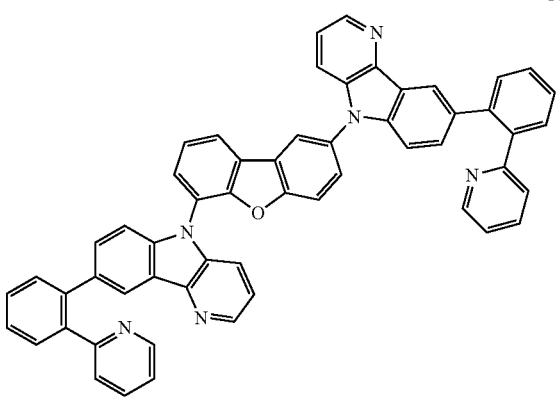
11
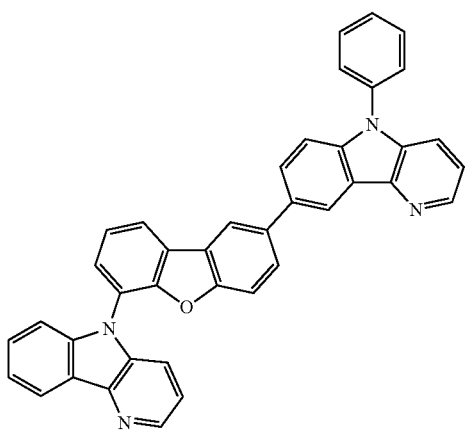
12
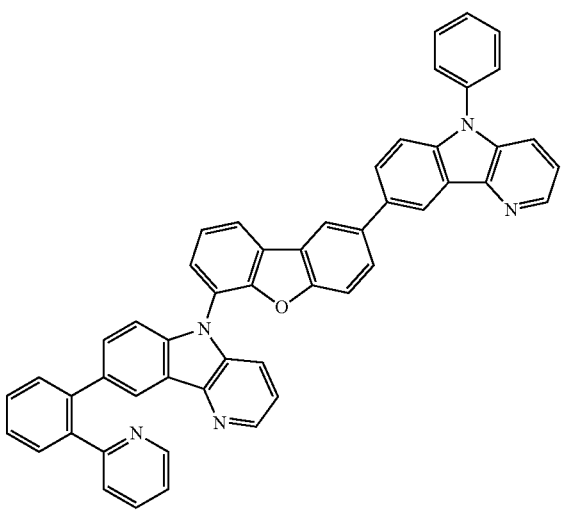

[Chemical Formula 23]
-continued
13
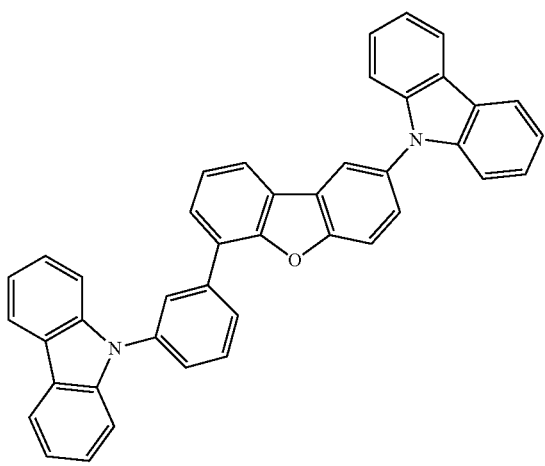
14
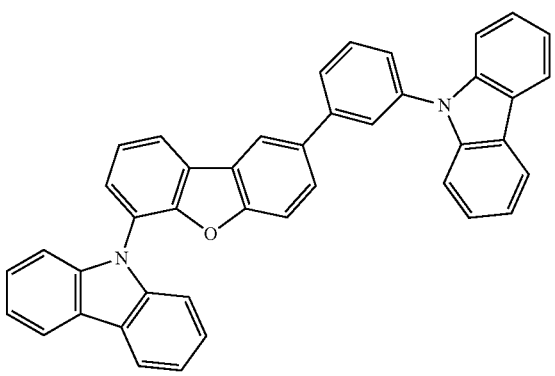
15
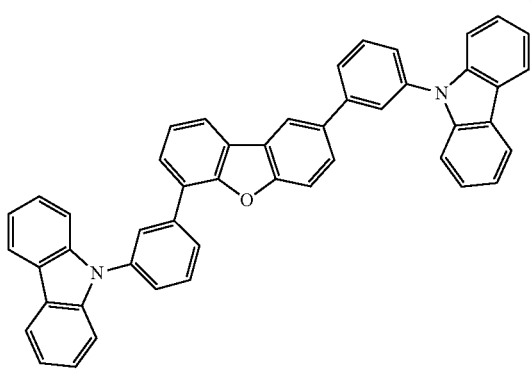
16
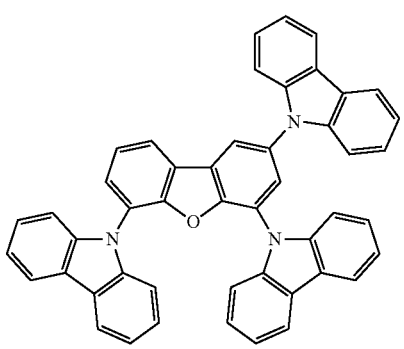
17
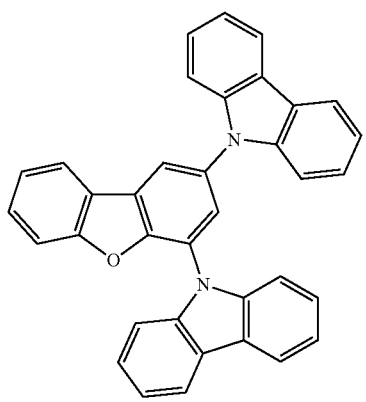
18
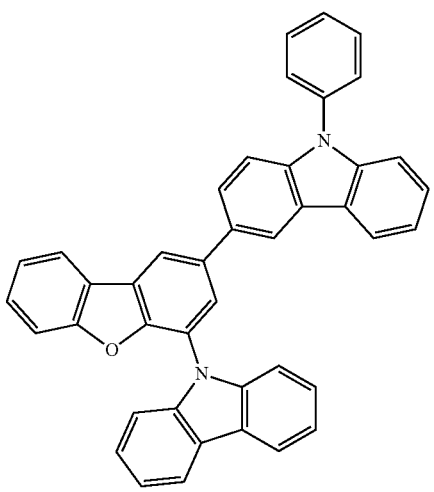

[Chemical Formula 24]
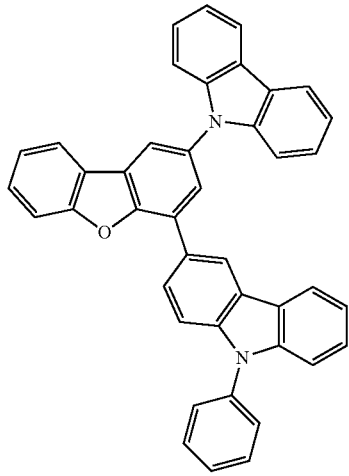
19
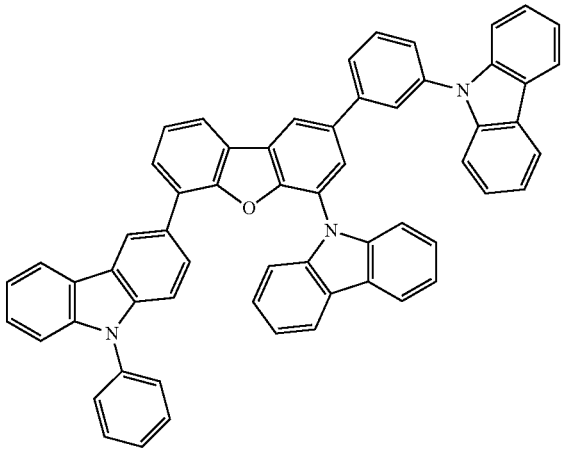
20
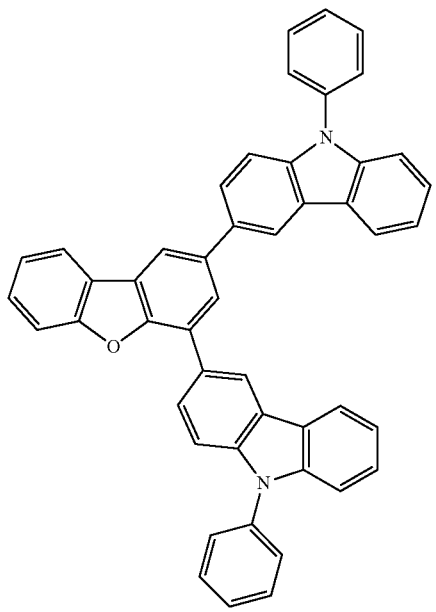
21
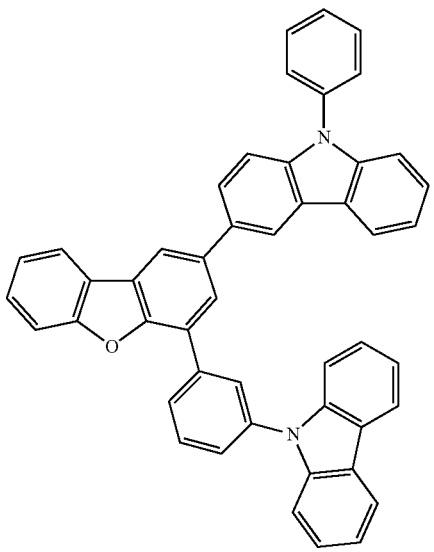
22
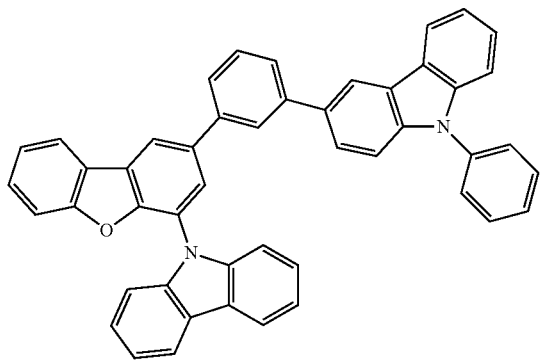
23
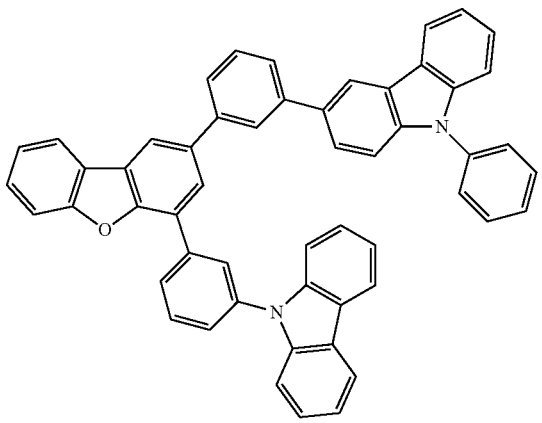
24

[Chemical Formula 25]
25
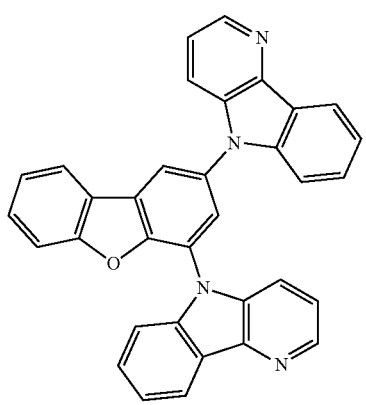
26
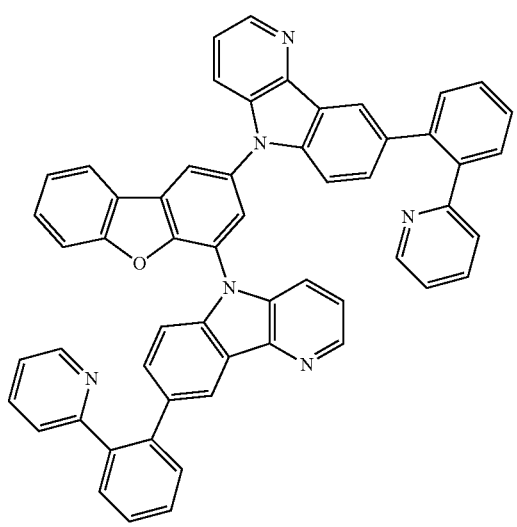
27
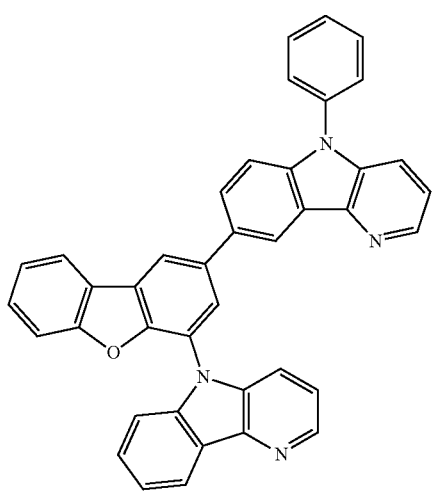
28
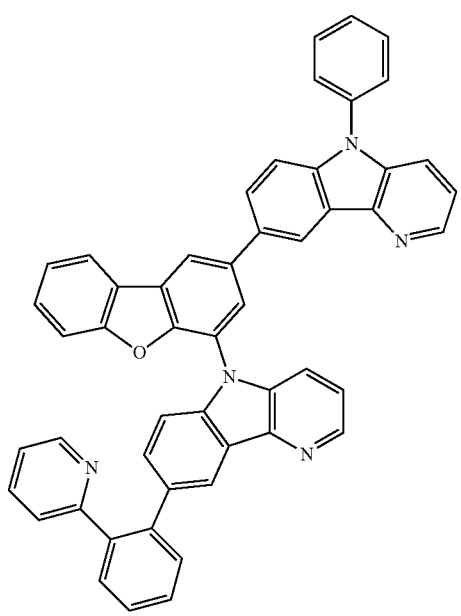
29
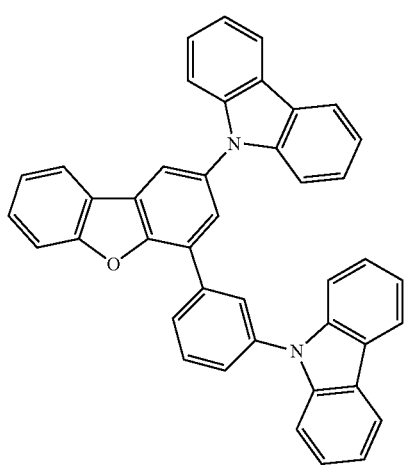
30
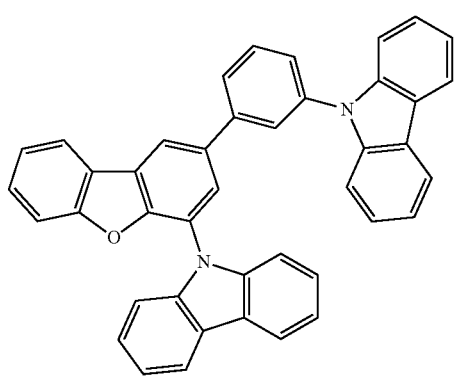

-continued
[Chemical Formula 26]
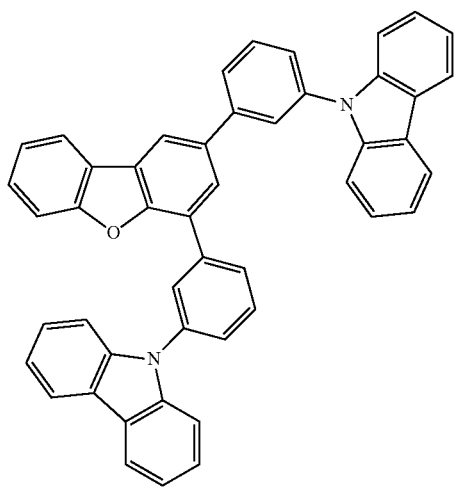
31
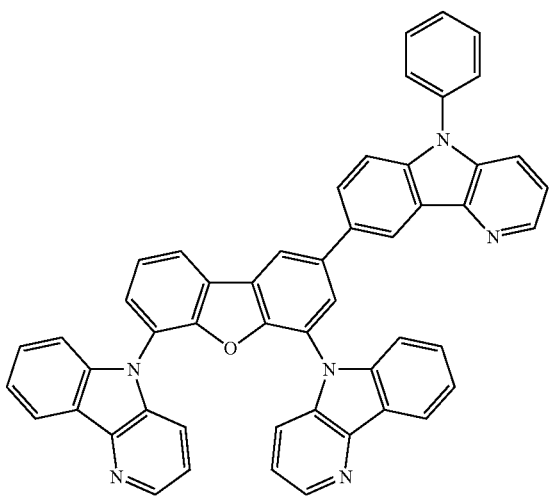
32
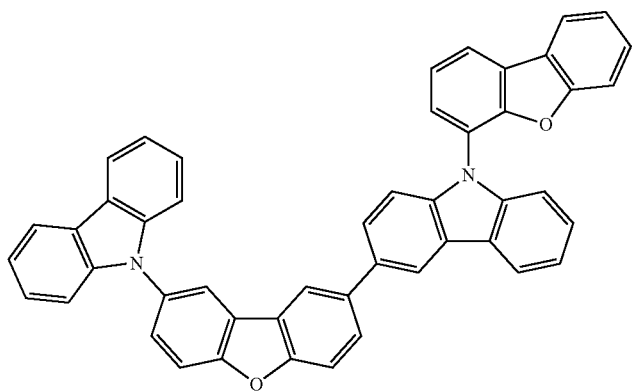
33
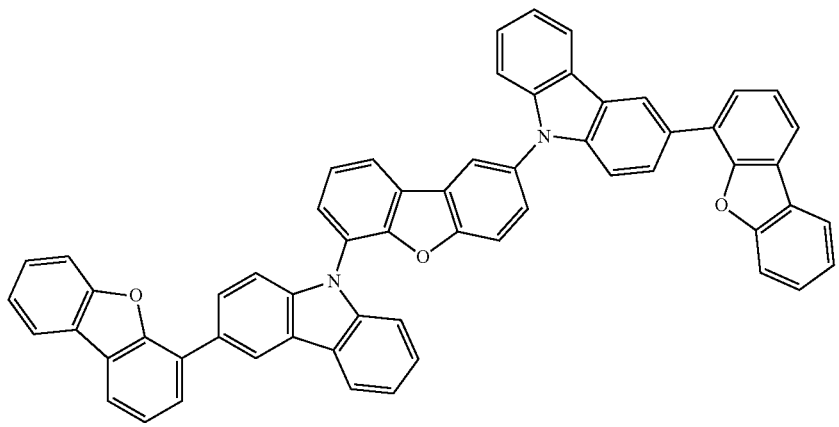
34

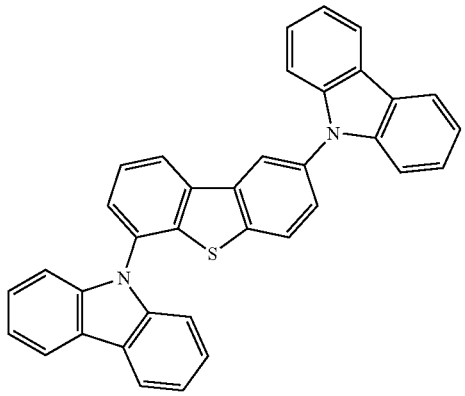
35
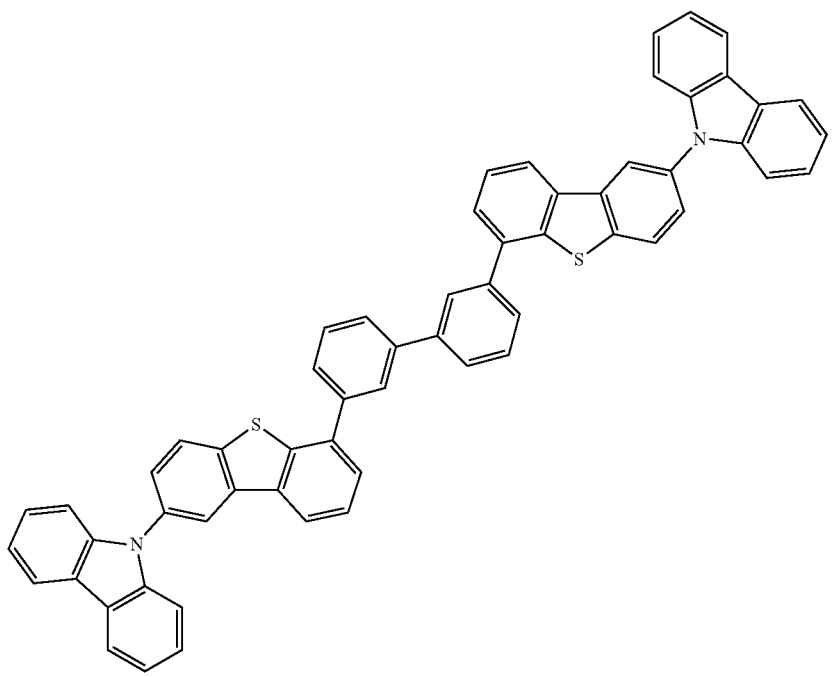
36
[Chemical Formula 27]
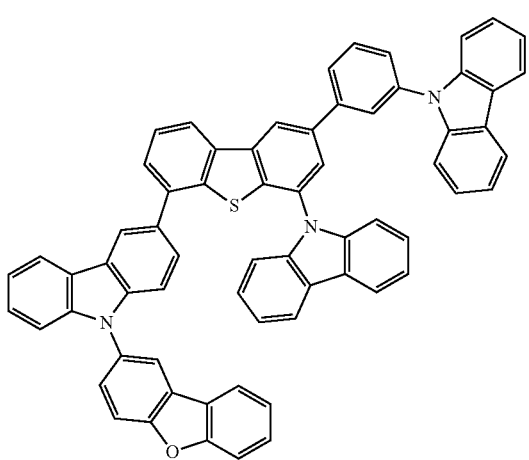
37
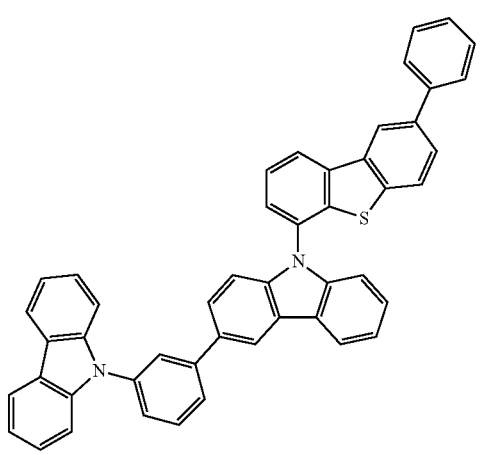
38

-continued
39
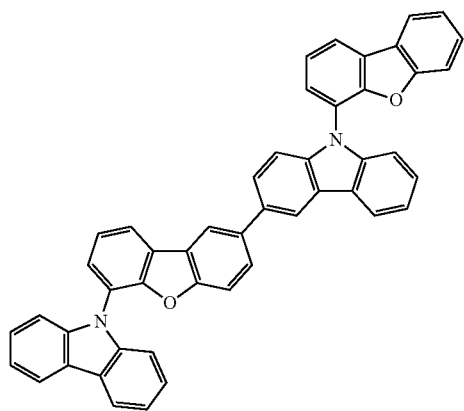
40
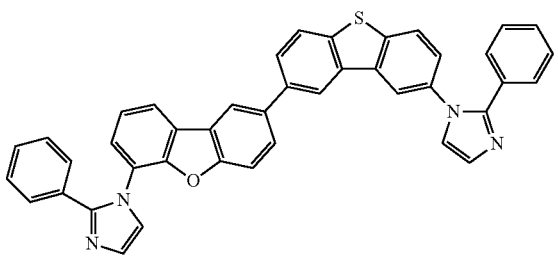
41
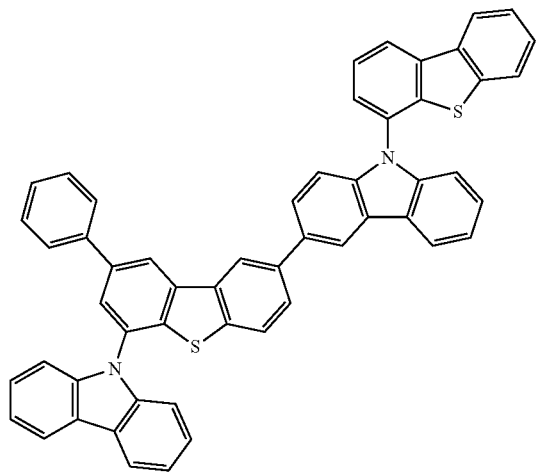
42
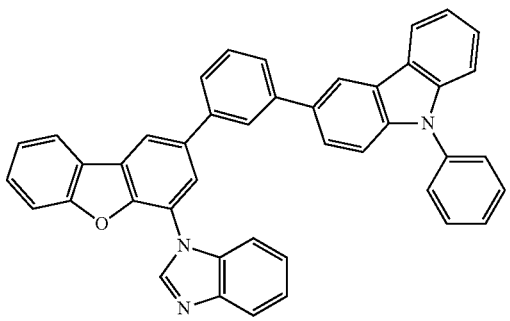
[Chemical Formula 28]
43
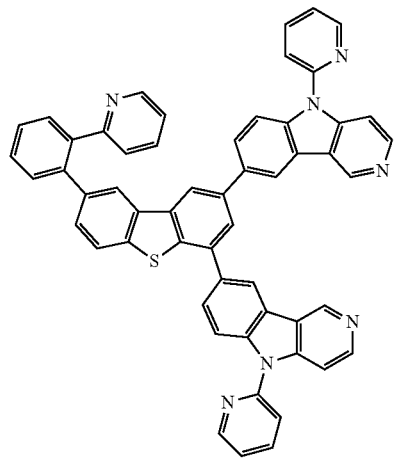
44
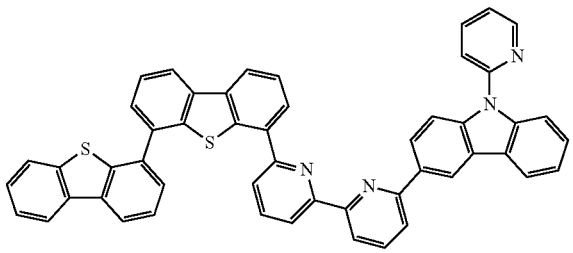

45
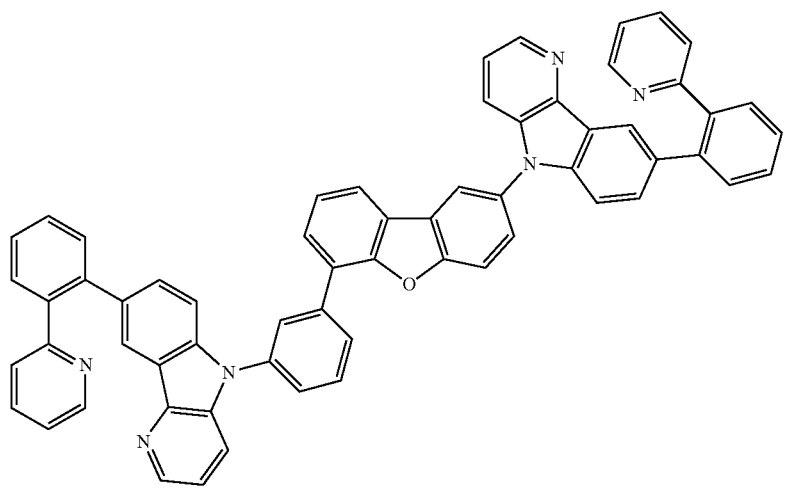
46
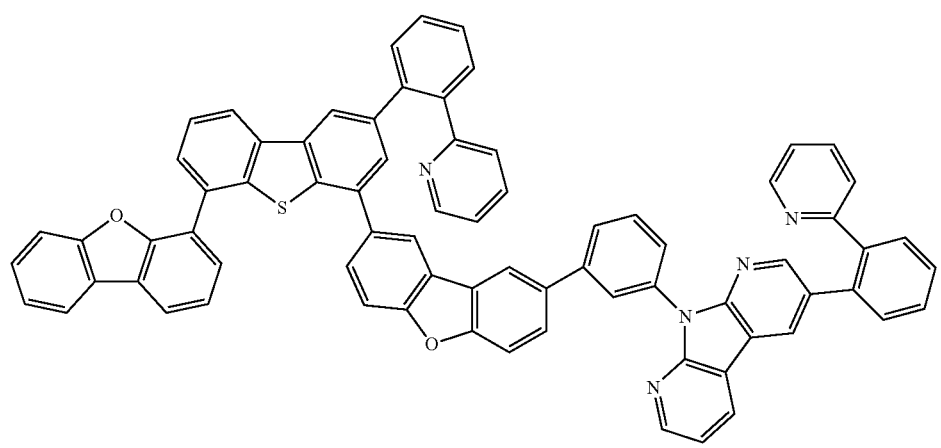
47
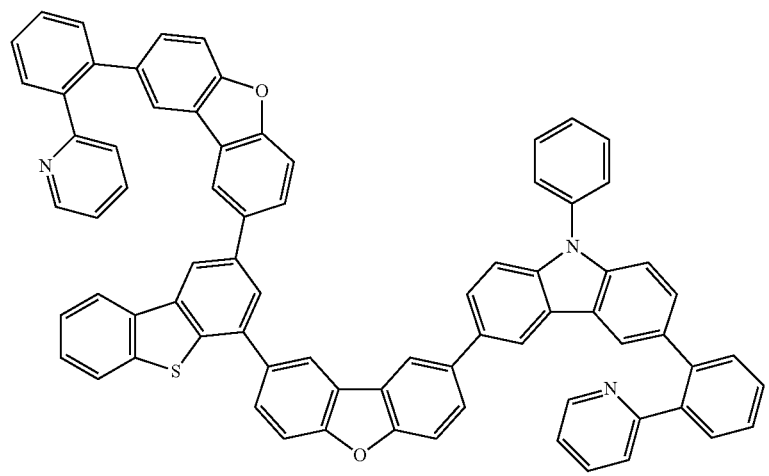

[Chemical Formula 29]
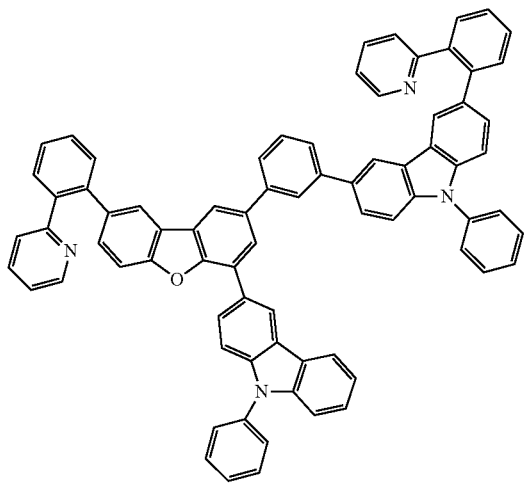
48
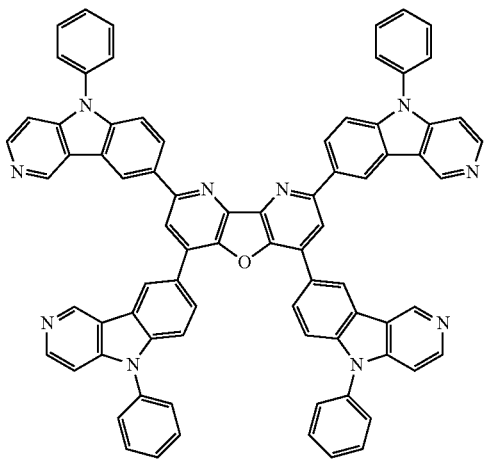
49
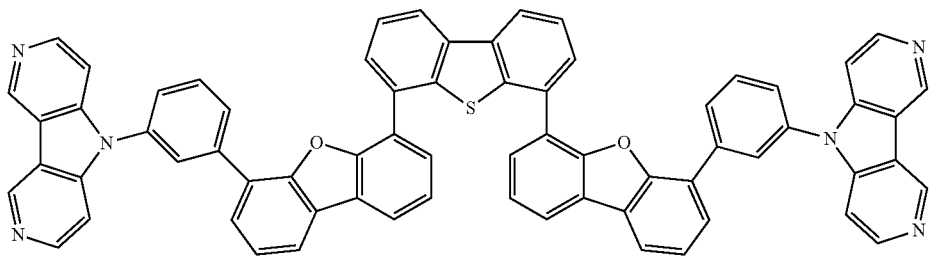
50
[Chemical Formula 30]
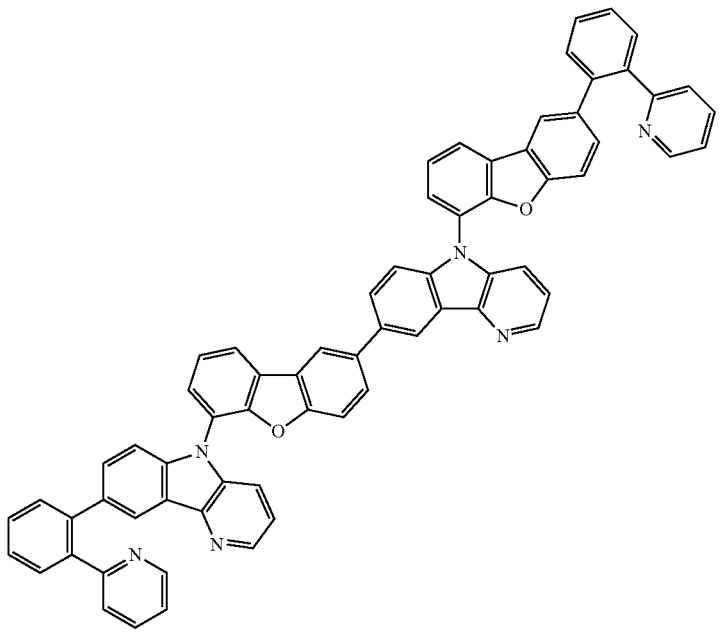
51

-continued
52
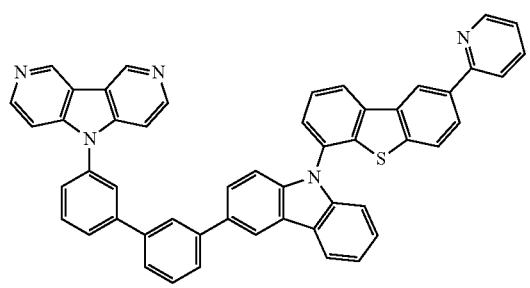
53
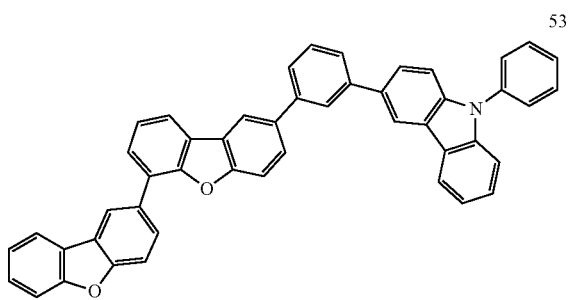
54
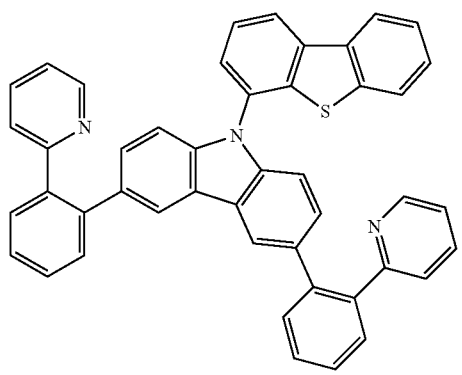
55
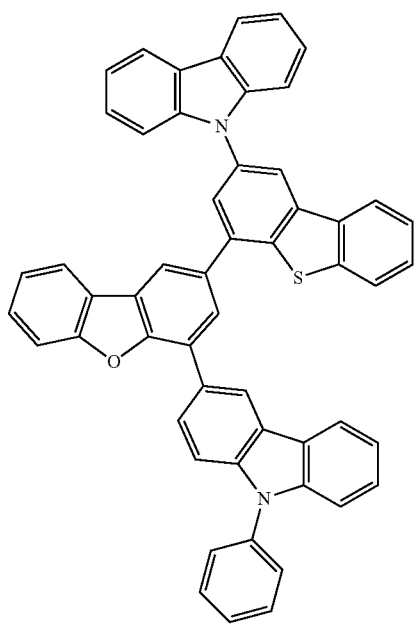
[Chemical Formula 31]
56
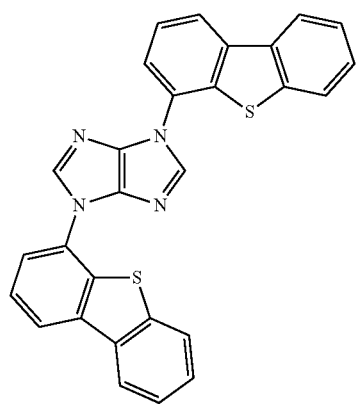
57
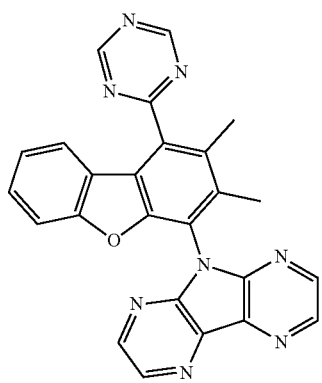

58
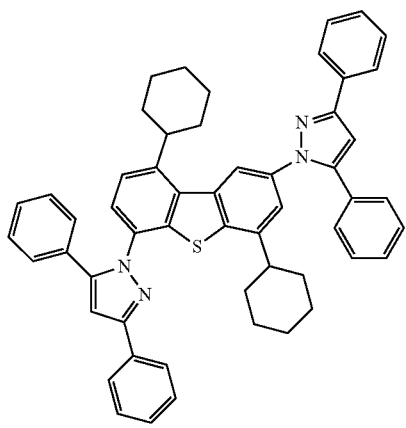
59
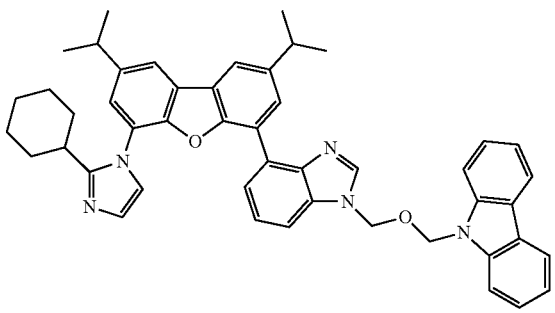
60
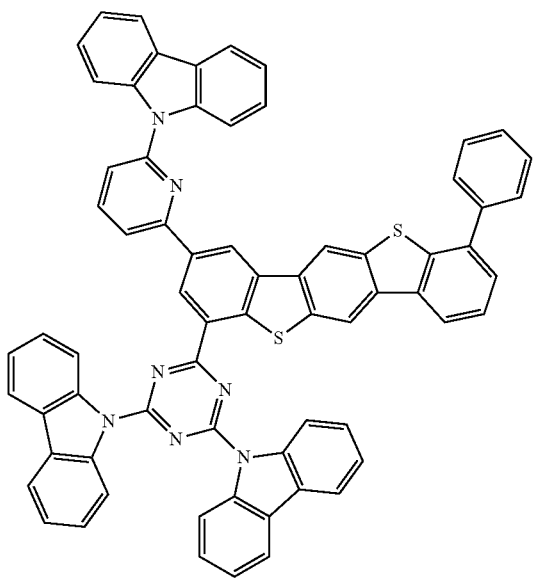
61
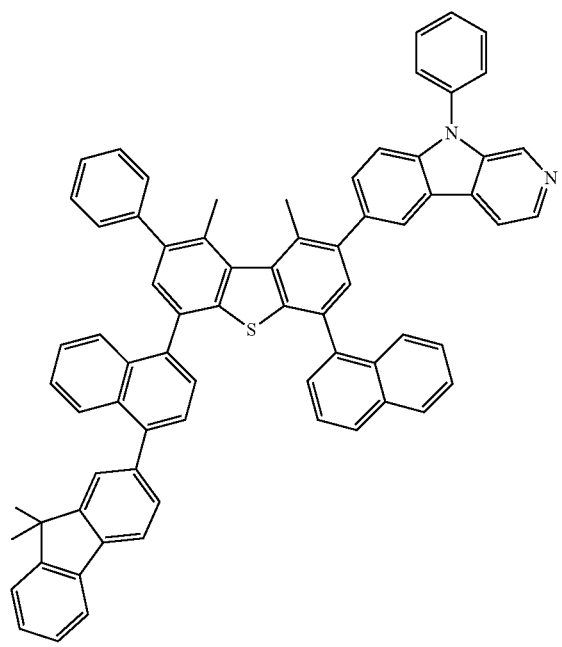

[Chemical Formula 32]
62
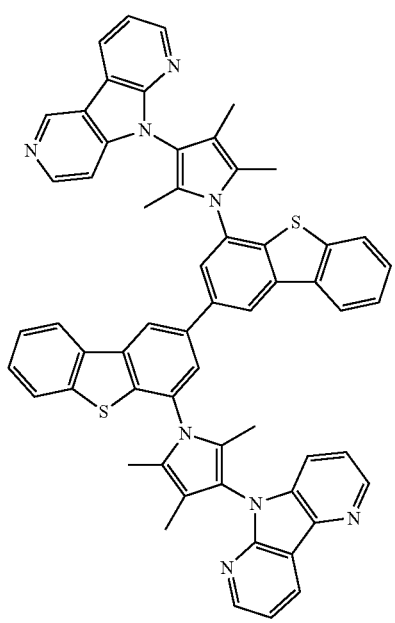
63
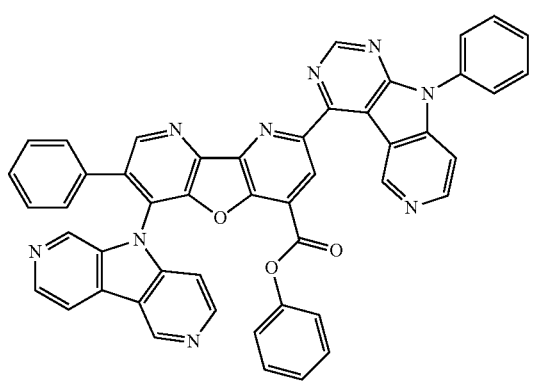
64
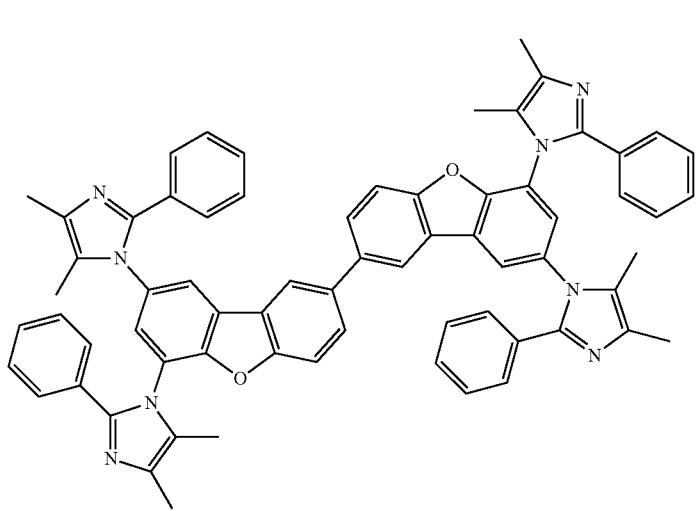

65
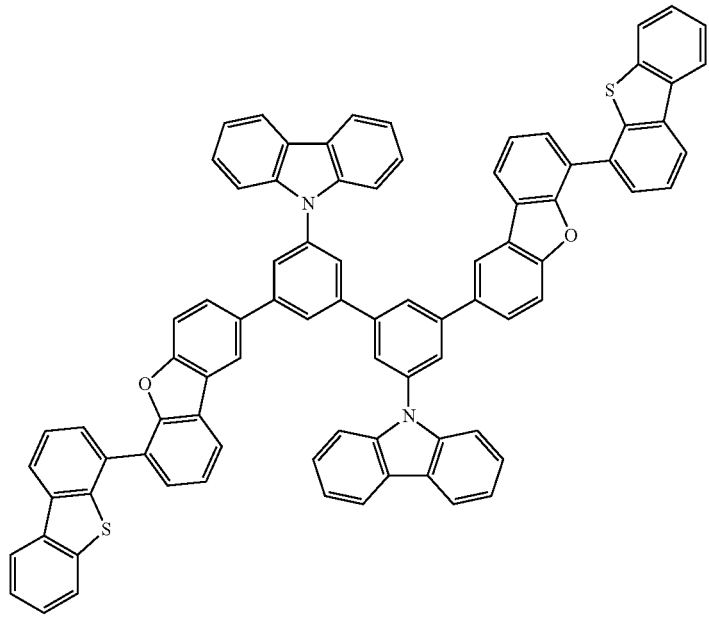
[Chemical Formula 33]
66
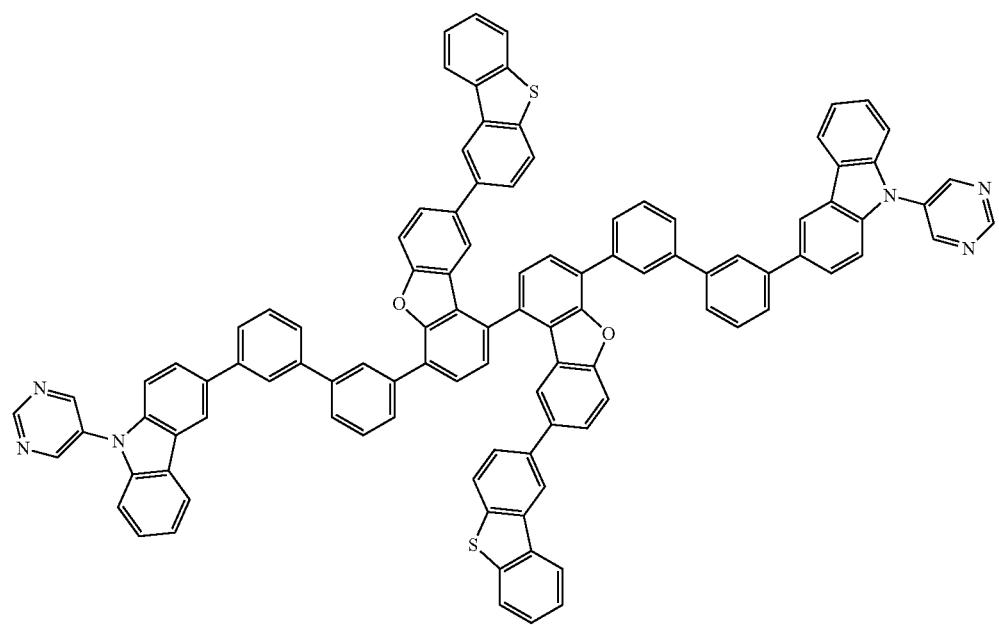

-continued
67
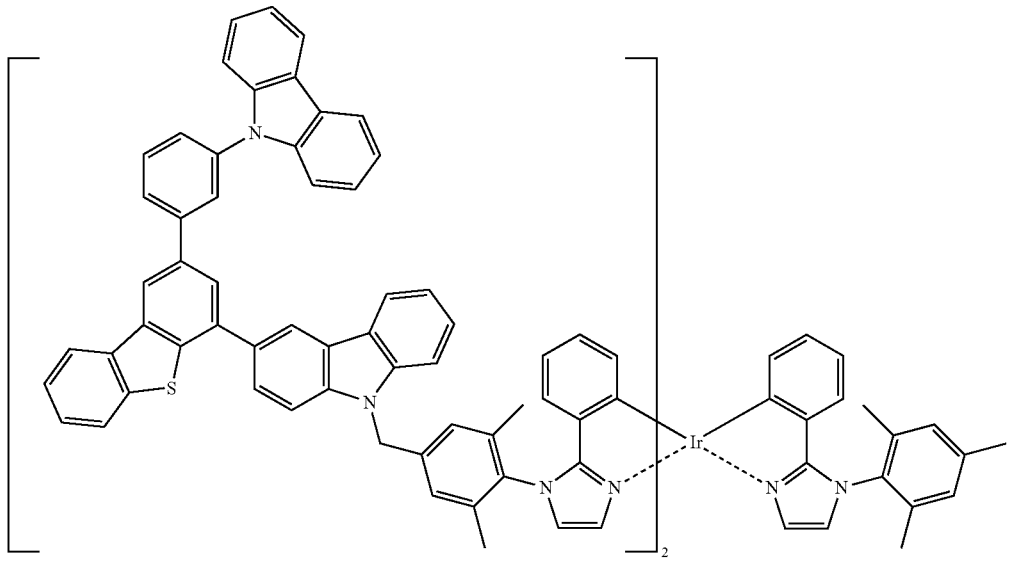
[Chemical Formula 34]
68
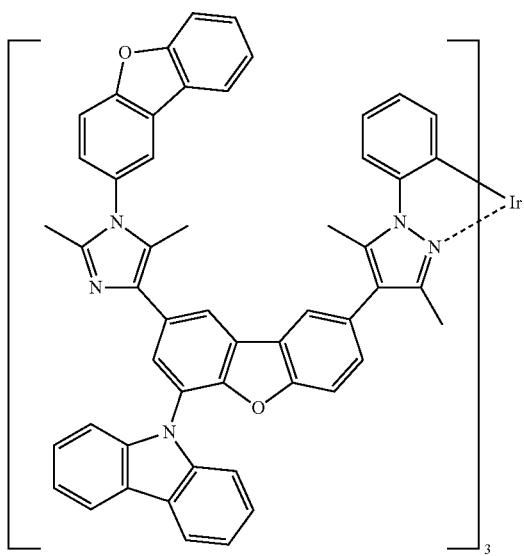
69
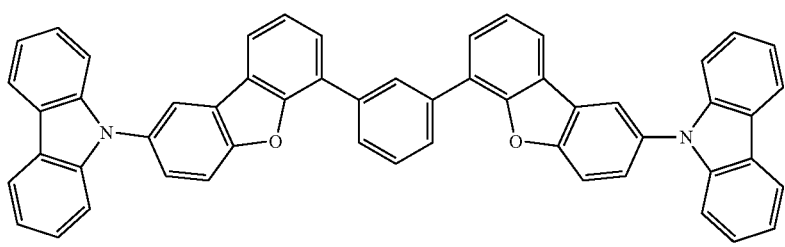

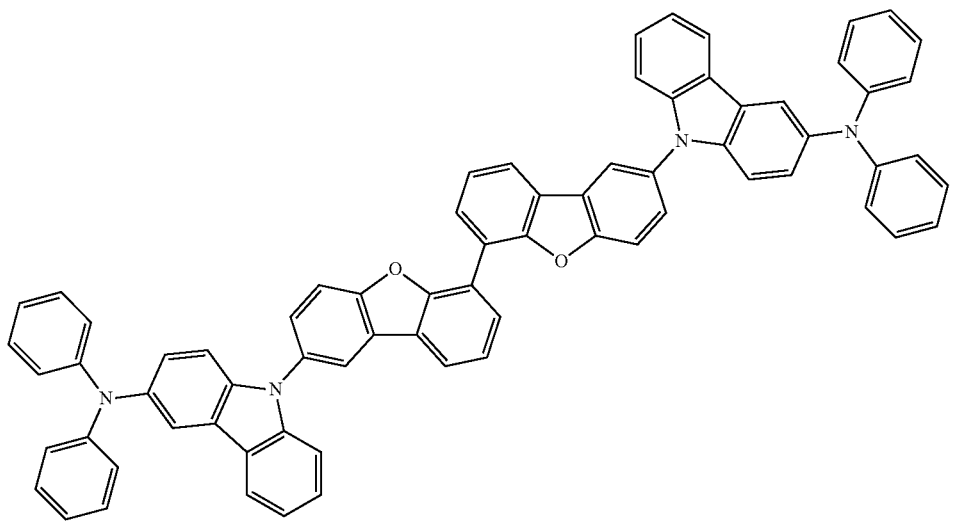
70
[Chemical Formula 35]
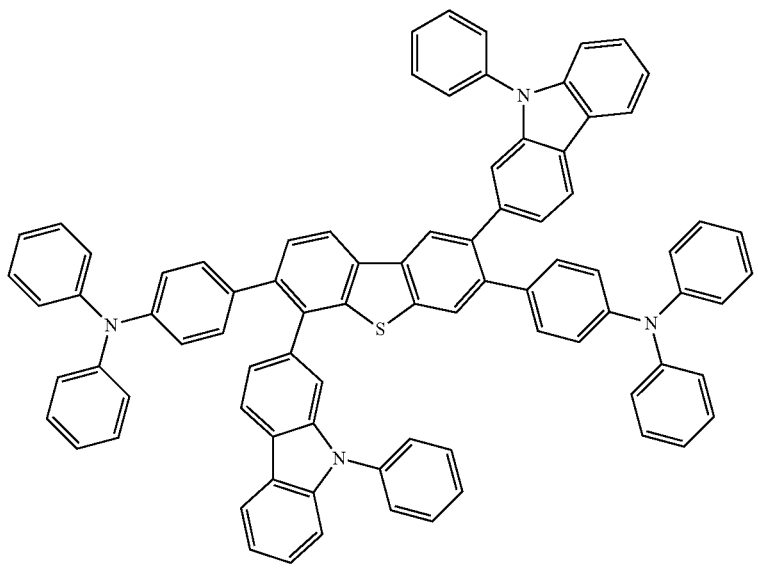
71
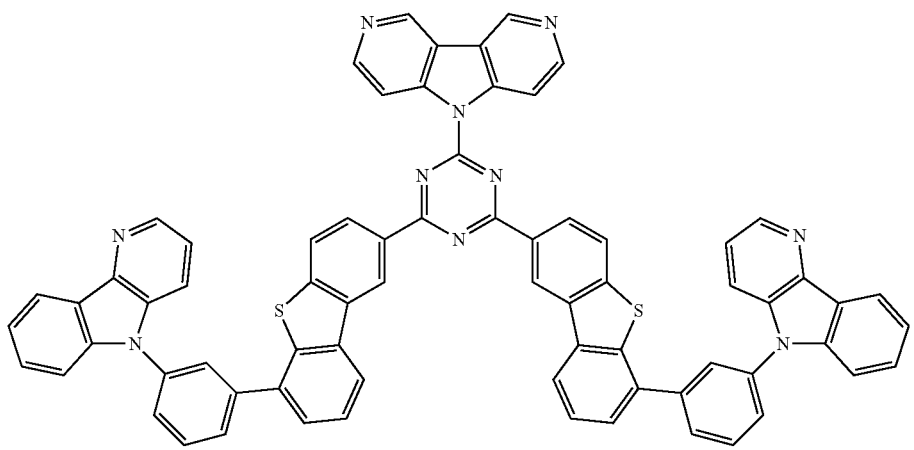
72

-continued
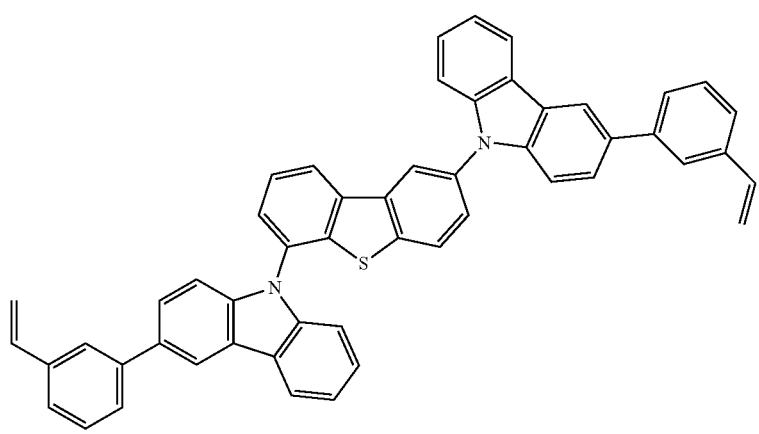
73
[Chemical Formula 36]
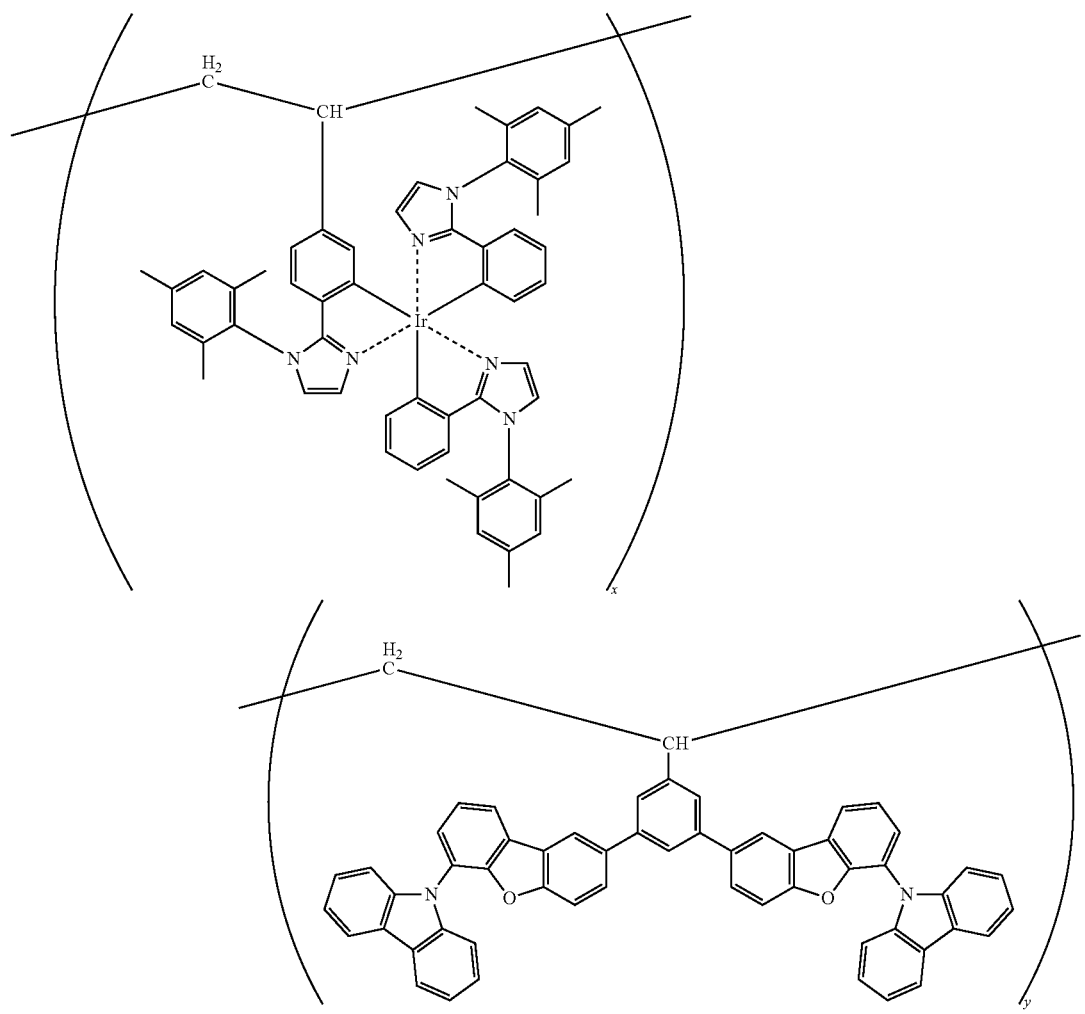
74
x:y = 1:10
random co-polymer

[Chemical Formula 37]
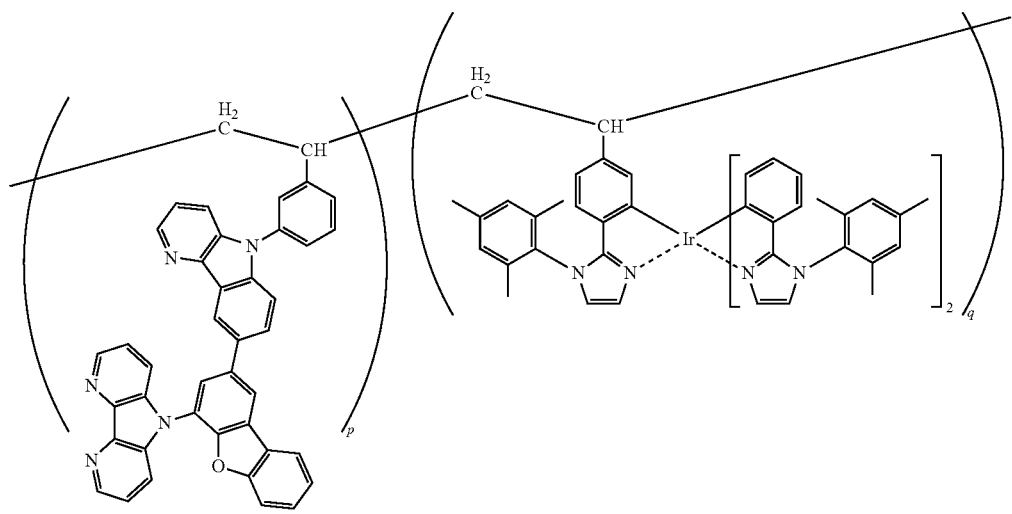
75
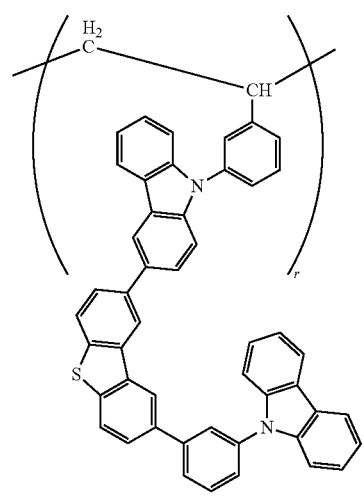

-continued
[Chemical Formula 38]
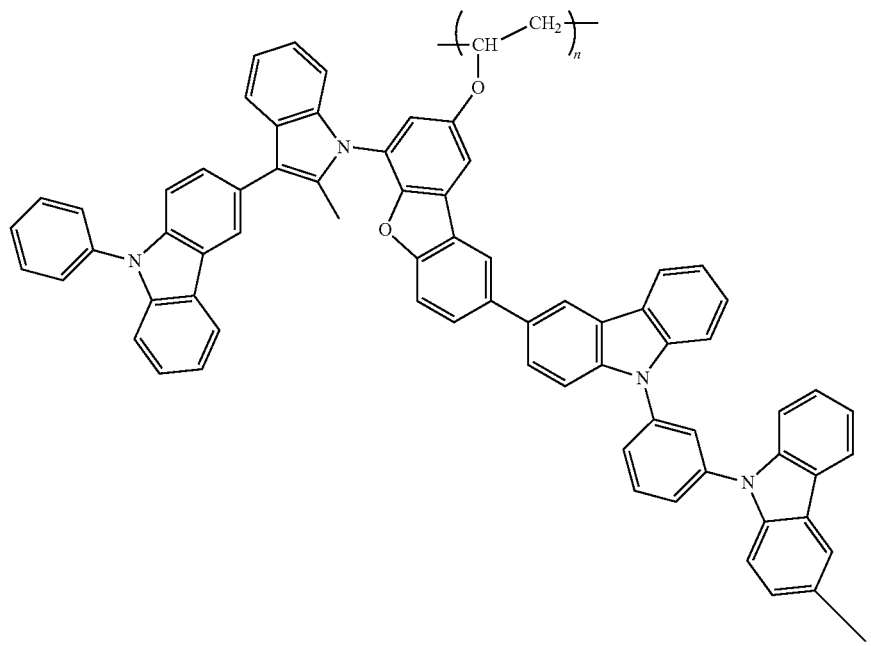
76
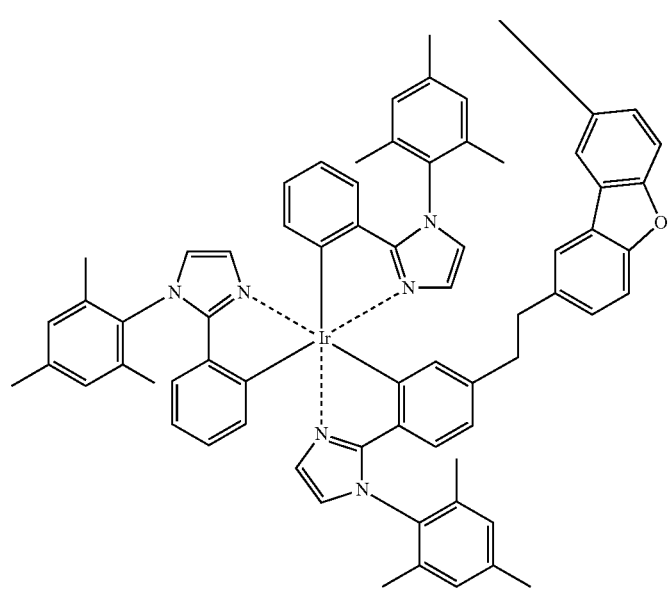

77
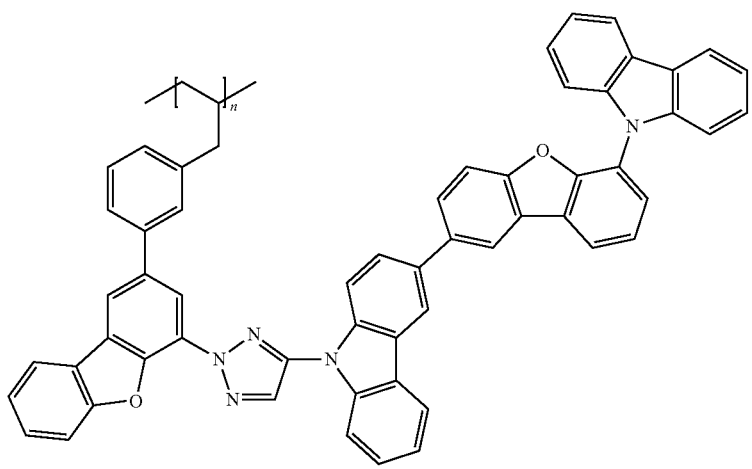
[Chemical Formula 39]
78
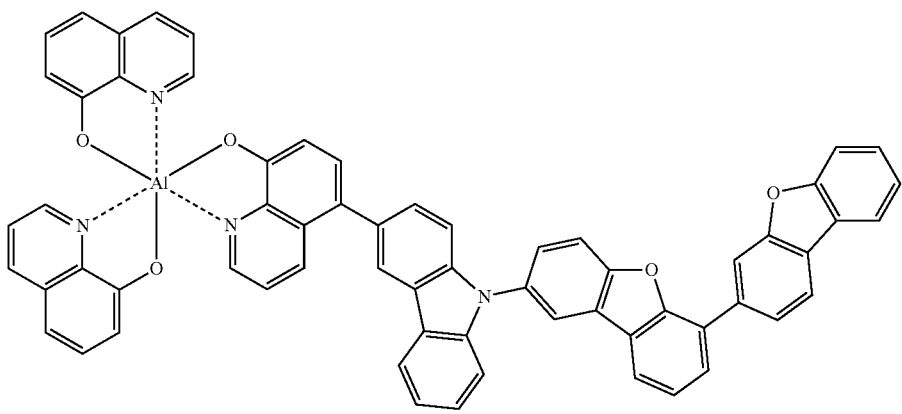
79
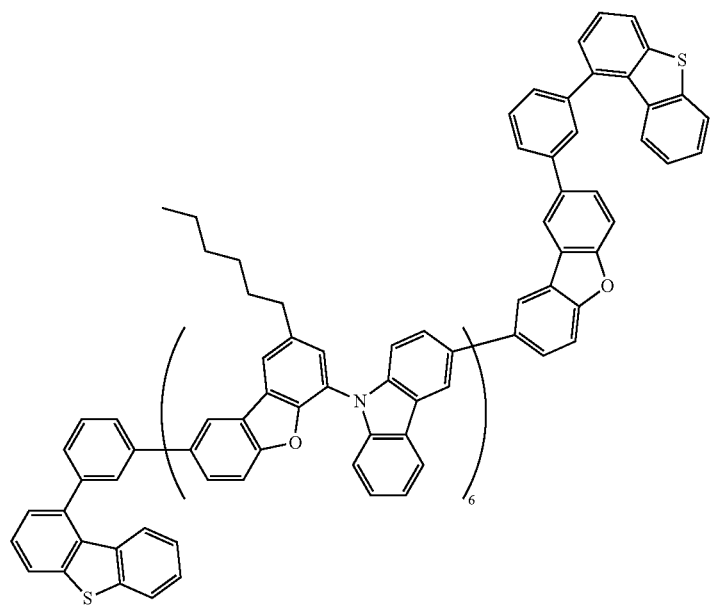

[Chemical Formula 40]
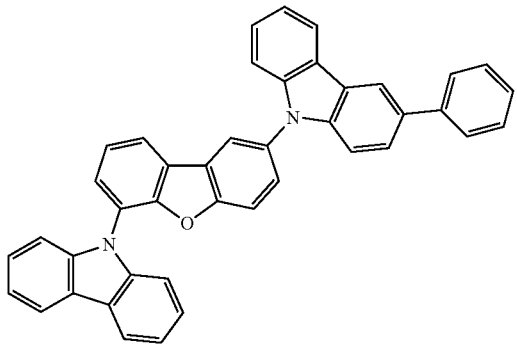

[Chemical Formula 41]
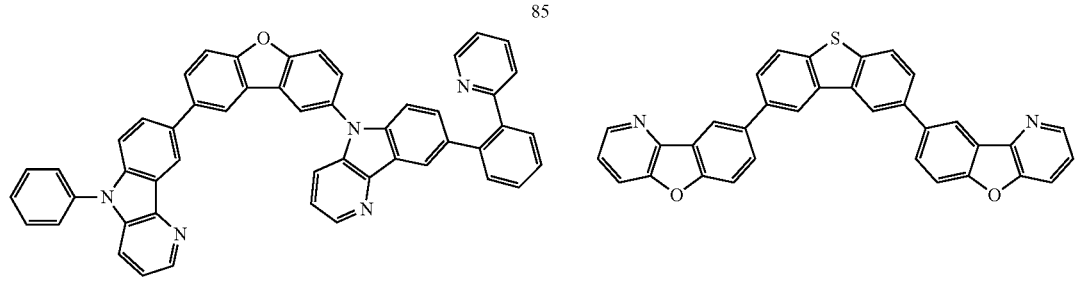
85
86
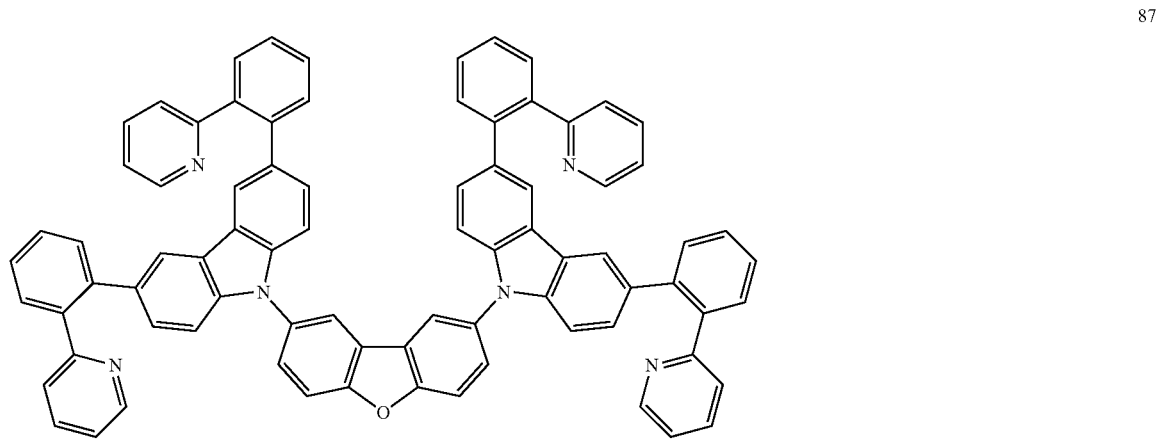
87
[Chemical Formula 42]
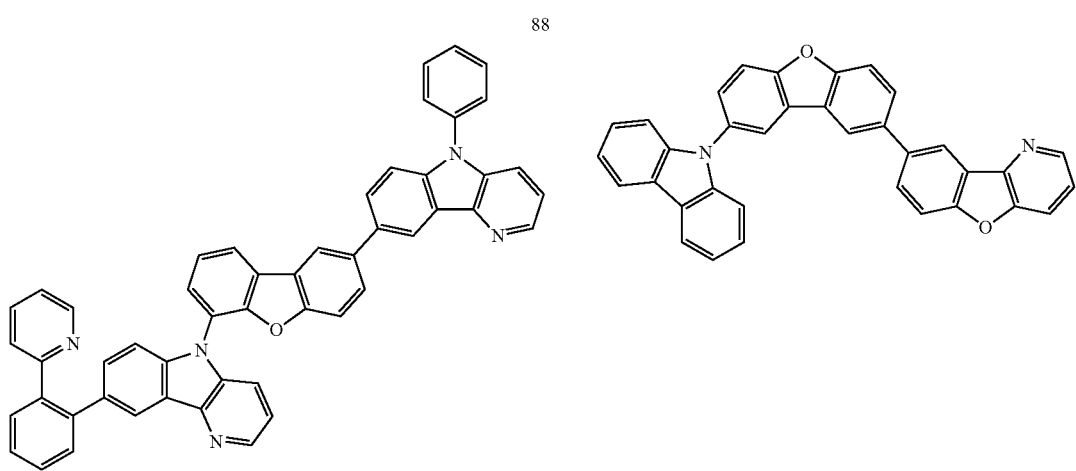
88
89

77 78
-continued
90
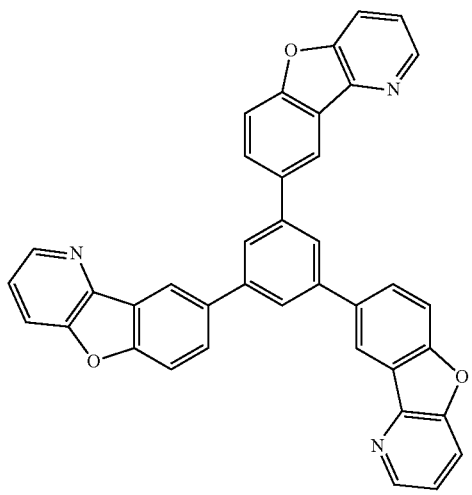
91
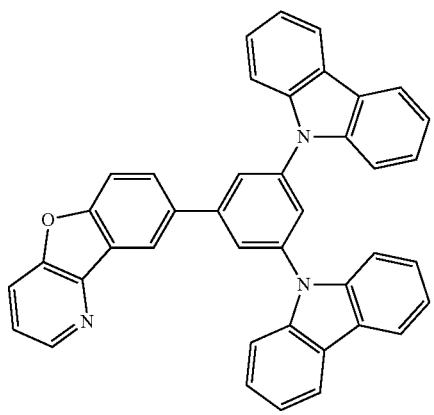
[Chemical Formula 43]
92
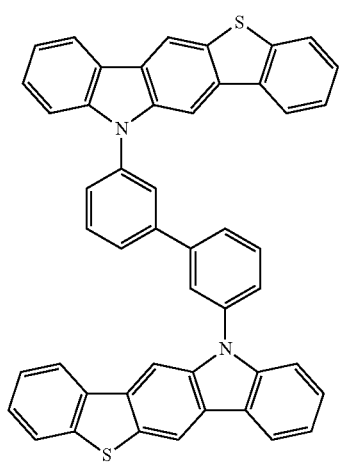
93
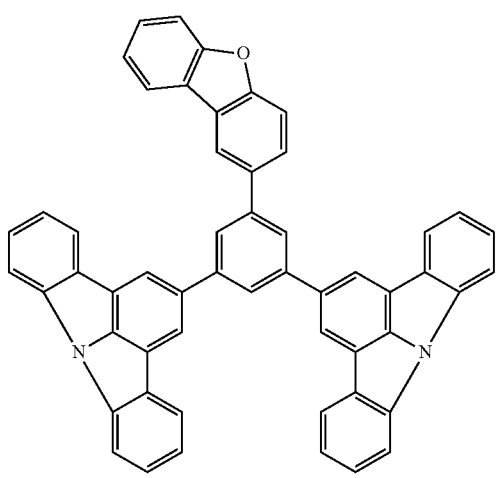
94
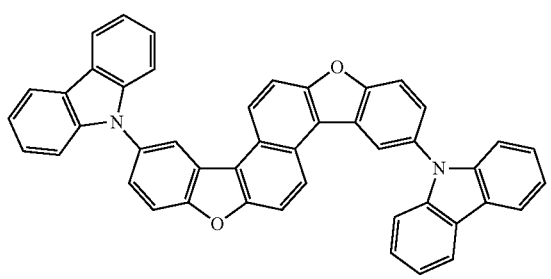
95
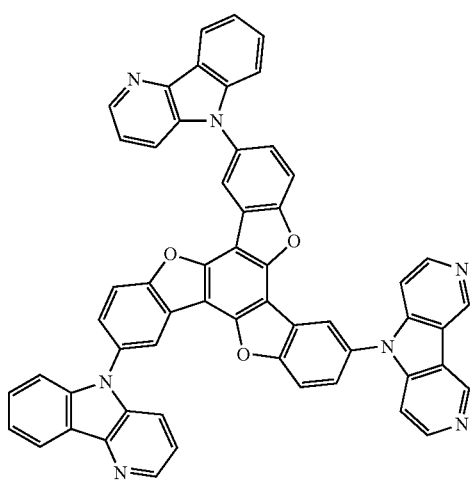

-continued
[Chemical Formula 44]
96
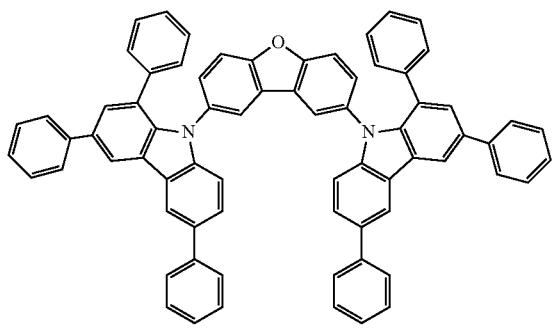
97
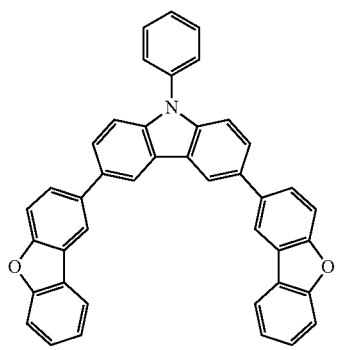
98
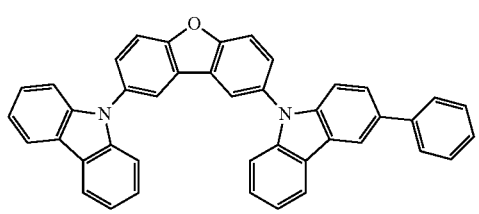
99
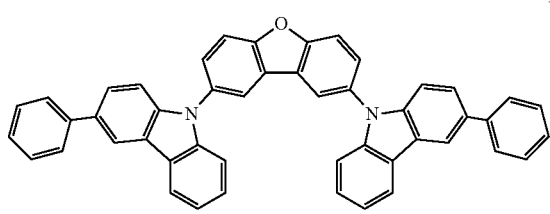
100
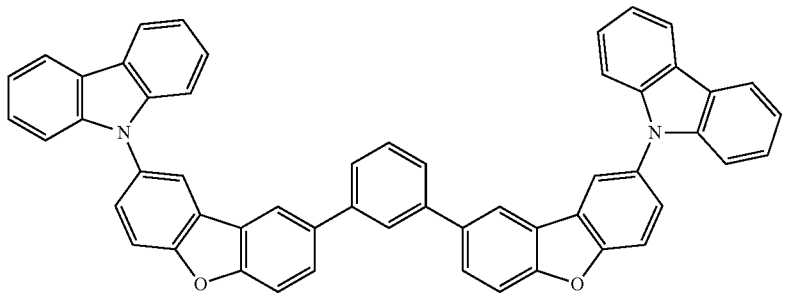
101
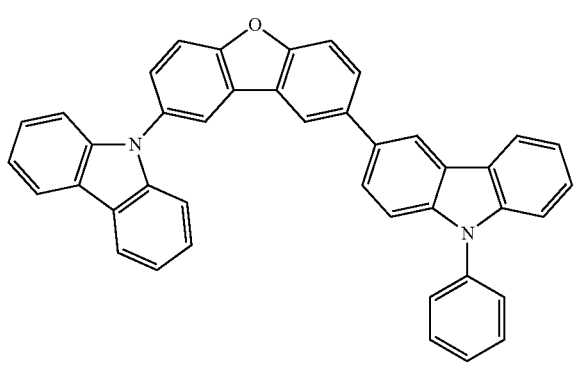
[Chemical Formula 45]
102
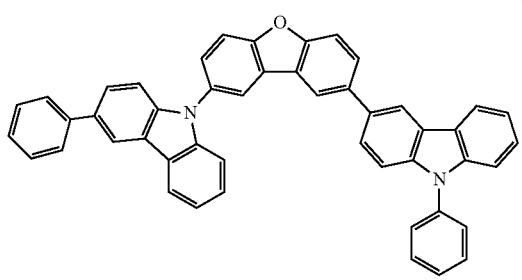
103
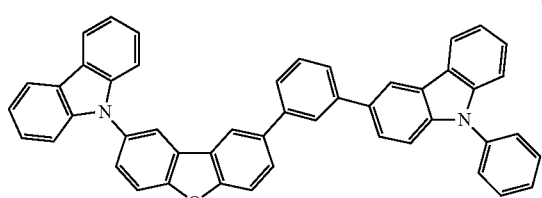

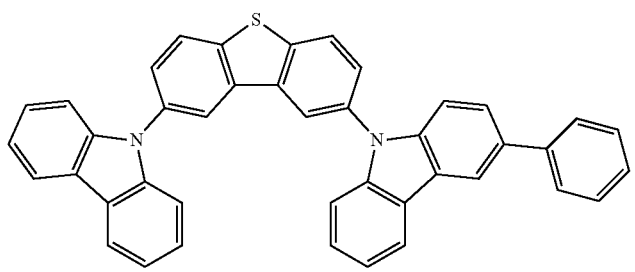

104

The compound represented by the general formula (2) can be synthesized referring to any known method such as a method described in WO2007/111176; *Chem. Mater.* 2008, 20, 5951; or the *Fifth Series of Experimental Chemistry* (edited by the Chemical Society of Japan), for example.

A typical method for synthesizing the above exemplary compound will now be described below.

<<Synthesis of Compound 85>>

[Chemical Formula 46]

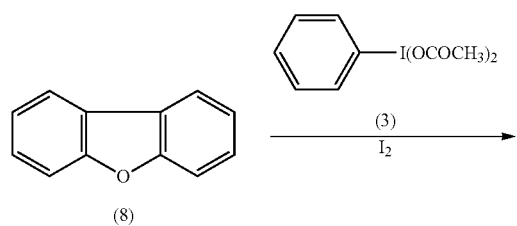

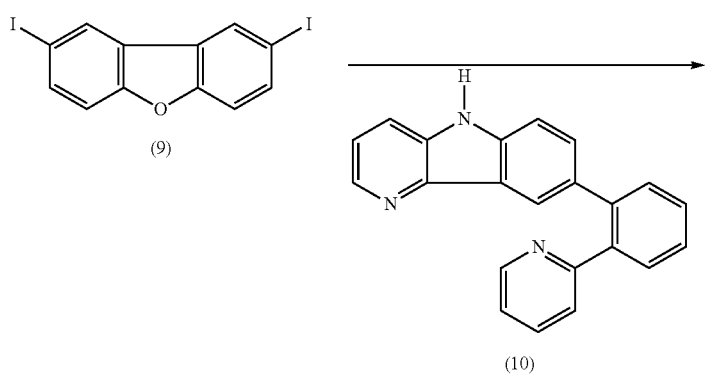

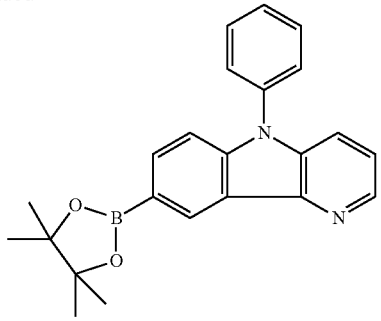

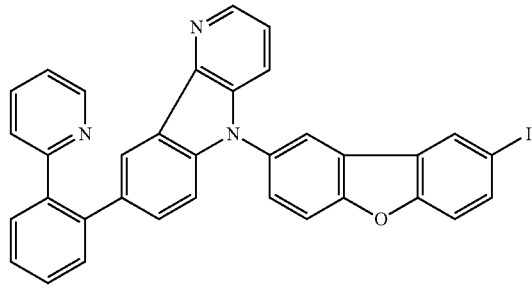
(12)
→ 化合物 85

(11)

6.3 g of the compound (3) and 4.7 g of iodide are added to a solution consisting of 22 ml of acetic acid and 22 ml of acetic acid anhydride. Then 3 g of the compound (8) is added thereto taking 5 minutes, and thereafter 2 or 3 drops of sulfuric acid are added to the resulting solution, followed by stirring for 20 minutes. This reaction solution is poured into 300 ml of a 5% aqueous solution of sodium sulfite, and then 1 g of sodium carbonate is added to thereto. Subsequently, vacuum filtration is performed to obtain crude crystals. Recrystallization is performed with chloroform, and then 4.7 g of the compound (9) is obtained (in a yield of 62.2%).

Subsequently, 4.7 g of the compound (9), 3.2 g of the compound (10), 2.3 g of potassium carbonate, 2.1 g of Cu powder and 60 ml of dry DMAc are mixed together, and then stirred for 20 hours in a nitrogen gas stream (at an inner temperature of 135 to 137° C.). Insoluble matters are removed by vacuum filtration. Then 15 ml of well water is added to the filtrate, and segregated solids are subjected to vacuum filtration. The obtained crude product is purified by column chromatography (silica gel, developing solution: ethyl acetate/toluene), and 3.4 g of the compound (II) is obtained (in a yield of 50%).

Thereafter, 3.4 g of the compound (11), 2.3 g of the compound (12), 1.0 g of fine powder of potassium carbonate and 50 ml of DMSO are mixed together, and this solution is then subjected to replacement with a nitrogen gas stream. Thereafter, 0.45 g of PdCl2dppf is added to the solution and stirring with heat is performed for 2 hours (at an inner temperature of 75 to 80° C.). Then the solution is cooled to room temperature, and 4 ml of well water is added to thereto. After stirring at room temperature, segregated solids are subjected to vacuum filtration. The obtained crude product is purified by column chromatography (silica gel, developing solution: ethyl acetate/toluene) and then recrystallization is performed with a THF/MeOH solution to obtain 2.7 g of the compound (85) (in a yield of 66.0%).

Its structure is confirmed from $H^1$-NMR spectra and mass spectra.

<<Constituent Layer of Organic EL Element>>

Constituent layers of the organic EL element of the present invention are now described. Preferred examples of the layer constitution of the organic EL element of the present invention are described below, but the present invention is not limited thereto.

(i) anode/light-emitting layer/electron-transporting layer/cathode
(ii) anode/hole-transporting layer/light-emitting layer/electron-transporting layer/cathode
(iii) anode/hole-transporting layer/light-emitting layer/hole-blocking layer/electron-transporting layer/cathode
(iv) anode/hole-transporting layer/light-emitting layer/hole-blocking layer/electron-transporting layer/cathode buffer layer/cathode
(v) anode/hole-injecting layer/hole-transporting layer/light-emitting layer/hole-blocking layer/electron-transporting layer/cathode buffer layer/cathode
(vi) anode/hole-injecting layer/hole-transporting layer/light-emitting layer/hole-blocking layer/electron-transporting layer/cathode buffer layer/cathode
(vii) anode/hole-injecting layer/hole-transporting layer/light-emitting layer/electron-transporting layer/cathode buffer layer/cathode The light-emitting layers may be provided to form a unit consisting of light-emitting layers.

Between the light-emitting layers, an interlayer(s) may be provided, and such interlayers may include a charge-generating layer(s). The light-emitting layer is preferably a white light-emitting layer in the organic EL element of the present invention. An illumination device is preferably a device using them.

Each constituent layer of the organic EL element of the present invention will now be described below.

<<Light-Emitting Layer>>

The light-emitting layer of the present invention emits light through recombination of electrons and holes injected from electrodes or an electron-transporting layer and electron hole-transporting layer. The light emission portion may be inside the light-emitting layer or may be the interface between the light-emitting layer and its adjacent layer(s).

The total thickness of the light-emitting layer(s) is not particularly limited, but is preferably ranges from 20 nm to 150 nm, and more preferably 50 to 130 nm from the viewpoints of obtaining homogeneity of the layer(s), preventing application of unnecessarily high voltage for light emission and improving stability of chromaticity of light.

The light-emitting layer can be formed with a light-emitting dopant(s) and a host compound(s) described below by, for example, vacuum deposition, a wet method (also referred to as a wet process and exemplified by spin coating, casting, die coating, blade coating, roll coating, ink jetting, printing, spray coating, curtain coating and Langmuir Blodgett (LE) method). When the compound(s) of the preset invention are used in the light-emitting layer(s), a wet process is preferable.

The light-emitting layer(s) of the present invention preferably include a light-emitting dopant(s) and a host compound(s).

(Light-Emitting Dopant)

A light-emitting dopant (also referred to as a dopant) is described below.

As a light-emitting dopant, a fluorescent dopant (also referred to as a fluorescence-emitting dopant) and a phosphorescent compound (also referred to as a phosphorescence-emitting dopant or a phosphorescent dopant) may be used.

(Phosphorescent Compound)

The phosphorescent compound of the present invention will now be described.

The phosphorescent dopant of the present invention is a compound showing light emission from an excited triplet state. Specifically, the phosphorescent dopant is a compound which emits phosphorescence at room temperature (25° C.) and is defined as having a phosphorescence quantum yield at 25° C. of 0.01 or more, and preferably 0.1 or more.

A phosphorescence quantum yield may be measured according to the method described in page 398 of *the fourth series of Experimental Chemistry 7, Spectroscopy II*, 1992 from MARUZEN Co., Ltd. Various solvents may be used in measuring a phosphorescence quantum yield in a solution. The phosphorescent dopant of the present invention may be any compound as long as a phosphorescence quantum yield of the phosphorescent dopant satisfies the above requirement (0.01 or more).

There are two principles of light emission by a phosphorescent dopant. One is an energy transfer-type, wherein the recombination of carriers occurs on a host compound onto which the carriers are transferred to produce an excited state of the host compound, and then via transfer of this energy to a phosphorescent dopant, light emission from the phosphorescent dopant occurs. The other is a carrier trap-type, wherein a phosphorescent dopant serves as a carrier trap to cause recombination of carriers on the phosphorescent dopant, and thereby light emission from the phosphorescent dopant occurs. In each type, the energy in the excited state of the phosphorescent dopant is required to be lower than that in the excited state of the host material.

Additionally, a compound(s) described in the following patent documents may be used in the light-emitting layer(s) of the present invention.

The documents are, for example, international Publication No. WO2000/070655, Japanese Patent Application Laid-Open Publications Nos. 2002-280178, 2001-181616, 2002-280179, 2001-181617, 2002-280180, 2001-247859, 2002-299060, 2001-313178, 2002-302671, 2001-345183 and 2002-324679, International Publication No. WO2002/15645, Japanese Patent Application Laid-Open Publications Nos. 2002-332291, 2002-50484, 2002-332292, 2002-83684, 2002-540572, 2002-117978, 2002-338588, 2002-170684 and 2002-352960, International Publication No. WO2001/093642, and Japanese Patent Application Laid-Open Publications Nos. 2002-50483, 2002-100476, 2002-173674, 2002-359082, 2002-175884, 2002-363552, 2002-184582, 2003-7469, 2002-525808, 2003-7471, 2002-525833, 2003-31366, 2002-226495, 2002-234894, 2002-235076, 2002-241751, 2001-319779, 2001-319780, 2002-62824, 2002-100474, 2002-203679, 2002-343572 and 2002-203678.

(Fluorescent Dopant)

Examples of the fluorescent dopant include coumarin dyes, pyran dyes, cyanine dyes, croconium dyes, squarylium dyes, oxobenzanthracene dyes, fluorescein dyes, rhodamine dyes, pyrylium dyes, perylene dyes, stilbene dyes, polythiophene dyes, rare earth fluorescent complexes and compounds having high fluorescence quantum yields as typified by laser dyes.

A plurality of compounds may be used in combination as the light-emitting dopants of the present invention. Phosphorescent dopants each having a different structure may be used in combination, or a phosphorescent dopant(s) and a fluorescent dopant(s) may be used in combination.

In the present invention, it is preferable that the light-emitting layer(s) include one or more phosphorescent compound.

It is preferable that the organic EL element of the present invention emits white light. To obtain the above-mentioned preferred chromaticity for a white light-emitting element, a light-emitting dopant(s) and a host compound(s) may be used in an adequate combination.

The light-emitting dopant is preferably a phosphorescent compound. At least one phosphorescent dopant has a maximum emission wavelength of preferably 480 nm or less, and more preferably from 400 to 480 nm.

In the present invention, it is particularly preferable that the light-emitting dopant is a phosphorescent compound represented by the general formula (1).

It is further preferable that the light-emitting layer is formed to include a phosphorescent compound(s) represented by the general formula (1) and a compound(s) represented by the general formula (2).

One or more light-emitting layers may be provided. Preferably, the number of light-emitting layer is one.

(Host Compound (Light-Emitting Host))

The host compound included in the light-emitting layer of the organic EL element of the present invention is a compound having a phosphorescence quantum yield in phosphorescence emission at room temperature (25° C.) of less than 0.1, and more preferably less than 0.01. The content of the host compound in the light-emitting layer is 20% by mass or more with respect to all of the compounds included in the light-emitting layer.

The light-emitting host employable in the present invention may be any compound that is conventionally used in an organic EL element without particular limitation. Representative examples include carbazole derivatives, triarylamine derivatives, derivatives of aromatic compound, nitrogen-containing hetero ring compounds, thiophene derivatives, furan derivatives, compounds including oligoarylene compounds as their basic structures, carboline derivatives and diazacarbazole derivatives (a diazacarbazole derivative is a compound where at least one of carbon atoms of hydrocarbon rings constituting a carboline ring of a carboline derivative is substituted with a nitrogen atom).

A known host compound employable in the present invention is preferably a compound having hole-transporting properties and electron-transporting properties, avoiding lengthening of wavelength of emitted light and having high grass transition temperature (Tg).

In the present invention, a compound represented by the general formula (2) and/or a known light-emitting host may be used alone, or a plurality of compounds represented by the general formula (2) and/or known light-emitting hosts may be used in combination.

Using a plurality of light-emitting hosts enables adjustment of charge transfer, which improves efficiency of an organic EL element.

The host compound used in the present invention may be a low-molecular-weight compound, a polymer including a repeating unit(s), or a low-molecular-weight compound including a polymerizable group(s) such as a vinyl group and epoxy group (i.e., a deposition polymerizable light-emitting host). One or more of such compounds may be used.

Preferable examples of a conventionally known host compound include compounds described in the following documents.

The documents are, for example, Japanese Patent Application Laid-Open Publications Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837.

A particularly preferable compound for the light-emitting host in the light-emitting layer of the present invention is a compound represented by the general formula (2) as described above.

It is preferable to use a phosphorescent compound(s) represented by the general formula (1) together with a light-emitting host(s) represented by the general formula (2), because this greatly increases the effects of the present invention.

<<Hole-Transporting Layer>>

The hole-transporting layer is composed of a hole-transporting material(s). In a broad sense, the hole-injecting layer and the electron-blocking layer are the hole-transporting layers. A single or multiple hole-transporting layers may be provided.

The hole-transporting material may be any organic or inorganic material having hole-injecting properties, hole-transporting properties and/or electron-blocking properties. Examples include triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, silazane derivatives, aniline-based copolymers. Examples further include electroconductive polymers as typified particularly by thiophene polymers.

The above-exemplified materials may be used as the hole-transporting material. In addition, porphyrins, tertiary aromatic amines, styrylamines and organic metal complexes are preferable. Organic metal complexes and tertiary aromatic amines are preferable, and organic metal complexes are particularly preferable.

Representative examples of the aromatic tertiary anime compound and stylylamine compound include N,N,N',N'-tetraphenyl-4,4'-diaminophenyl; N,N'-diphenyl-N,N'-bis(3-methylphenyl)-[1,1'-biphenyl]-4,4'-diamine (TPD); 2,2-bis(4-di-p-tolylaminophenyl)propane; 1,1-bis(4-di-p-tolylaminophenyl)cyclohexane; N,N,N',N'-tetra-p-tolyl-4,4'-diaminobiphenyl; 1,1-bis(4-di-p-tolylaminophenyl)-4-phenylcyclohexane; bis(4-dimethylamino-2-methylphenyl)phenylmethane; bis(4-di-p-tolylaminophenyl)phenylmethane; N,N'-diphenyl-N,N'-di(4-methoxyphenyl)-4,4-diaminobiphenyl; N,N,N',N'-tetraphenyl-4,4-diaminodiphenyl ether; 4,4-bis(diphenylamino) quaterphenyl; N,N,N-tri(p-tolyl)amine, 4-(di-p-tolylamino)-4-[4-(di-p-tolylamino)styryl]stilbene; 4-N,N-diphenylamino-(2-diphenylvinyl)benzene; 3-methoxy-4'-N,N-diphenylaminostylbenzene; N-phenylcarbazole; a compound having two condensed aromatic rings in the molecule described in U.S. Pat. No. 5,061,569 such as 4,4-bis[N-(1-naphthyl)-N-phenylamino]biphenyl (NPD); and a compound described in Japanese Patent Application Laid-Open Publication No. Hei4-308688, i.e., 4,4',4"-tris[N-(3-methylphenyl)-N-phenylamino]triphenylamine (MTDATA) in which three triphenylamine units are bonded, in a starburst form.

For the organic metal complex, an organic metal complex represented by the general formula (1) is preferable.

Polymer materials where the above compound(s) are introduced in their polymer chains or are present as their main chains may also be used.

Further, inorganic compounds such as p-Si and p-SiC may also be used as a hole-injecting material or hole-transporting material.

Further, a hole-transporting material having properties like those of p-type semiconductors, as described in Japanese Patent Application Laid-Open Publication No. Hei11-251067 or J. Huang et al. (*Applied Physics Letters*, 80 (2002), p. 139) may also be used. In the present invention, these materials are preferably used because a light-emitting element with higher efficiency can be obtained.

The hole-transporting layer may be obtained by forming a thin layer with the above-described hole-transporting material(s) by a known method such as vacuum deposition, spin coating, casting, printing including ink jetting, or Langmuir-Blodgett (LB) method.

The thickness of the hole-transporting layer is not particularly limited, but normally from about 5 nm to 5 μm, and preferably from 5 to 200 nm. The hole-transporting layer may be a single layer composed of one or more of the above materials.

Further, a hole-transporting material doped with impurity(ies) and having high p-type properties may also be used. Examples thereof are described in Japanese Patent Application Laid-Open Publications Nos. Hei4-297076, 2000-196140 and 2001-102175, and *J. Appl. Phys.*, 95, 5773 (2004), for example.

In the present invention, such an electron-transporting material having p-type properties is preferably used because use of such a material provides an element consuming much less power.

Examples of a compound preferably used for forming the hole-transporting layer of the organic EL element of the present invention, except for particularly preferable metal complexes represented by the general formula (1), will now be described. However, the present invention is not limited thereto.

[Chemical Formula 47]

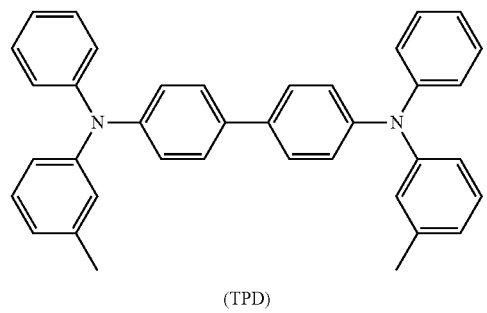

(TPD)

HT-2
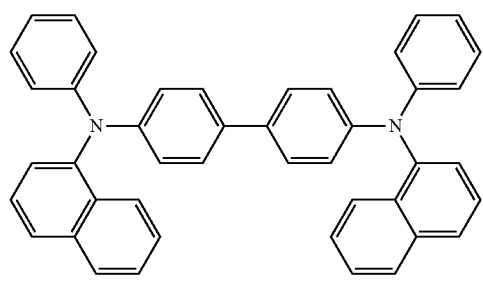
(α-NPD)
HT-3
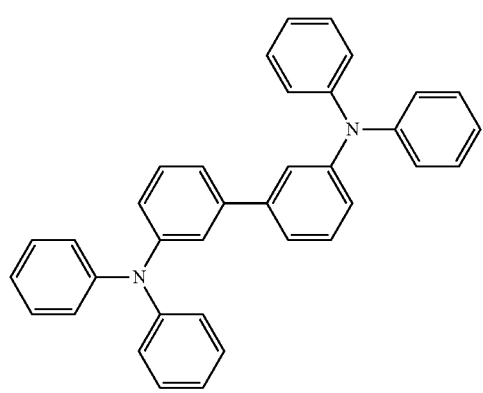
HT-4
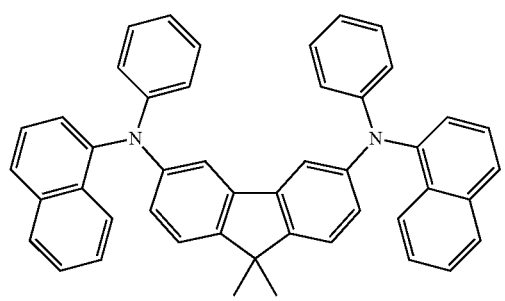
HT-5
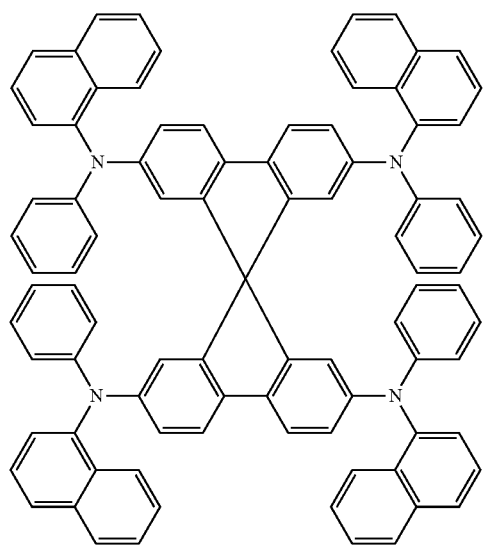
HT-6
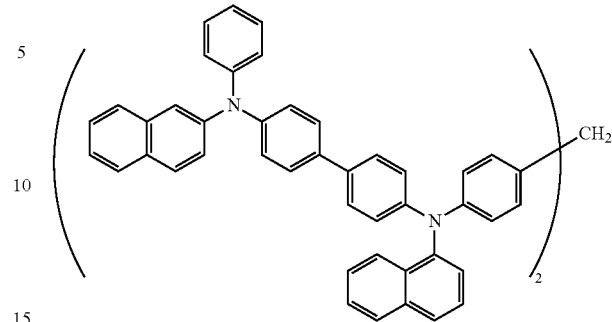
[Chemical Formula 48]
HT-7
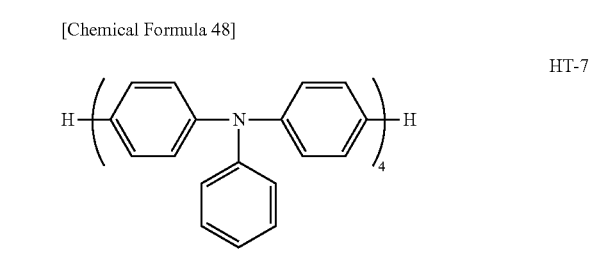
HT-8
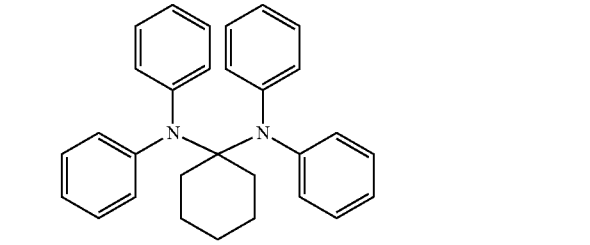
HT-9
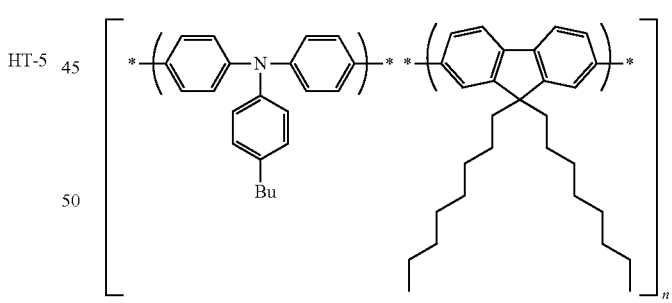
(F8-TFB)
HT-10
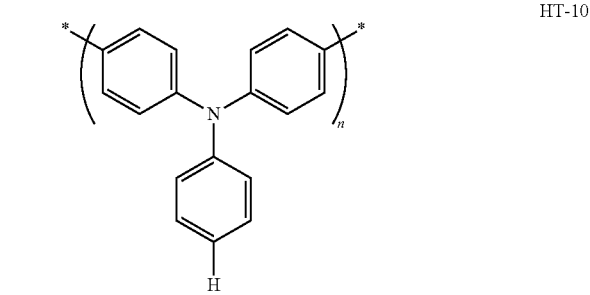

HT-11 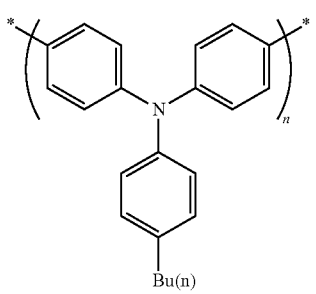
HT-12 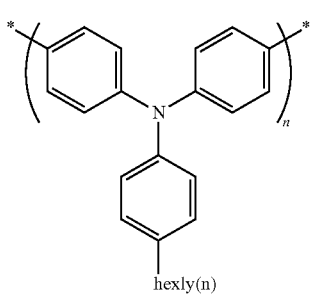
[Chemical Formula 49]
HT-13 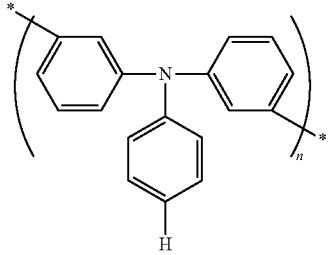
HT-14 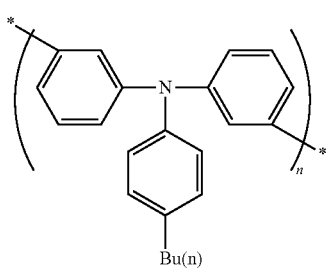
HT-15 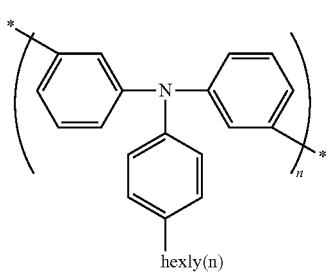
HT-16 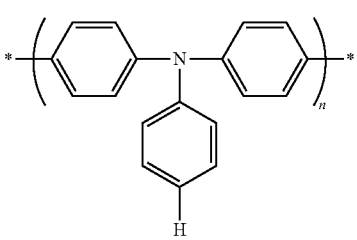
HT-17 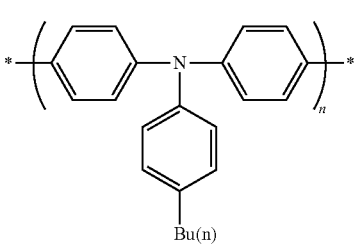
HT-18
HT-19
HT-20

HT-21

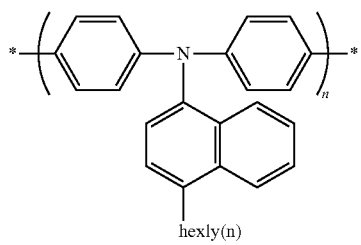

hexly(n)

[Chemical Formula 50]

HT-22

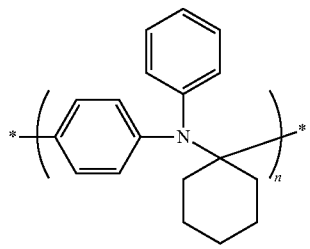

HT-23

HT-24

HT-25

HT-26

HT-27

HT-28

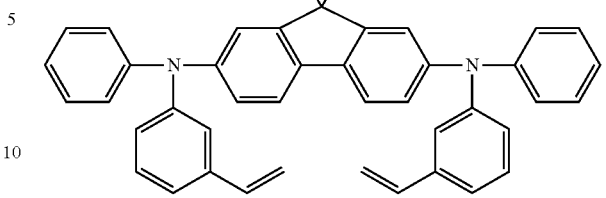

HT-29

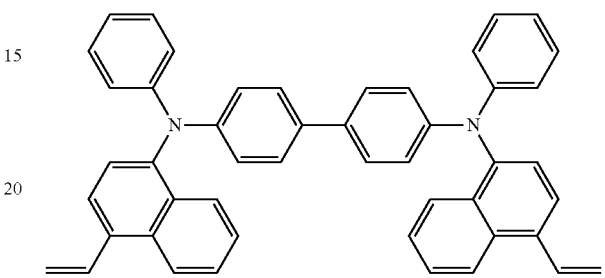

<<Blocking Layer: Hole-Blocking Layer and Electron-Blocking Layer>>

The blocking layer is provided as needed in addition to fundamental constituent layers as the organic compound thin films. Examples include hole-blocking layers described in Japanese Patent Application Laid-Open Publications Nos. Hei11-204258 and Hei11-204359, and page 237 of "*The frontier of Organic EL element and its industrialization*" (published by NTS Inc., Nov. 30, 1998).

The hole-blocking layer functions as an electron-transporting layer in a broad sense and is composed of an hole-blocking material(s) which transport electrons while having significantly small hole-transporting properties. The hole-blocking layer transports electrons and blocks holes thereby increasing chance to recombination of electrons with holes.

Constitutions of an electron-transporting layer described later may be used for the hole-blocking layer as needed.

The hole-blocking layer of the organic EL element of the present invention is preferably provided to be adjacent to the light-emitting layer.

The hole-blocking layer preferably includes a carbazole derivative(s) and/or an azacarbazole derivative(s) (a compound where one or more of the carbon atoms of the carbazole ring is substituted with nitrogen atom), which are described above as the host compounds.

In the present invention, when a plurality of the light-emitting layers each emitting light of a color different from each other are provided, a light-emitting layer whose maximum emission wavelength is the shortest in all of the light-emitting layers is preferably provided so as to be the closest to the anode. In such a case, an additional hole-blocking layer is preferably disposed between the light-emitting layer whose maximum emission wavelength is the shortest and a light-emitting layer that is the next closest to the anode. Furthermore, at least 50% by mass of the compounds contained in the electron hole-blocking layer provided at the position described above preferably has an ionization potential of 0.3 eV or more higher than that of the host compound contained in the light-emitting layer whose maximum emission wavelength is the shortest.

On the other hand, the electron-blocking layer functions as a hole-transporting layer in a broad sense and is composed of a material(s) which transport holes while having significantly small electron-transporting properties. The electron-blocking layer transports holes and blocks electrons thereby increasing chance to recombination of electrons with holes.

The Constitution of the hole-transporting layer described above may be used for the electron-blocking layer as needed. The thicknesses of the hole-blocking layer and the electron-blocking layer of the present invention are each preferably from 3 to 100 nm, and more preferably from 3 to 30 nm.

<<Injecting Layer: Electron-Injecting Layer (Cathode Buffer Layer) and Hole-Injecting Layer>>

In the organic EL element of the present invention, an injecting layer(s) may be provided as needed. The injecting layer may be provided between the anode and the light-emitting layer or the hole-transporting layer, or between the cathode and the light-emitting layer or the electron-transporting layer.

The injecting layer of the present invention is a layer provided between the electrode and the organic layer to lower driving voltage and improve luminance, and described in detail in Chapter 2 "Electrode Materials", Div. 2 Chapter 2 (pp. 123-166) of *Organic EL element and Its Frontier of Industrialization* (published by NTS Corporation, Nov. 30, 1998). The injecting layer is categorized into a hole-injecting layer (anode buffer layer) and electron-injecting layer (cathode buffer layer).

The hole-injecting layer (anode buffer layer) is also described in detail in Japanese Patent Application Laid-Open Publications Nos. Hei9-45479, Hei9-260062 and Hei8-288069, for example. Specific examples include a buffer layer composed of a phthalocyanine as typified by copper phthalocyanine; a buffer layer composed of an oxide as typified by vanadium oxide; a buffer layer composed of an amorphous carbon; and a buffer layer composed of an electroconductive polymer such as polyaniline (emeraldine) or polythiophene. In the present invention, the hole-injecting layer is preferably provided between the anode and the hole-transporting layer.

The electron-injecting layer (cathode buffer layer) is also described in detail in Japanese Patent Application Laid-Open Publications Nos. Hei6-325871, Hei9-17574 and Hei10-74586, for example. Specific examples include a buffer layer composed of a metal as typified by strontium and aluminum; a buffer layer composed of an alkali metal compound as typified by lithium fluoride and potassium fluoride; a buffer layer composed of an alkali earth metal compound as typified by magnesium fluoride and cesium fluoride; a buffer layer composed of an oxide as typified by aluminum oxide. The above buffer layers (injecting layers) are preferably very thin films. Their thicknesses are each preferably from 0.1 nm to 5.0 µm, while depending on a used material(s).

Materials used in the hole-injecting layer (anode buffer layer) and the cathode buffer layer may be used together with other materials. For example, these materials may be mixed together in the hole-transporting layer and the electron-transporting layer.

<<Electron-Transporting Layer>>

The electron-transporting layer is composed of a material(s) having electron-transporting properties, and in a broad sense, includes the electron-injecting layer and hole-blocking layer. One or more electron-transporting layers may be provided.

An electron-transporting material used in the electron-transporting layer (including a hole-blocking material and an electron-injecting material) may be any material having properties for transporting electrons injected from the cathode to the light-emitting layer, and may be arbitrarily selected from conventionally known compounds.

Examples of the known compounds used in the electron-transporting layer (hereinafter referred to as an electron-transporting material) include azacarbazole derivatives such as nitro-substituted fluorene derivatives, diphenylquinone derivatives, thiopyran dioxide derivatives, tetracarbonic acid anhydrides in a form of a fused ring such as naphthalene perylene, carbodiimides, fluorenyl idene methane derivatives, derivatives of anthraquinon-dimethane, derivatives of anthrone, oxadiazole derivatives and carboline derivatives.

An azacarbazole derivative is a compound where one or more carbon atoms of the carbazole ring is substituted with a nitrogen atom(s).

In addition, substituted oxadiazole derivatives where the oxygen atom on the oxadiazole ring is substituted with a sulfur atom, namely, thiadiazole derivatives, and quinoxaline derivatives containing a quinoxaline ring(s) known as an electron-withdrawing group may be used as the electron-transporting material.

The above compound(s) may be introduced in polymer chains or used as a main chain of a polymer. Such polymers may be used as the electron-transporting material.

Further examples of the electron-transporting material include metal complexes of 8-quinolinole derivatives such as tris(8-quinolinol) aluminum (hereinafter abbreviated as Alq), tris(5,7-dichloro-8-quinolinol) aluminum, tris(5,7-dibromo-8-quinolinol)aluminum, tris(2-methyl-8-quinolinol)aluminum, tris(5-methyl-8-quinolinol)aluminum, bis(8-quinolinol)zinc (Znq), and complexes where the central metal of any of these complexes is substituted with In, Mg, Cu, Ca, Sn, Ga or Pb.

In addition, metal phthalocyanines, metal-free phthalocyanines, metal phthalocyanines of which ends are substituted with an alkyl group or sulfonic acid group or metal-free phthalocyanines of which end(s) are substituted with an alkyl group or sulfonic acid group may be used as the electron-transporting material.

Inorganic semiconductors such as n-Si and n-SiC may also be used as the electron-transporting material.

The electron-transporting layer may be obtained by forming a layer with the electron-transporting material(s) by, for example, vacuum deposition or a wet method (also referred to as a wet process and exemplified by spin coating, casting, die coating, blade coating, roll coating, ink jetting, ink jetting, printing, spray coating, curtain coating and Langmuir-Blodgett (LB) method).

A method for forming the constituent layers of the organic EL element will be described in detail in the description of a method for preparing the organic EL element.

The thickness of the electron-transporting layer is not particularly limited, but normally from about 5 to 5000 nm, and preferably from 5 to 200 nm. The electron-transporting layer may be a single layer composed of one or more of the above materials.

Further, an electron-transporting material doped with impurity(ies) and having high n-type properties may also be used. Examples thereof are described in Japanese Patent Application Laid-Open Publications Nos. Hei4-297076, Hei10-270172, 2000-196140 and 2001-102175, and *J. Appl. Phys.*, 95, 5773 (2004), for example.

Examples of the known compounds preferably used for forming the electron-transporting layer of the white light-emitting organic EL element of the present invention will now be described, but the present invention is not limited thereto.

[Chemical Formula 51]
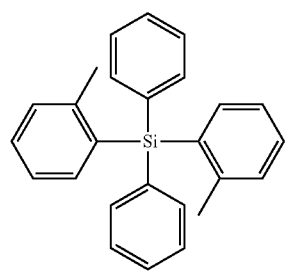
ET-1
(BCP)
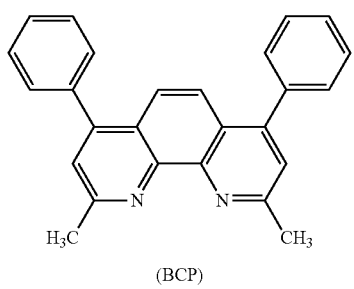
ET-2
(PBD)
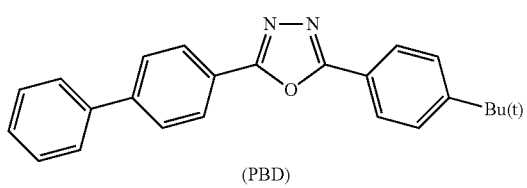
ET-3
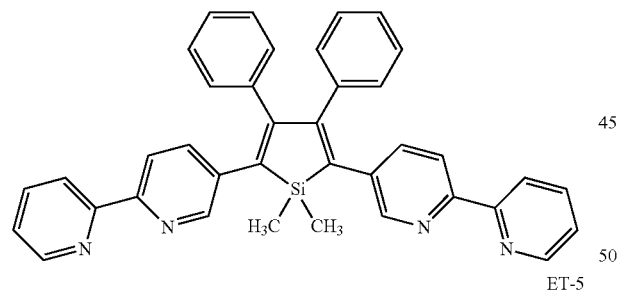
ET-4
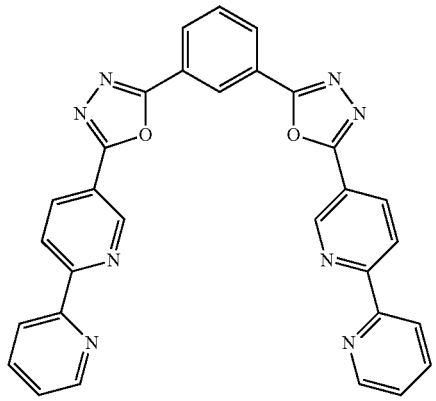
ET-5
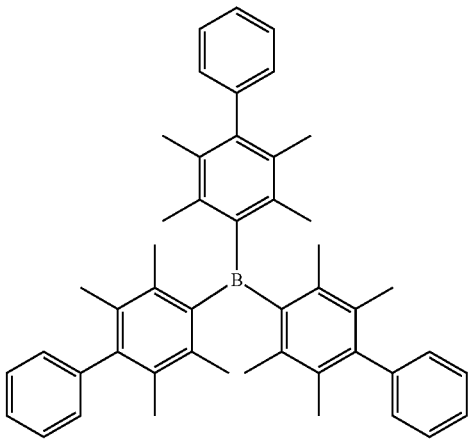
ET-6
(Alq3)
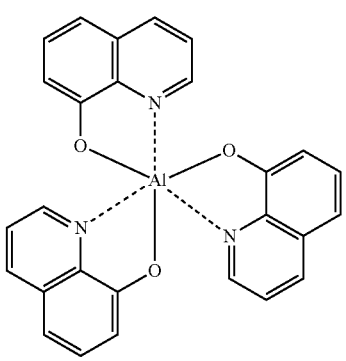
ET-7
(BAlq)
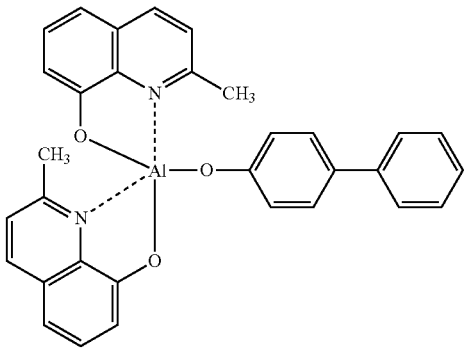
ET-8
[Chemical Formula 52]
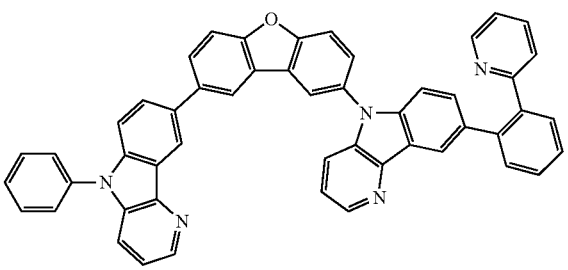
ET-9

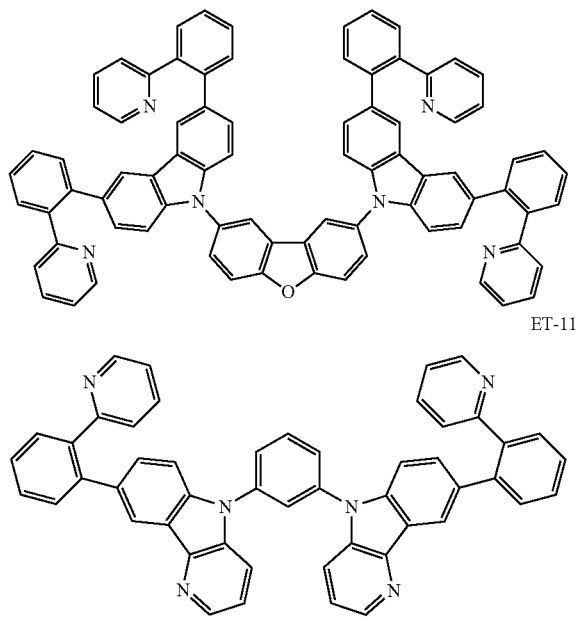

ET-10

ET-11

<<Anode>>

For the anode of the organic EL element of the present invention, a metal, alloy, electroconductive compound or a mixture thereof, each of which has a high work function (4 eV or more), is preferably used as an electrode material. Specific examples of the electrode material include metals such as Au and transparent electroconductive materials such as CuI, indium thin oxide (ITO), $SnO_2$ and ZnO.

A material that is amorphous and can be used for a transparent electroconductive film such as IDIXO ($In_2O_3$—ZnO) may also be used. The anode may be obtained by forming a thin film with the above-described electrode material(s) by a method such as deposition or sputtering followed by patterning by photolithography to form a desired pattern. In the case where patterning does not need to be so accurate (about 100 μm or more), patterning may be conducted using a mask in a desired shape in deposition or sputtering of the above-described electrode material.

In the case of using a compound that is applicable such as an organic electroconductive compound, a wet film forming method such as printing or coating may be used. For extracting emitted light from the anode, the transmittance of the anode is desirably 10% or more, and the sheet resistance of the anode is preferably a few hundreds Ω/□ or less. The thickness of the layer usually ranges from 10 to 1000 nm, and preferably from 10 to 200 nm, while depending on its material.

<<Cathode>>

On the other hand, for the cathode of the organic EL element of the present invention, a metal, alloy, electroconductive compound or a mixture thereof, each of which has a low work function (4 eV or less) (called an electron-injecting metal) is preferably used as an electrode material. Examples of such an electrode material include sodium, sodium-potassium alloy, magnesium, lithium, a mixture of magnesium and copper, a mixture of magnesium and silver, a mixture of magnesium and aluminum, a mixture of magnesium and indium, a mixture of aluminum and aluminum oxide ($Al_2O_3$), indium, a mixture of lithium and aluminum and rare earth elements.

Among them, in terms of electron-injecting properties and resistance against oxidation and the like, a preferable material is a mixture of an electron-injecting metal and a secondary metal that has work function higher than that of the electron-injecting material and is stable, for example, a mixture of magnesium and silver, a mixture of magnesium and aluminum, a mixture of magnesium and indium, a mixture of aluminum and aluminum oxide ($Al_2O_3$), a mixture of lithium and aluminum, aluminum and the like.

The cathode may be obtained by forming a thin layer with the above-described electrode material(s) by a method such as deposition, sputtering or the like. Sheet resistance of the cathode is preferably a few hundreds Ω/□ or less, and the thickness of the cathode is normally from 10 nm to 5 μm, and preferably from 50 to 200 nm. To transmit emitted light, it is preferable that the anode or the cathode of the organic EL element is transparent or semi-transparent, which achieves improved luminance.

The transparent or semi-transparent cathode may be obtained by forming a layer having a thickness of 1 to 20 nm with the above-described metal(s) and subsequently applying the transparent electroconductive material(s) described in the description of the anode on the cathode; by using this procedure, an organic EL element including the anode and the cathode, both of which are transparent, are obtained.

<<Supporting Substrate>>

The supporting substrate applied to the organic EL element of the present invention (hereinafter also referred to as a substrate) may be composed of, for example, glass or plastic, but types of glasses and plastics are not particularly limited. The supporting substrate may be transparent or opaque. In the case where light is extracted from the side of the supporting substrate, the supporting substrate is preferably transparent. Preferable examples of the transparent supporting substrate include a glass substrate, a quartz substrate and a transparent resin film. A particularly preferable supporting substrate is made from a resin film which is flexible and is capable of providing flexibility for an organic EL element.

Examples of the resin film include films of polyesters such as polyethylene terephthalate (PET) and polyethylene naphthalate (PEN), polyethylene, polypropylene, cellophane, cellulose esters and their derivatives such as cellulose diacetate, cellulose triacetate, cellulose acetate butyrate, cellulose acetate propionate (CAP), cellulose acetate phthalate (TAC) and cellulose nitrate, polyvinylidene chloride, polyvinyl alcohol, polyethylene vinyl alcohol, syndiotactic polystyrene, polycarbonate, norbornene resins, polymethylpentene, polyether ketones, polyimides, polyethersulfone (PES), polyphenylene sulfide, polysulfones, polyether imide, polyether ketone imide, polyamide, fluorine resins, nylon, polymethyl methacrylate, acrylics and polyarylates, and cycloolefin resins such as ARTON (trade name, manufactured by JSR. Corp.) and APEL (trade name, manufactured by Mitsui Chemicals Inc.)

On the surface of the resin film, an inorganic or organic coating film or a hybrid coating film composed of the both may be formed. The coating film is preferably a high barrier film having a water vapor transmission rate at 25±0.5° C. and 90±2% RH of 0.01 g/($m^2$·24 h) or less determined according to JIS K 7129-1992, and more preferably a high barrier film having an oxygen transmission rate of $10^{-3}$ ml/($m^2$·24 h·atm) or less determined according to JIS K 7126-1987 and a water vapor transmission rate of $10^{-5}$ g/($m^2$·24 h) or less.

The barrier film may be formed with any material(s) that can prevent penetration of substances such as moisture and oxygen causing degradation of the element, and usable examples of the material include silicon oxide, silicon dioxide and silicon nitride. To improve weakness of the film, a barrier film having a laminate structure composed of an inorganic layer and an organic material layer is preferred. The order of these stacked inorganic layer(s) and organic layer(s) is not particularly limited, but it is preferable to stack the inorganic layers and organic layers alternately for multiple times.

The barrier film may be formed by any method without particular limitation. For example, vacuum deposition, sputtering, reactive sputtering, molecular beam epitaxy, ionized-cluster beam method, ion plating, plasma polymerization, atmospheric pressure plasma polymerization, plasma CVD, laser CVD, thermal CVD, or coating may be used, and atmospheric pressure plasma polymerization as described in Japanese Patent Application Laid-Open Publication No. 2004-68143 is preferable.

Examples of the opaque supporting substrate include metal plates such as an aluminum plate and stainless plate, films, opaque resin substrates and ceramic substrates.

In the organic EL element of the present invention, efficiency of external extraction of light at room temperature is preferably 1% or more, and more preferably 5% or more.

The efficiency of external extraction of light (%) is obtained by the equation:

efficiency of external extraction of light(%)=the number of photons emitted to the outside of an organic EL element/the number of electrons flowed into the organic EL element×100

A hue improving filter such as a color filter may be used in combination, or a color conversion filter that converts the color of light emitted by the organic EL element into many colors using a fluorescent compound may be used together.

<<Method for Manufacturing Organic EL Element>>

As an example of the method for manufacturing the organic EL element of the present invention, a method for manufacturing an organic EL element consisting of anode/hole-injecting layer/hole-transporting layer/light-emitting layer/hole-blocking layer/electron-transporting layer/cathode buffer layer (electron-injecting layer)/cathode will be described.

The anode is obtained by forming a thin film having a thickness of 1 µm or less, preferably 10 to 200 nm and including a desired electrode material(s), for example, a material for the anode on a suitable substrate.

Subsequently, thin films each including organic compounds as materials of the organic EL element, i.e., the electron hole-injecting layer, the electron hole-transporting layer, the light-emitting layer, the electron hole-blocking layer, the electron-transporting layer and the electron-injecting layer, are formed on/over the anode.

In the phosphorescent organic EL element, it is preferable that the layer including a compound(s) represented by the general formula (2) is formed by a wet method in terms of cost and productivity.

Examples of the wet method include spin coating, casting, die coating, blade coating, roll coating, ink jetting, printing, spray coating, curtain coating and LB method. Preferable methods in terms of forming fine thin films and ensuring high productivity are methods suitable for a roll-to-roll method such as die coating, roll coating, ink jetting and spray coating. Each layer may be formed by a method different from each other.

In the case of forming the constituent layers of the organic EL element of the present invention by application, the organic EL materials used for the application are dissolved or dispersed in liquid media, and usable examples of such a medium include ketones such as methyl ethyl ketone and cyclohexanone; aliphatic acid esters such as ethyl acetate; halogenated hydrocarbons such as dichlorobenzene; aromatic hydrocarbons such as toluene, xylene, mesitylene and cyclohexylbenzene; aliphatic hydrocarbons such as cyclohexane, decaline and dodecane; and organic solvents such as DMF and DMSO.

Dispersion can be performed by, for example, ultrasonic wave dispersion, high shearing force dispersion, or medium dispersion.

After forming these layers, a thin film composed of a material(s) for the cathode is formed thereon so as to obtain a thickness of 1 µm or less, and preferably from 50 to 200 nm as the cathode. A desired organic EL element is thus manufactured.

Alternatively, the organic EL element can also be produced in the reverse order, i.e., in order of the cathode, the electron-injecting layer, the electron-transporting layer, the electron hole-blocking layer, the light-emitting layer, the electron hole-transporting layer, the electron hole-injecting layer and the anode.

When a direct current voltage, a voltage of about 2 to 40 V, is applied to the obtained multicolor display device defining the anode as a positive electrode and the cathode as a negative electrode, light emission can be observed. Alternatively, an alternating voltage may be applied. The alternating current to be applied may have any wave form.

The organic EL element of the present invention is preferably prepared by forming the above layers from the hole-injecting layer to the cathode in a single vacuuming. However, the vacuuming may be intermitted and then a method for forming layers different than the vacuuming may be used in the midstream of the vacuuming; in this case, it is preferable that the layers are formed, for example, under a dry inert gas atmosphere.

<<Sealing>>

Examples of the sealing ways used in the present invention include a way of bonding a sealing member to the electrode and supporting substrate with an adhesive.

The sealing member is disposed so as to cover a display area composed of the organic EL element(s) and may be in a shape of concave plate or flat plate. The transparency and the electrical insulation properties thereof are not specifically restricted.

Specific examples of the sealing member include a glass plate, a composite of polymer plate and film and a composite of metal plate and film. Particular examples of a glass plate include soda-lime grass plates, barium-strontium-containing glass plates, lead glass plates, aluminosilicate glass plates, borosilicate glass plates, barium borosilicate glass plates and quartz plates.

Examples of a polymer plate include polycarbonate plates, acrylic plates, polyethylene terephthalate plates, polyethersulfide plates, polysulfone plates. Examples of a metal plate include plates composed of one or more types of metals selected from stainless, iron, copper, aluminum, magnesium, nickel, zinc, chromium, titanium, molybdenum, silicon, germanium and tantalum, and plates composed of an alloy(s) of the above metals.

In the present invention, in terms of providing a thin element, polymer films and metal films are preferable.

A preferable polymer films has an oxygen transmission rate of $1 \times 10^{-3}$ ml/(m$^2$·day·atm) or less determined according to JIS K 7126-1987 and a moisture vapor transmission rate at 25±0.5° C. and 90±2% RH of $1 \times 10^{-3}$ g/(m$^2$·24 h) or less determined according to JIS K 7129-1992.

The sealing member may be made concave by sandblasting or chemical etching, for example.

The adhesive may be exemplified by light curing or heat curing adhesives containing reactive vinyl groups of an acrylic acid-based oligomer and/or methacrylic acid-based oligomer, moisture curing adhesives such as 2-cyanoacrylate, and heat and chemical curing adhesives (mixture of two types of adhesives) such as epoxy adhesives. In addition, hot-melt polyamides, hot-melt polyesters, hot-melt polyolefins, cationic UV curing epoxy resin adhesives may also be given as examples.

To prevent the organic EL element from being deteriorated by heat, preferable adhesives are curable at a temperature ranging from room temperature up to 80° C. In the adhesive, a desiccant may be dispersed. Application of the adhesive to a sealing area may be conducted using a commercially available dispenser or conducted by printing such as screen printing.

It is also preferable to form a layer as a sealing membrane including an inorganic or organic compound. The sealing membrane is formed on the electrode which sandwiches the organic layer with the supporting substrate so as to cover the electrode and the organic layer and so as to contact to the supporting substrate. A material used for the sealing membrane may be any materials capable of suppressing intrusion of matters that cause deterioration such as water, oxygen and the like. Examples of the material include silicon oxide, silicon dioxide, silicon nitride and the like.

To improve weakness of the sealing membrane, the sealing membrane preferably has a laminated structure constituted of the inorganic layer composed of the above inorganic material(s) and an organic layer composed of an organic material(s). The sealing membrane may be formed by vacuum deposition, sputtering, reactive sputtering, molecular beam epitaxy, cluster ion beam, ion plating, plasma polymerization, atmospheric pressure plasma polymerization, plasma CVD, laser CVD, heat CVD or coating, but not specifically limited thereto.

Inert gas such as nitrogen and argon or inert liquid such as fluorohydrocarbon and silicone oil is preferably provided between the sealing member and the display area by injection to provide a gas or liquid medium between the sealing member and the display area composed of the organic EL element(s). The gap between the sealing member and the display area may also be vacuum. Further a hygroscopic compound may be enclosed within the gap.

The hygroscopic compound may be exemplified by metal oxides such as sodium oxide, potassium oxide, calcium oxide, barium oxide, magnesium oxide, aluminum oxide; sulfates such as sodium sulfate, calcium sulfate, magnesium sulfate, cobalt sulfate; metallic halides such as calcium chloride, magnesium chloride, cesium fluoride, tantalum fluoride, cerium bromide, magnesium bromide, barium iodide and magnesium iodide; perchloric acids such as barium perchlorate and magnesium perchlorate. As for sulfates, metallic halides and perchloric acids, anhydrous salts thereof are preferably used.

<<Protective Film, Protective Plate>>

A protective film or protective plate may be provided on the other side of the sealing membrane or sealing film, either of which is provided on the side sandwiching the organic layer with the supporting substrate, in order to improve mechanical strength of the organic EL element. It is preferable to provide the protective film or protective plate especially in the case of sealing with the sealing membrane because the sealing membrane is not so mechanically strong. Materials for the protective film or protective plate may be exemplified by a glass plate, a composite of polymer plate and film and a composite of metal plate and film, like the materials for sealing. To achieve light weight and thinness, polymer films are preferable.

<<Light Extraction>>

It is generally said that in an organic EL element, light is emitted in a layer whose refractive index is higher than that of air (i.e., refractive index is about 1.7 to 2.1), and only about 15 to 20% of the light emitted by the light-emitting layer can be extracted. This is because incident light on an interface (interface between a transparent substrate and the air) at an angle $\theta$ equal to or larger than a critical angle is totally reflected and cannot be extracted from the element or because light is totally reflected at the interface between the transparent electrode or light-emitting layer and the transparent substrate and is guided to the transparent electrode or the light-emitting layer to release the light in the direction of the element side face.

Examples of the method for improving the efficiency of light extraction include a method for preventing total reflection at the interface between the transparent substrate and the air by forming asperities on the surface of the transparent substrate (U.S. Pat. No. 4,774,435); a method for improving the efficiency by providing light-condensing property to the substrate (Japanese Patent Laid-Open Application Publication No. Sho63-314795); a method for forming a reflection surface on the side faces of the element (Japanese Patent Laid-Open Application Publication No. Hei1-220394); a method for providing an anti-reflection layer by disposing a smoothing layer between the substrate and the light-emitting material, the smoothing layer having a refractive index level between those of the substrate and the light-emitting material (Japanese Patent Laid-Open Application Publication No. Sho62-172691); a method for disposing a smoothing layer between the substrate and the light-emitting body, the smoothing layer having a refractive index lower than that of the substrate (Japanese Patent Laid-Open Application Publication No. 2001-202827); and a method for providing a diffraction grating between any layers of the substrate, the transparent electrode layer, and the light-emitting layer (including on the substrate surface facing the exterior) (Japanese Patent Laid-Open Application Publication No. Hei11-283751).

In the present invention, these methods can also be used for the organic EL element of the present invention. In particular, the method for disposing a smoothing layer between the substrate and the light-emitting material, the smoothing layer having a refractive index lower than that of the substrate or the method for forming a diffraction grating between any layers of the substrate, the transparent electrode layer, and the light-emitting layer (including on the substrate surface facing the exterior) may be suitably employed.

The present invention can provide an element exhibiting higher luminance and/or more excellent durability by combining the above methods.

In the case where a medium having a low refractive index and having a thickness greater than light wavelength is provided between a transparent electrode and a transparent substrate, the extraction efficiency of light from the transparent electrode to the exterior increases with a decrease in the refractive index of the medium.

The low refractive index layer may be composed of aero gel, porous silica, magnesium fluoride, fluorine-containing polymer or the like. The low refractive index of the low refractive index layer is preferably around 1.5 or less given that a refractive index of a transparent substrate is generally from 1.5 to 1.7. More preferably, the low refractive index of the low refractive index layer is 1.35 or less.

The low refractive index medium desirably has a thickness twice or more a light wavelength, in the medium, because if the low refractive index medium has a thickness similar to the light wavelength, the electromagnetic wave exuded as an evanescent wave penetrates into the substrate, resulting in reduction of the effect of the low refractive index layer.

The method for providing a diffracting grating at any interface where total reflection occurs or in any layer can highly improve efficiency of light extraction. A diffraction grating functions to turn light to a specific direction other than refraction by Bragg diffraction such as a primary diffraction or secondary diffraction. This method therefore achieves extraction of the emitted light that is caught in the element due to the total reflection and the like extract light by diffraction with the diffracting grating which is provided at any interface or in any layer (for example, in a transparent substrate or transparent electrode).

The diffracting grating to be provided is preferably has two-dimensional periodic refractive index distribution. This is because light is emitted in any directions randomly in the light-emitting layer, and thus a general one-dimensional diffracting grating having a periodic refractive index in a specific direction only diffracts light in a specific direction, resulted in little improvement of efficiency of light extraction.

The diffracting grating having two-dimensional diffractive index distribution can diffract light in any directions and thus highly improve the efficiency of light extraction.

The diffracting grating may be provided at any interface or any layer (for example, in a transparent substrate or transparent electrode), and preferably provided near a light-emitting layer where light is emitted.

A pitch of the diffracting grating is preferably one-second to three times of wavelength of light in the layer.

The diffracting grating preferably has in a two-dimensionally repeated pattern such as square lattice, triangle lattice and honeycomb lattice.

<<Light-Condensing Sheet>>

In the organic EL element of the present invention, on a side for light extraction of the supporting substrate (the substrate), micro lens array structure may be formed or a light-condensing sheet may be provided to condense light in a specific direction, for example, in a front direction with respect to a light emitting face of the element to increase luminance in a specific direction.

An exemplary structure of micro lens array is as follows: on the light extraction side of the substrate, quadrangular pyramids with a vertex angle of 90°, 30 μm on a side are two-dimensionally arranged. Each side of the quadrangular pyramids has a length of preferably from 10 to 100 μm. If each side is shorter than this range, coloring occurs; if each side is too long, the element is undesirably thick.

The light condensing sheet may be an available sheet used in an LED backlight of a liquid crystal display device, for example. Examples of such a sheet include Brightness Enhancement Film (BEF) from Sumitomo 3M Ltd, which is a prism sheet.

The prism sheet may have a structure where the substrate thereof is paved with triangular prisms having a vertex angle of 90° at a pitch of 50 μm between the vertexes. The vertexes of the triangular prisms may be roundish, or the pitch may be randomly varied. Other structures may also be employable.

To control emission angle of light from the light-emitting element, a light diffusion plate or light diffusion film may be used in combination with the light condensing sheet. Examples include LIGHT-UP™ from KIMOTO Co., Ltd., for example.

<<Application>>

The organic EL element of the present invention may be used for display devices, displays and various light sources. Examples of light sources include various applications such as illumination devices (a household lighting and an in-car lighting, for example), a backlight of a clock or liquid crystal display, a billboard, a traffic signal, a light source of an optical storage medium, a light source of an electro photocopier, a light source of an optical communication processor, a light source of an optical sensor and a general electric home appliance which requires a display device, but not limited thereto. Particularly, the organic EL element of the present invention can be effectively used for a backlight of a display device and a light source for illumination.

In the organic EL element of the present invention, the layers are patterned by using a metal mask or by ink-jet printing during formation of the layers as needed. The patterning may be performed for only the electrodes, for the electrodes and the light-emitting layer or for all layers of the element. Any known methods may be used in preparing the element.

<<Chromaticity of White Light from Organic Electroluminescent Element>>

Figure 4:
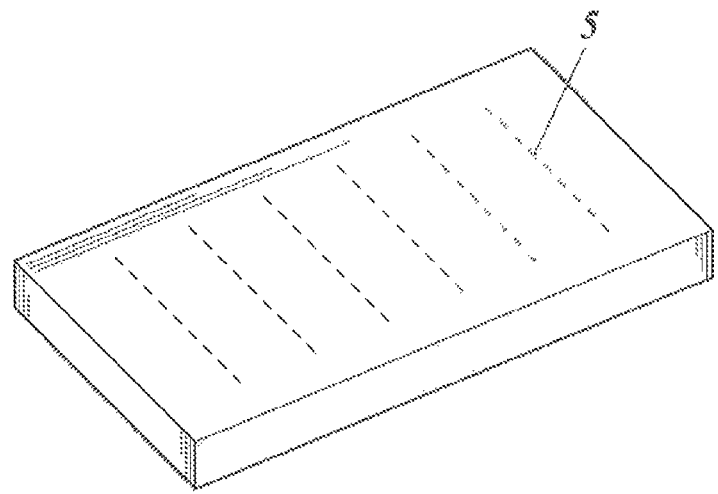
FIG. 4 This is a schematic diagram of a display device of a passive matrix system.
Figure 4:
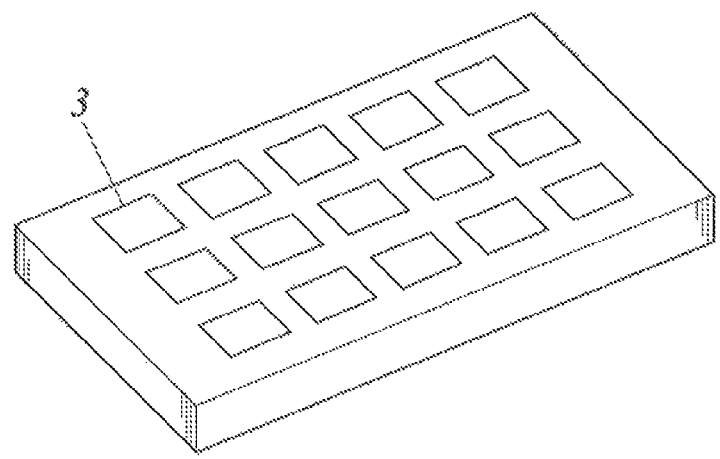
Figure 4:
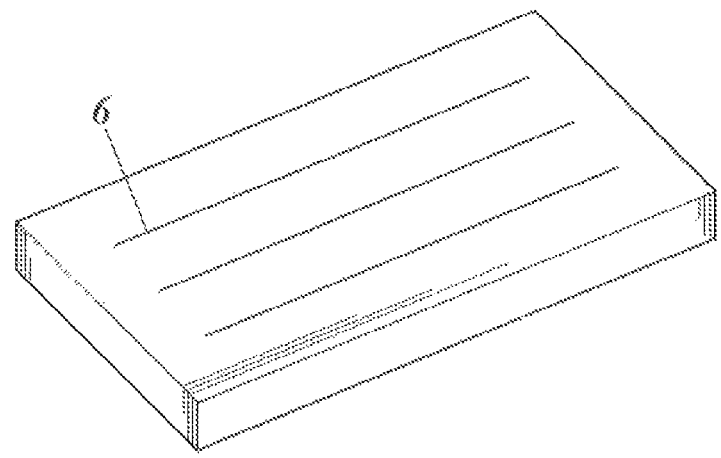

A color of light emitted from the organic EL element of the present invention or from a compound of the present invention is determined by applying values obtained using a spectroradiometer CS-1000 (manufactured by Konica Minolta Sensing, Inc.) to the CIE chromaticity coordinate shown in Fig. 4.16 on page 108 of *Handbook of Color Science, New Edition* (edited by the Color Science Association of Japan, published from University of Tokyo Press, 1985).

In a correlated color temperature of 2500 to 7000K in the CIE 1931 color space, chromaticity of the white light-emitting organic EL element of the present invention preferably has a deviation of y value of 0.1 or less from the blackbody locus at every color temperature.

<<Display Device>>

The display device of the present invention will now be described. The display device of the present invention includes the organic EL element(s) of the present invention.

The display device of the present invention may be a monochromatic display or a multicolor display, but a multicolor display device will be described here. In the case of a multicolor display device, the films can be formed on the entire surfaces by, for example, vacuum deposition, casting, spin coating, ink jetting or printing, while a shadow mask is provided only in forming the light-emitting layer.

In the case of patterning only the light-emitting layer, the patterning may be performed by any method without particular limitation and is preferably performed by vacuum deposition, ink jetting, spin coating or printing.

A configuration of the organic EL element of the display device is appropriately selected from the above-exemplified configurations of the organic EL element.

The method for manufacturing the organic EL element is as shown in the above one embodiment of the production of the organic EL element of the present invention.

When a direct current voltage, a voltage of about 2 to 40 V, is applied to the obtained multicolor display device defining the anode as a positive electrode and the cathode as a negative electrode, light emission can be observed. Alternatively, when a voltage is applied with reverse polarity, any current does not flow, and light is not emitted at all. When an alternating current is applied, light is emitted only in the state of the anode being positive and cathode being negative. The alternating current to be applied may have any wave form.

The multicolor display device can be used as a display device, a display, or various light emission sources. In the display device and display, full-color displaying is realized by using three types of organic EL elements each emitting blue, red or green light.

Examples of the display device and the display include televisions, personal computers, mobile equipment, AV equipment, teletext displays, and information displays in automobiles. In particular, the display device may be used for reproducing still images or moving images, and the driving system in the case of using the display device for reproducing moving images may be either a simple matrix (passive matrix) system or an active matrix system.

Examples of the light source include, but not limited to, household lamps, in-car lamps, backlights for watches and liquid crystals, board advertisements, traffic lights, light sources for optical memory media, light sources for electro-photographic copiers, light sources for optical communication instruments and light sources for optical sensors, An example of the display device including the organic EL element(s) of the present invention will now be described with reference to the drawings.

FIG. 1 is a schematic diagram illustrating an example of a display device composed of organic EL elements. The schematic diagram illustrates a display for, for example, a mobile phone to display image information through light emission by the organic EL elements, The display 1 is composed of a display unit A which includes a plurality of pixels, a control unit B which performs image scanning on the display unit A based on image information, and so forth.

The control unit B is electrically connected to the display unit A and sends scanning signals and image data signals to the respective pixels based on externally-input image information. The pixels in each scanning line sequentially emit light based on the scanning signal according to the image data signal and the image scanning is performed, and the image information is displayed on the display unit A.

Figure 2:
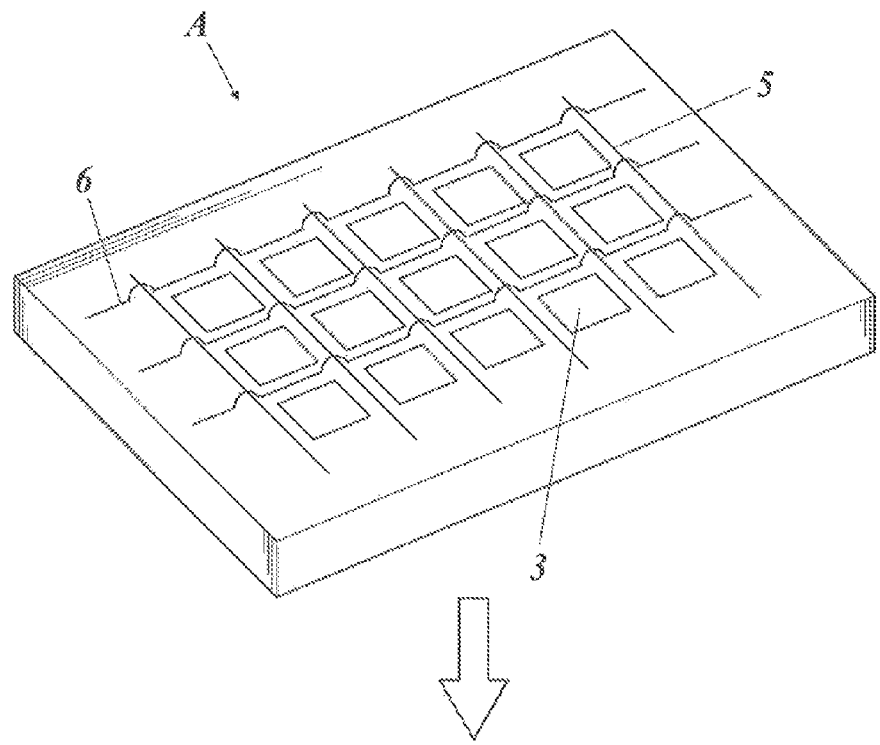
FIG. 2 This is a schematic diagram of a displaying unit A.

FIG. 2 is a schematic diagram of the display unit A.

The display unit A includes, on a substrate, a line part(s) including a plurality of scanning lines 5 and data lines 6, and a plurality of pixels 3. The main components of the display unit A is described below.

In the drawing, light L emitted by the pixels 3 is extracted to the direction shown with the white arrow (downward direction).

The scanning lines 5 and the data lines 6 in the line part are made of an electroconductive material(s) and are disposed so as to be orthogonal to each other to form a grid pattern. The scanning lines 5 and the data lines 6 are connected to the respective pixels at the intersections (the details are not shown).

A scanning signal is applied to the scanning line 5, and then the pixels 3 receive an image data signal from the data lines 6 and emit light according to the received image data.

Full color displaying is realized by appropriately apposing pixels each emitting light in a red region, light in a green region or light in a blue region on a single substrate.

The light emission process of a pixel will now be described.

Figure 3:
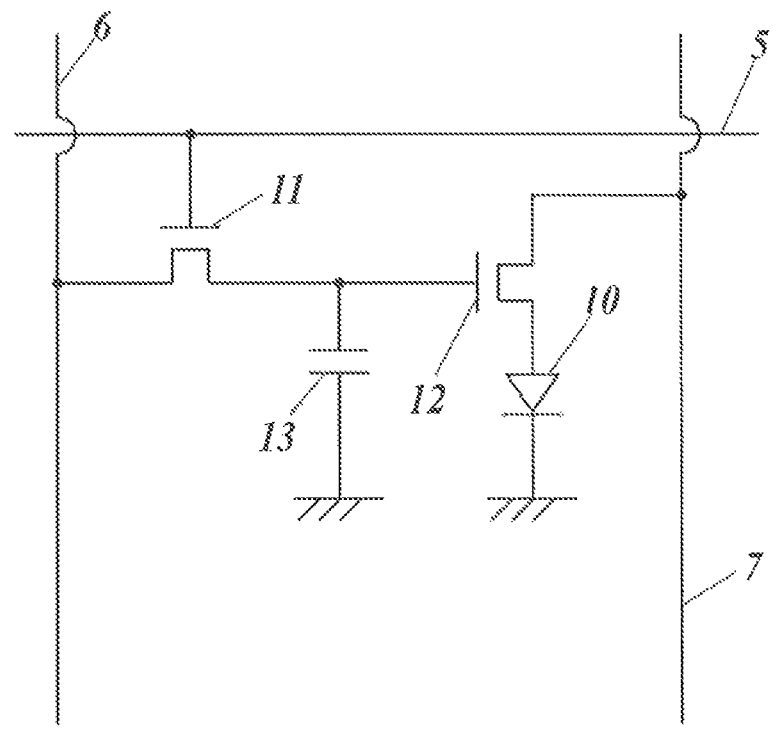
FIG. 3 This is a schematic diagram of a pixel.

FIG. 3 is a schematic diagram of the pixel.

The pixel includes an organic EL element 10, a switching transistor 11, a driving transistor 12, a capacitor 13, for example. Full color displaying can be realized using organic EL elements 10, each emitting red light, green light or blue light, that are arrayed at respective pixels on a single substrate.

In FIG. 3, an image data signal from the control unit B is applied to the drain of the switching transistor 11 via the data line 6. Then, a scanning signal from the control unit B is applied to the gate of the switching transistor 11 via the scanning line 5 to make the switching transistor 11 start driving, and the image data signal applied to the drain is transmitted to gates of the capacitor 13 and the driving transistor 12.

The capacitor 13 is charged upon the transmission of the image data signal depending on the potential of the image data signal, and the driving transistor 12 starts driving. In the driving transistor 12, the drain is connected to a power source line 7, and a source is connected to the electrode of the organic EL element 10 to supply a current to the organic EL element 10 from the power source line 7 depending on the potential of the image data signal applied to the gate.

The scanning signal is transmitted to the next scanning line 5 by sequential scanning by the control unit B, and then the switching transistor 11 stops the driving. The capacitor 13 maintains the charged potential of the image data signal even after the switching transistor 11 stops the driving, and thus the driving state of the driving transistor 12 is maintained to continue the light emission of the organic EL element 10 until the next scanning signal is applied. The driving transistor 12 is driven according to the potential of the subsequent image data signal in synchronization with the subsequent scanning signal applied by sequential scanning, resulting in light emission by the organic EL element 10.

That is, light emission by the organic EL element 10 is performed by providing the switching transistor 11 and the driving transistor 12 serving as active elements to the organic EL element 10 of each of the plurality of pixels and allowing the respective organic EL elements 10 of the pixels 3 to emit light. Such a light emitting process is called an active matrix system.

Light emitted by the organic EL element 10 may have multiple gradations according to multi-valued image data signals having different gradation electric potentials, or light emission by the organic EL element 10 may be turning on and off of light of a predetermined intensity according to a binary image data signal. The electric potential of the capacitor 13 may be maintained until the subsequent scanning signal is applied, or may be discharged immediately before the subsequent scanning signal is applied.

In the present invention, the light emission may be driven by a passive matrix system as well as the active matrix system described above. In the passive matrix system, light is emitted by the organic EL element in response to the data signal only during application of the scanning signals.

FIG. 4 illustrates schematic diagrams of a display device of a passive matrix method. In FIG. 4, pixels are provided between the scanning lines 5 and the image data lines 6 that are orthogonal to each other across the pixel 3 to form a grid pattern.

When a scanning signal is applied to a scanning line 5 by a sequential scanning, the pixel 3 connected to the scanning line 5 to which the scanning signal is applied emits light in accordance with the image data signal.

A passive matrix system does not have any active element in the pixels 3, which reduces a manufacturing cost.

<<Illumination Device>>

An illumination device of the present invention will now be described. The illumination device of the present invention includes the organic EL element(s) described above.

The organic EL element of the present invention having a resonator structure may be used. The organic EL element having a resonator structure can be applied to, for example, light sources for optical memory media, light sources for electrophotographic copiers, light sources for optical communication instruments and a light sources for optical sensors; however, its application is not limited thereto. Alternatively, the organic EL element of the present invention may be used for the above-mentioned purposes by employing laser oscillation.

The organic EL element of the present invention may be used as a lamp such as a lighting source or an exposure light source or may be used as a projector for projecting images or a display device (display) for direct view of still or moving images.

A driving system of the display device used for playback of moving images may be either a simple matrix (passive matrix) system or an active matrix system. Furthermore, a full-color display device can be manufactured by employing two or more types of organic EL elements of the present invention that each emitting light of a color different from each other.

The organic EL material of the present invention can be applied to an organic EL element emitting substantially white light as an illumination device. The white light is generated by mixing light of different colors simultaneously emitted by a plurality of light-emitting materials. The combination of colors of the emitted light may be a combination containing light of three maximum wavelengths of three primary colors of blue, green and red or a combination containing light of two maximum wavelengths using a relationship of complimentary colors such as blue and yellow or blue-green and orange.

Furthermore, the combination of light-emitting materials to obtain a plurality of colors of emitted light may be either a combination of a plurality of phosphorescence or fluorescence emitting materials or a combination of a fluorescent or phosphorescent material and a coloring material that emits light as excited light using the light from the light-emitting material. However, in the white organic EL element according to the present invention, it is sufficient only to use a plurality of light-emitting dopants together.

It is sufficient that, during forming the light-emitting layer, the electron hole-transporting layer or the electron-transporting layer, a mask can be simply arranged to conduct patterning via the arranged mask. The other layers are common and do not require any patterning with a mask or the like, and for example, an electrode film can be formed on the entire surface by, for example, vacuum deposition, casting, spin coating, ink jetting or printing, and thus productivity is also improved.

According to this method, the element itself emits white light, unlike a white organic EL device including multiple light-emitting elements emitting different colors opposed in an array form.

Any light-emitting material can be used without particular limitation for a light-emitting layer. For example, in a backlight in a liquid crystal display element, white light may be made by appropriately selecting and combining the metal complex(es) according to the present invention or known light-emitting material(s) so as to match with the wavelength range corresponding to color filter (CF) characteristics.

<<Embodiment of Illumination Device of the Invention>>

An embodiment of the illumination device including the organic EL element(s) of the present invention will now be described.

The non-light-emitting surface of the organic EL element of the present invention is covered with a glass case, and a glass substrate having a thickness of 300 μm is used as a sealing substrate. As a sealing material, an epoxy based photo-curable adhesive (LUXTRACK LC0629B manufactured by Toagosei Co., Ltd.) is applied to the periphery, and the glass case is placed from above the cathode and is attached to the transparent supporting substrate, followed by curing the adhesive by irradiation with V light from the side of the sealing glass substrate. Thus, an illumination device as shown in FIGS. 5 and 6 can be formed.

Figure 5:
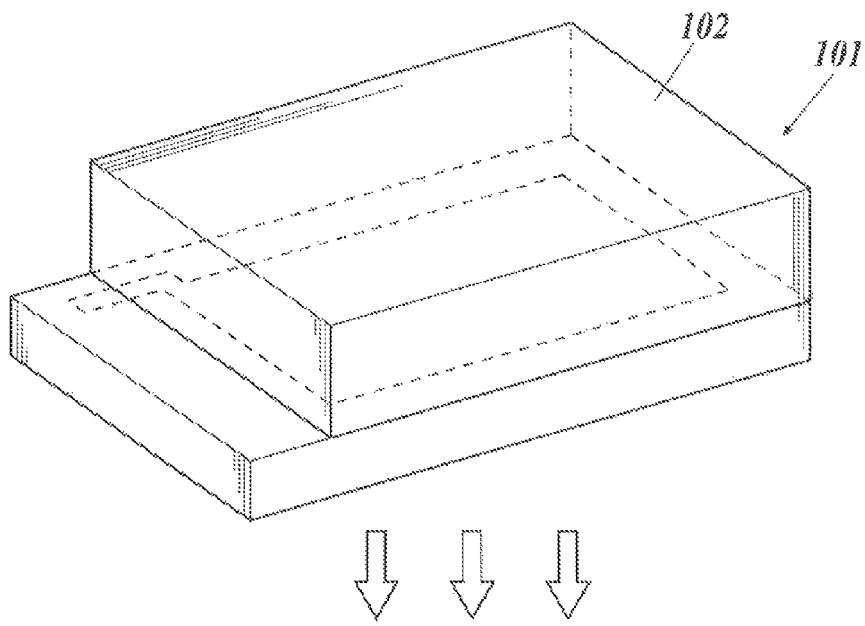
FIG. 5 This is a schematic diagram of an illumination device.

FIG. 5 is a schematic diagram of the illumination device. An organic EL element 101 of the present invention is covered with a glass cover 102 (sealing with the glass cover is performed in a glove box under a nitrogen atmosphere (an atmosphere of high purity nitrogen gas having a purity of at least 99.999%) for preventing the organic EL element 101 from coming in contact with the air).

Figure 6:
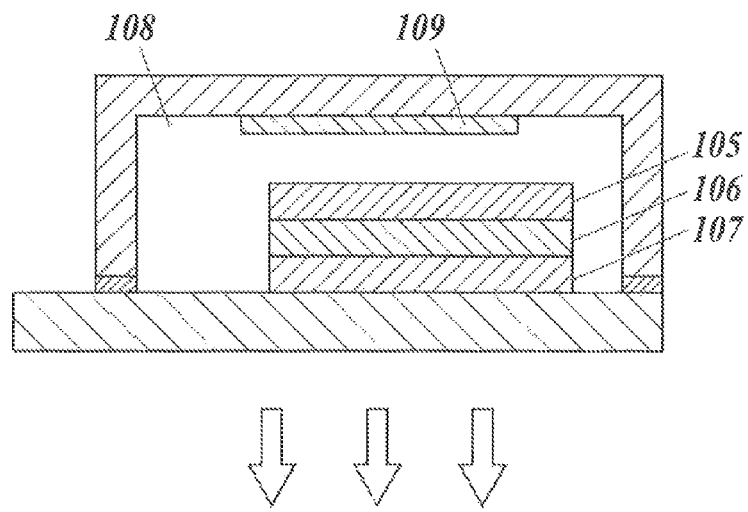
FIG. 6 This is a cross-sectional view of an illumination device.

FIG. 6 is a cross-sectional view of the illumination device. In FIG. 6, reference numeral 105 denotes a cathode, reference numeral 106 denotes an organic EL layer, and reference numeral 107 denotes a glass substrate provided with a transparent electrode. The inside of the glass cover 102 is filled with a nitrogen gas 108 and is provided with a desiccant 109.

In FIGS. 5 and 6, light is emitted in a direction indicated with a white arrow (downward direction).

EXAMPLES

The present invention will now be described with reference to Examples, but the present invention is not limited thereto. In examples, "part(s)" and "%" indicate "part(s) by mass" and "% by mass", respectively, unless described otherwise.

The present invention will now be described, in detail with reference to Examples, but the present invention is not limited thereto. A number and/or symbol assigned to a compound used in Examples corresponds with the number and/or symbol assigned to the compound described in the section "Embodiment for Carrying Out the Invention", the compound used in Examples is the compound described in the above section.

Structures of the compounds used in Examples are shown below.

[Chemical Formula 53]

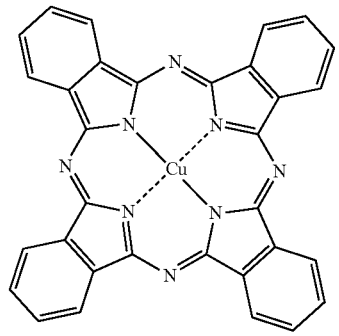

CuPc

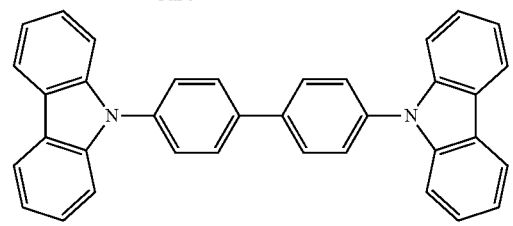

CBP

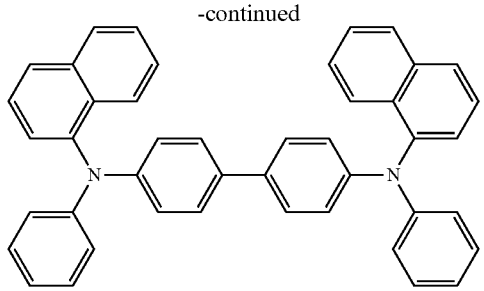
Hole-transporting material 1
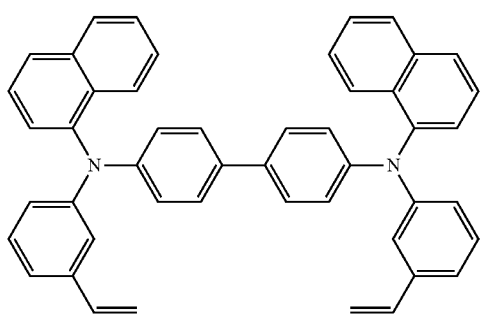
Hole-transporting material 2
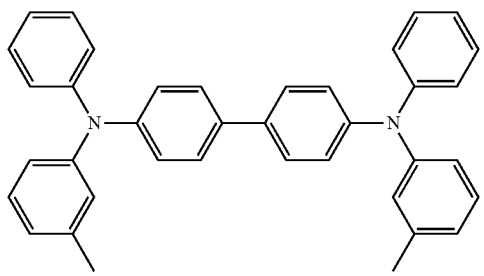
Hole-transporting material 3
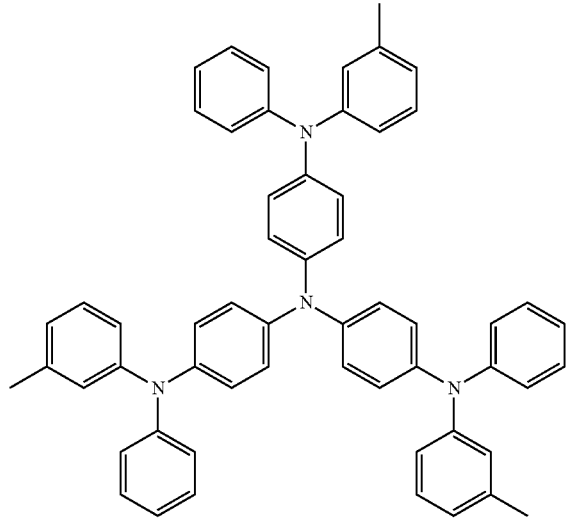
Hole-transporting material 4
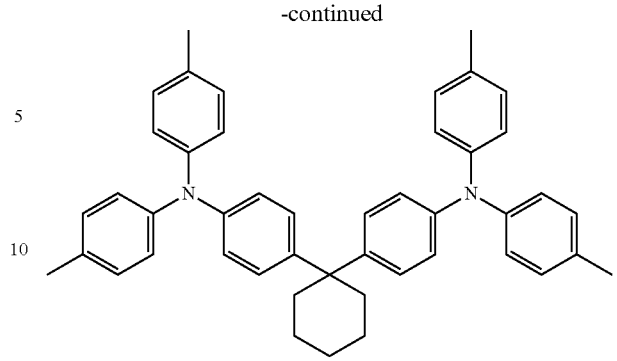
Hole-transporting material 5
[Chemical Formula 54]
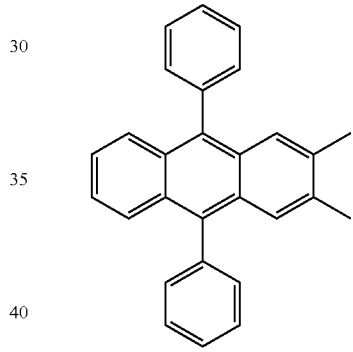
Ir(ppy)$_3$     Ir(piq)$_3$
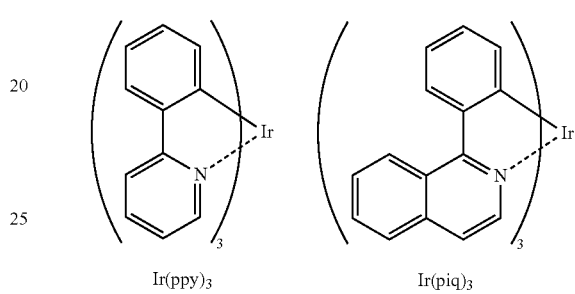
DPT
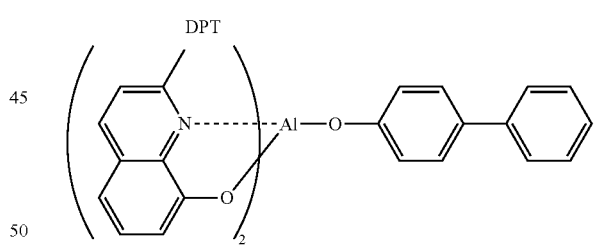
Electron-transporting material 1
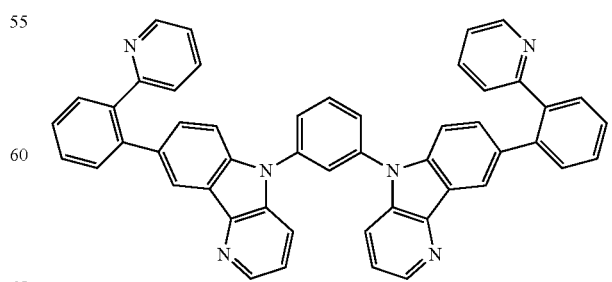
Electron-transporting material 2

-continued

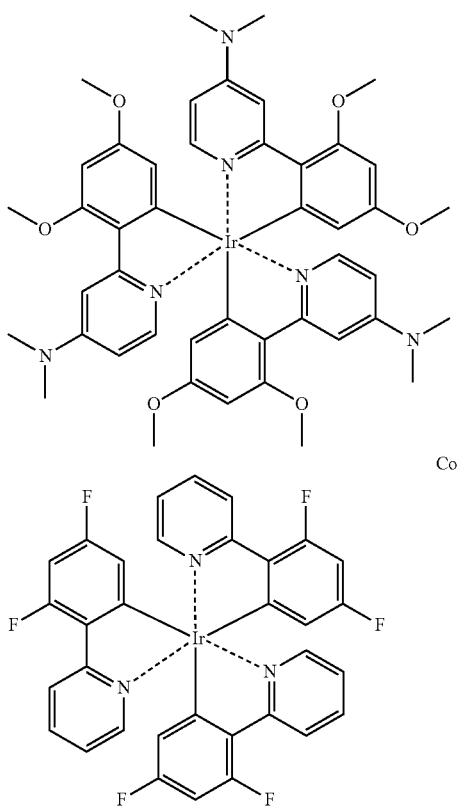

Compound A

Compound B

Example 1

Preparation of Organic EL Element 1-1

A substrate (NA-45, manufactured by NH Techno Glass Corp.), prepared by forming a film of ITO (indium tin oxide) having a thickness of 100 nm on a glass substrate of 100 mm×100 mm×1.1 mm, was patterned to form an anode. This transparent supporting substrate provided with the ITO transparent electrode was cleaned with ultrasonic waves in isopropyl alcohol, dried with dry nitrogen gas, and subjected to UV ozone washing for 5 minutes.

Subsequently, the resulting transparent supporting substrate was fixed on a substrate holder of a commercially-available vacuum deposition device. In addition, a molybdenum resistive heating boat in which 200 mg of the hole-transporting material 3 was placed, a molybdenum resistive heating boat in which 200 mg of the hole-transporting material 1 was placed, a molybdenum resistive heating boat in which 200 mg of the exemplary compound 1 represented by the general formula (2) as the host compound was placed, a molybdenum resistive heating boat in which 100 mg of the blue light-emitting dopant DPT as the light-emitting dopant was placed, a molybdenum resistive heating boat in which 100 mg of the green phosphorescent compound Ir(ppy)$_3$ was placed, a molybdenum resistive heating boat in which 100 mg of the red phosphorescent compound Ir(piq)$_3$ was placed and a molybdenum resistive heating boat in which 200 mg of the electron-transporting material 1 was placed were set in the vacuum deposition device.

Then the vacuum chamber was depressurized by 4×10$^{-4}$ Pa, and the boat in which the hole-transporting material 3 was placed was electrified to be heated so as to form a hole-injecting layer (HIL) having a thickness of 20 nm at a deposition rate of 0.1 nm/sec on the transparent supporting substrate.

Next, the boat in which the hole-transporting material 1 was placed was electrified to be heated so as to form a hole-transporting layer (HTL) having a thickness of 70 nm at a deposition rate of 0.1 nm/sec on the hole-injecting layer.

Then, the boats in each of which the host compound 1, DPT, Ir(ppy)$_3$ or Ir(piq)$_3$ were electrified to be heated so as to form a light-emitting layer (EML) having a thickness of 30 nm at a deposition rate of 0.1 nm/sec for the host compound, a deposition rate of 0.009 nm/sec for DPT, a deposition rate of 0.0003 nm/sec for Ir(ppy)$_3$ and Ir(piq)$_3$ on the hole-transporting layer by co-deposition.

Thereafter, the boat in which the electron-transporting material 1 was placed was electrified to be heated so as to form an electron-transporting layer (ETL) having a thickness of 50 nm at a deposition rate of 0.1 nm/sec on the light-emitting layer.

Subsequently, lithium fluoride was deposited to form a cathode buffer layer having a thickness of 0.5 nm, and then aluminum was deposited to form a cathode having a thickness of 110 nm a. An organic EL element 1-1 was thus prepared.

<<Organic EL Elements 1-2 to 1-8>>

Organic EL elements 1-2 to 1-8 were prepared by the same way as the organic EL element 1-1 was prepared except that the hole-transporting material 1 of the hole-transporting layer (HTL), the host compound (exemplary compound 1) of the light-emitting layer (EML), the blue light-emitting dopant DPT of the light-emitting layer (EML), the electron-transporting material 1 of the electron-transporting layer (ETL) and thicknesses of the respective layers were changed as described in Table 1.

Each of the prepared organic EL elements 1-2 to 1-8 was irradiated with ultraviolet of an excitation wavelength of 365 nm at 23° C., and then its photoluminescence was measured. Thereafter, each organic EL element was made emit light continuously at a constant current of 2.5 mA/cm$^2$ until luminance [cd/m$^2$] just after the start of light emission decreased by half. After 1 hour from that time, i.e., after 1 hour the time when ΔEL reached 0.5, irradiation with ultraviolet light of an excitation wavelength of 365 nm was conducted again under the same condition, and the photoluminescence was measured. Then, a decay rate of photoluminescence intensity ΔPL was obtained, and ΔPL/ΔEL was calculated.

The measurement of PL spectrum was conducted using USB2000 (manufactured by Ocean Optics, Inc.). The measurement of luminance of each organic EL element was conducted using CS-1000 (manufactured by Konica Minolta Sensing, Inc.)$_o$ <<Evaluation of Organic EL Elements 1-1 to 1-8>>

For evaluating the obtained organic EL elements 1-1 to 1-8, the non-light-emitting surface of each organic EL element was covered with a glass case, and a glass substrate having a thickness of 300 μm was used as a sealing substrate, and as a sealing material, an epoxy based photo-curable adhesive (LUXTRACK LC0629B manufactured by Toagosei Co., Ltd.) was applied to the periphery, and the glass cover was placed onto the cathode and was attached to the transparent supporting substrate, followed by curing the adhesive by irradiation with UV light from the glass substrate side for sealing. Illumination devices as shown in FIGS. 5 and 6 were thus formed and were evaluated for the followings.

(Lifetime)

Each organic EL element was made emit light continuously at a constant current of 2.5 mA/cm$^2$ at room temperature, and a time period until the initial luminance decreased by half ($\tau_{1/2}$) was measured. This is an indicator of a lifetime of light emission. The lifetime of light emission was described as a relative value defining the lifetime of light emission by the organic EL element 1-1 as 100. Luminance of each organic EL element; was measured using CS-1000 (manufactured by Konica Minolta Sensing, Inc).

(Stability of Chromaticity)

Stability of chromaticity against change in the driving condition was obtained by calculating the maximum distance variations ΔE of the x and y values in CIE1931 at a front luminance of 300 to 1500 cd/m² according to the following equation, and was classified into A to D.

In a correlated color temperature of 2500 to 7000K in the CIE 1931 color space, it is confirmed that a chromaticity of each organic EL element had a deviation of y value of 0.1 or less from the blackbody locus at every color temperature.

$$\Delta E = (\Delta_x^2 + \Delta_y^2)^{1/2}$$

A: ΔE was less than 0.01
B: ΔE was 0.01 or more and less than 0.015
C: ΔE was 0.015 or more and less than 0.02
D: ΔE was 0.02 or more The results from the above evaluations are shown in Table 1. Hereinafter, the following abbreviations are used in Tables.
HTL: Hole-transporting layer
HIL: Hole-injecting layer
EML: Light-emitting layer
EML 1: Light-emitting layer 1
EML 2: Light-emitting layer 2
ETL: Electron-transporting layer
Host: Host compound
ΔPL/ΔEL: Contribution ratio of light-emitting layer
Lifetime: Lifetime of light emission
Dopant: Phosphorescent compound (phosphorescent dopant) or fluorescent dopant As evident from Table 1, the organic EL elements of the present invention are excellent in the lifetime of light emission and stability of chromaticity compared to the organic EL element of the comparative example. The case where the phosphorescent compound represented by the general formula (1) is the exemplary compound 81 and the host compound is the compound represented by the general formula (2), excellent results are obtained, compared to the chase where DPT which is a fluorescent dopant is used. The case where the organic metal complex represented by the general formula (1) was used as the hole-transporting material and the case where the thickness of the light-emitting layer is thick provide great effects.

Example 2

An organic EL element 1-2 was prepared by the same way as the organic EL element 1-3 was prepared except that the exemplary compound 97 represented by the general formula (2) was used as the host compound in place of the exemplary compound 1 as the host compound in the light-emitting layer (EML) and the blue phosphorescent dopant A was used in place of the blue phosphorescent dopant 1-81 in the light-emitting layer (EML).

<<Preparation of Organic EL Elements 2-2 to 2-3>>

Organic EL elements 2-2 to 2-3 were each prepared by the same way as the organic EL element 2-1 was prepared except that the hole-transporting material, the host compound and the blue phosphorescent dopant were changed as shown in Table 2.

<<Preparation of Organic EL Element 2-4>>

A substrate (NA-45, manufactured by NH Techno Glass Corp.), prepared by forming a film of ITO (indium tin oxide) having a thickness of 100 nm on a glass substrate of 100 mm 100 mm×1.1 mm, was patterned to form an anode. This

TABLE 1

| Organic EL element | HTL Material | HTL Thickness (nm) | Host | EML Blue light-emitting dopant | EML Thickness (nm) | ETL Material | ETL Thickness (nm) | ΔPL/ΔEL | Lifetime (hour) | Stability of Chromaticity | Note |
|---|---|---|---|---|---|---|---|---|---|---|---|
| 1-1 | Hole-transporting material 1 | 70 | 1 | DPT | 30 | Electron-transporting material 1 | 50 | 0.20 | 100 | D | Comparative Example |
| 1-2 | Hole-transporting material 1 | 40 | 1 | 1-81 | 30 | Electron-transporting material 1 | 50 | 0.35 | 240 | B | Present Invention |
| 1-3 | Hole-transporting material 1 | 20 | 1 | 1-81 | 80 | Electron-transporting material 1 | 30 | 0.45 | 300 | B | Present Invention |
| 1-4 | Hole-transporting material 1 | 40 | 1 | 1-81 | 120 | Electron-transporting material 1 | 30 | 0.50 | 350 | B | Present Invention |
| 1-5 | Hole-transporting material 1 | 20 | 1 | 1-81 | 120 | Electron-transporting material 2 | 20 | 0.58 | 320 | B | Present Invention |
| 1-6 | 1-86 | 20 | 1 | 1-81 | 60 | Electron-transporting material 2 | 20 | 0.68 | 350 | A | Present Invention |
| 1-7 | 1-86 | 20 | 1 | 1-81 | 120 | Electron-transporting material 2 | 40 | 0.73 | 400 | A | Present Invention |
| 1-8 | 1-86 | 20 | 96 | 1-81 | 120 | Electron-transporting material 2 | 40 | 0.91 | 380 | A | Present Invention | transparent supporting substrate provided with the ITO transparent electrode was cleaned with ultrasonic waves in isopropyl alcohol, dried with dry nitrogen gas, and subjected to UV ozone washing for 5 minutes.

On this substrate, a film was formed with a 70% solution of poly(3,4-ethylenedioxythiophene)-polystylene sulfonate (abbreviated as PEDOT/PSS, P AI 4083 manufactured by Bayer AG) diluted with pure water by spin coating at 3000 rpm for 30 seconds, followed by drying at 200° C. for an hour. A hole-injecting layer having a thickness of 20 nm was thus obtained.

The resulting substrate was put in a nitrogen atmosphere, and then a thin film was formed on the hole-injecting layer with a solution where 50 mg of the hole-transporting material 2 was dissolved in 10 ml of toluene by spin coating at 1500 rpm for 30 seconds. After photopolymerization and photo-crosslinking by irradiation with ultraviolet light, a hole-transporting layer having a thickness of about 20 nm was obtained.

On this hole-transporting layer, a thin film was formed with a solution where 100 mg of the host compound 1, 9 mg of the blue phosphorescent dopant 1-83, 0.3 mg of Ir(ppy)$_3$ and 0.3 mg of Ir(piq)$_3$ were dissolved in 10 ml of toluene by spin coating at 600 rpm for 30 seconds. After drying in a vacuum at 60° C. for an hour, a light-emitting layer having a thickness of about 70 nm was obtained.

Then, on this light-emitting layer, a thin film was formed with a solution where 50 mg of the electron-transporting compound 2 was dissolved in 10 ml of hexafluoroisopropanol (HFIP) by spin coating at 1000 rpm for 30 seconds. After drying in a vacuum at 60° C. for an hour, an electron-transporting layer having a thickness of about 30 nm was obtained.

The resulting substrate was then fixed on a substrate holder of a vacuum deposition device, and the vacuum chamber was depressurized by $4 \times 10^{-4}$ Pa. Subsequently, a cathode buffer layer having a thickness of 0.4 nm was formed with lithium fluoride, and thereafter a cathode having a thickness of 110 nm was formed with aluminum. The organic EL element 2-14 was thus prepared.

<<Evaluation of Organic EL Elements 2-1 to 2-4>>

For evaluating the obtained organic EL elements 2-1 to 2-4, the non-light-emitting surface of each organic EL element of the present invention was covered with a glass case, an epoxy based photo-curable adhesive (LUXTRACK LC0629B manufactured by Toagosei Co., Ltd.) was applied to the periphery of the glass cover, and then the resulting glass case was placed from above the cathode and was attached to the transparent supporting substrate, followed by curing the adhesive by irradiation with UV light from the side of the glass substrate. Illumination devices as shown in FIGS. 5 and 6 were thus formed and subjected to the following evaluations.

(UV Degradation Resistance Ratio)

As described above, after forming only a light-emitting layer having a thickness of 50 nm on a quartz substrate, the light-emitting layer was irradiated with light (365 nm) at an irradiation distance of 1 cm for 20 minutes using LIGHT-NINGCURE LC8 which is a spot light source (manufactured by Hamamatsu Photonics K.K.). The ratio of the intensities of maximum luminescence obtained with PL spectra before and after the irradiation measured using a spectroradiometer CS4000 (manufactured by Konica Minolta Sensing, Inc.) was obtained with the following equation: UV degradation resistance ratio=PL (after irradiation)/PL (before irradiation)

$\Delta$PL/$\Delta$EL, lifetime of light emission and stability of chromaticity were evaluated by the same way as those were evaluated in Example 1. Chromaticity of emitted light was measured by the same way as that was measured in Example 1, and it was confirmed that the chromaticity was within the preferred range of white light.

Results of the above are shown in Table 2.

TABLE 2

| Organic EL element | HTL Material | EML Host | Blue light-emitting dopant | $\Delta$PL/$\Delta$EL | UV degradation resistance ratio | Lifetime (hour) | Stability of Chromaticity | Note |
|---|---|---|---|---|---|---|---|---|
| 2-1 | Hole-transporting material 1 | 97 | Compound A | 0.20 | 0.35 | 100 | D | Comparative Example |
| 2-2 | 1-87 | 97 | 1-81 | 0.43 | 0.55 | 280 | B | Present Invention |
| 2-3 | 1-87 | 1 | 1-81 | 0.45 | 0.63 | 350 | A | Present Invention |
| 2-4 | Hole-transporting material 2 | 1 | 1-83 | 0.42 | 0.63 | 340 | A | Present Invention |

As evident from Table 2, the organic EL elements of the present invention are excellent in the lifetime of light emission and the stability of chromaticity, compared to the organic EL element of the comparative example. In the case where $\Delta$PL/$\Delta$EL ranges from 0.3 to 1.0 and the UV degradation resistance ratio is 0.6 or more; the lifetime is greatly lengthened and also the stability of chromaticity is greatly affected. In addition, the favorable results are achieved in the organic EL element 2-4 whose hole-injecting layer, the hole-transporting layer, the light-emitting layer and the electron-transporting layer are applied and formed by a wet method.

Example 3

Preparation of Organic EL Element 3-1

An organic EL element 3-1 was prepared by the same way as the organic EL element 2-1 was prepared except that the exemplary compound 1 was used as the host compound in place of the exemplary compound 97 as the host compound in the light-emitting layer (EML).

<<Preparation of Organic EL Element 3-2 to 3-3>>

Organic EL elements 3-2 and 3-3 were each prepared by the same way as the organic EL element 301 was prepared except that the phosphorescent compound represented by the general formula (1) was used in place of the compound A as shown in Table 3.

Ionization potentials of the compounds used in the hole-transporting layers and the light-emitting layers were each measured using UPS (ESCA 5600 UPS (ultraviolet photo-emission spectroscopy) manufactured by ULVAC-PHI, Inc.). The ΔPL/ΔELs and the UV degradation resistance ratios were each measured by the ways described above.

<<Evaluation of Organic EL Element 3-1 to 3-3>>

For evaluating the obtained organic EL elements 3-1 to 3-3, the non-light-emitting surface of each organic EL element of the present invention was covered with a glass case, an epoxy based photo-curable adhesive (LUXTRACK LC0629B manufactured by Toagosei Co., Ltd.) was applied to the periphery of the glass cover, and then the resulting glass case was placed from above the cathode and was attached to the transparent supporting substrate, followed by curing the adhesive by irradiation with UV light from the side of the glass substrate. Illumination devices as shown in FIGS. 5 and 6 were thus formed and subjected to the following evaluations.

The lifetime of light emission and the stability of chromaticity were evaluated by the same ways as those were evaluated in Example 2.

Chromaticity of emitted light was measured by the same way as that was measured in Example 1, and it was confirmed that the chromaticity was within the preferred range of white light.

(Rank in Evaluation of Dark Spot (Non-Light-Emitting Spot))
⊚: no dark spot was generated
○: the number of dark spots was 1 or more and less than
Δ: the number of dark spots was 5 or more and less than
X: the number of dark spots was 20 or more
Results from the above are shown in Table 3.

respectively, and are higher than an IP of the blue light-emitting dopant. Thus, influence of these IPs is not predominant.

Example 4

An organic EL element 4-1 was prepared by the same way as the organic EL element 2-1 was prepared except that the hole-transporting material 5 was used in place of the hole-transporting material 1 in the hole-transporting layer (HTL).

<<Preparation of Organic EL Elements 4-2 to 4-3>>

Organic EL elements 4-2 to 4-3 were each prepared by the same way as the organic EL element 4-1 was prepared except that the compounds for the hole-injecting layer, the hoe-transporting layer and the light-emitting dopant were changed as shown in Table 4.

Ionization potentials of the compounds used in the hole-injecting layers, the hole-transporting layers and the light-emitting layers were each measured using the UPS. The ΔPL/ΔELs and the UV degradation resistance ratios were each measured by the ways described in the description.

<<Evaluation of Organic EL Elements 4-1 to 4-3>>

For evaluating the obtained organic EL elements 4-1 to 4-3, the non-light-emitting surface of each organic EL element of the present invention was covered with a glass case, an epoxy based photo-curable adhesive (LUXTRACK LC0629B manufactured by Toagosei Co., Ltd.) was applied to the periphery of the glass cover, and then the resulting glass case was placed from above the cathode and was attached to the

TABLE 3

| | | | EML | | | | | | | |
|---|---|---|---|---|---|---|---|---|---|---|
| | | | | Blue light-emitting dopant | | | | | | |
| Organic EL element | HTL Material | IP | Host | Material | Maximum emission wavelength (nm) | IP | ΔIP ※1 | ΔPL/ ΔEL | UV degradation resistance ratio | Lifetime (hour) | Stability of Chromaticity | Dark spot | Note |
| 3-1 | Hole-transporting material 1 | 5.56 | 1 | Compound A | 479 | 5.01 | −0.55 | 0.22 | 0.41 | 110 | D | X | Comparative Example |
| 3-2 | Hole-transporting material 1 | 5.56 | 1 | 1-90 | 467 | 5.36 | −0.20 | 0.43 | 0.67 | 380 | A | ⊚ | Present Invention |
| 3-3 | Hole-transporting material 1 | 5.56 | 1 | 1-91 | 497 | 5.35 | −0.21 | 0.40 | 0.63 | 350 | B | ⊚ | Present Invention |

※1: (IP of the blue light-emitting dopant) − (IP of HTL)

As evident from Table 3, the organic EL elements of the present invention are excellent in the lifetime of light emission and the stability of chromaticity, and also generate less dark spots, compared to the organic EL element of the comparative example, in the case where the ΔPL/ΔEL ranges from 0.3 to 1.0, the UV degradation resistance ratio is 0.6 or more and ΔIP (an IP of the blue light-emitting dopant minus an IP of the HTL) ranges from −0.3 to 0.2 eV, the lifetime is greatly lengthened, the stability of chromaticity is greatly improved, and also the dark spots are largely decreased.

IPs of the dopants other than the blue light-emitting dopant, namely, IPs of the green light-emitting dopant Ir(ppy)$_3$ and the red light-emitting dopant Ir(piq)$_3$, are 5.48 and 5.40, was placed from above the cathode and was attached to the transparent supporting substrate, followed by curing the adhesive by irradiation with UV light from the side of the glass substrate. Illumination devices as shown in FIGS. 5 and 6 were thus formed and subjected to the following evaluations.

The lifetime of light emission, the stability of chromaticity and the dark spots were evaluated by the same way as those were evaluated in Example 3. Chromaticity of emitted light was measured by the same way as that was measured in Example 1, and it was confirmed that the chromaticity was within the preferred range of white light.

Results obtained from the above are shown in Table 4.

TABLE 4

| Organic EL element | HIL | | HTL | | Host | Blue light-emitting dopant | | | ΔIP | | |
|---|---|---|---|---|---|---|---|---|---|---|---|
| | Material | IP | Material | IP | | Material | Maximum emission wavelength (nm) | IP | ※1 | ※2 | ※3 |
| 4-1 | Hole-transporting material 3 | 5.4 | Hole-transporting material 5 | 5.8 | 1 | Compound A | 479 | 5.0 | −0.79 | 0.40 | 0.40 |
| 4-2 | Hole-transporting material 3 | 5.4 | 1-88 | 5.1 | 1 | 1-83 | 467 | 5.0 | −0.06 | 0.40 | −0.30 |
| 4-3 | CuPc | 5.1 | 1-88 | 5.1 | 1 | 1-81 | 473 | 5.1 | 0.02 | 0.05 | 0.05 |

| Organic EL element | ΔPL/ ΔEL | UV degradation resistance ratio | Lifetime (hour) | Stability of Chromaticity | Dark spot | Note |
|---|---|---|---|---|---|---|
| 4-1 | 0.24 | 0.41 | 120 | D | X | Comparative Example |
| 4-2 | 0.60 | 0.61 | 380 | B | ○ | Present Invention |
| 4-3 | 0.71 | 0.63 | 420 | A | ◎ | Present Invention |

※1: (IP of the blue light-emitting dopant) − (IP of HTL)
※2: (IP of HTL) − (Work function of ITO)
※3: (IP of HTL) − (IP of HIL)

As evident from Table 4, the organic EL elements of the present invention are excellent in the lifetime of light emission and the stability of chromaticity and generate less dark spots, compared to the organic EL element of the comparative example. In the case where ΔIP (an IP of the blue light-emitting dopant minus an IP of the HTL) ranges from −0.3 to 0.2, ΔIP (an IP of HIL minus a work function of ITO) ranges from −0.2 to 0.3 eV and ΔP (an IP of HTL minus an IP of HIL) ranges from −0.3 to 0.2 eV, the lifetime is lengthened more greatly, the stability of chromaticity is improved more largely and also the dark spots are lessened more greatly.

Example 5

An organic EL element 5-1 was prepared by the same way as the organic EL element 2-1 was prepared except that the host compound 100 was used in place of the host compound 97 in the light-emitting layer.

<<Preparation of Organic EL Elements 5-2 to 5-9>>

Organic EL elements 5-2 to 5-9 were each prepared by the same way as the organic EL element 5-1 was prepared except that the hole-transporting material and the blue phosphorescent light-emitting dopant were changed as shown in Table 5.

Ionization potentials of the compounds used in the hole-injecting layers, the hole-transporting layers and the light-emitting layers were each measured using the UPS. The ΔPL/ΔELS and the UV degradation resistance ratios were each measured by the ways described in the description.

<<Evaluation of Organic EL Elements 5-1 to 5-9>>

For evaluating the obtained organic EL elements 5-1 to 5-9, the non-light-emitting surface of each organic EL element of the present invention was covered with a glass case, an epoxy based photo-curable adhesive (LUXTRACK LCOG29E manufactured by Toagosei Co., Ltd.) was applied to the periphery of the glass cover, and then the resulting glass case was placed, from above the cathode and was attached to the transparent supporting substrate, followed by curing the adhesive by irradiation with UV light from the side of the glass substrate. Illumination devices as shown in FIGS. 5 and 6 were thus formed and subjected to the following evaluations.

The lifetime of light emission, the stability of chromaticity and the dark spots were evaluated by the same way as those were evaluated in Example 3. Chromaticity of emitted light was measured by the same way as that was measured in Example 1, and it was confirmed that the chromaticity was within the preferred range of white light.

Results obtained from the above are shown in Table 5.

TABLE 5

| Organic EL element | HTL | | Host | Blue light-emitting dopant | | | ΔIP ※1 | ΔPL/ ΔEL | UV degradation resistance ratio | Lifetime (hour) | Stability of Chromaticity | Dark spot | Note |
|---|---|---|---|---|---|---|---|---|---|---|---|---|---|
| | Material | IP | | Material | Maximum emission wavelength (nm) | IP | | | | | | | |
| 5-1 | Hole-transporting material 1 | 5.56 | 100 | Compound A | 479 | 5.01 | −0.55 | 0.24 | 0.45 | 130 | D | X | Comparative Example |

TABLE 5-continued

| Organic EL element | HTL Material | IP | Host | Blue light-emitting dopant Material | Maximum emission wavelength (nm) | IP | ΔIP ※1 | ΔPL/ ΔEL | UV degradation resistance ratio | Lifetime (hour) | Stability of Chromaticity | Dark spot | Note |
|---|---|---|---|---|---|---|---|---|---|---|---|---|---|
| 5-2 | 1-89 | 5.19 | 100 | 1-81 | 473 | 5.12 | −0.07 | 0.58 | 0.71 | 220 | B | ○ | Present Invention |
| 5-3 | 1-87 | 4.99 | 100 | 1-81 | 473 | 5.12 | 0.13 | 0.50 | 0.71 | 360 | A | ◉ | Present Invention |
| 5-4 | 1-92 | 5.23 | 100 | 1-81 | 473 | 5.12 | −0.11 | 0.52 | 0.71 | 350 | A | ◉ | Present Invention |
| 5-5 | 1-93 | 5.25 | 100 | 1-81 | 473 | 5.12 | −0.13 | 0.52 | 0.71 | 350 | A | ◉ | Present Invention |
| 5-6 | 1-81 | 5.12 | 100 | 1-89 | 479 | 5.19 | 0.07 | 0.56 | 0.62 | 230 | B | ○ | Present Invention |
| 5-7 | 1-81 | 5.12 | 100 | 1-92 | 463 | 5.23 | 0.11 | 0.50 | 0.61 | 350 | A | ◉ | Present Invention |
| 5-8 | 1-81 | 5.12 | 100 | 1-93 | 467 | 5.25 | 0.13 | 0.51 | 0.65 | 350 | A | ◉ | Present Invention |
| 5-9 | 1-87 | 5.12 | 100 | 1-87 | 473 | 5.12 | 0 | 0.80 | 0.76 | 570 | A | ◉ | Present Invention |

※1: (IP of the blue light-emitting dopant) − (IP of HTL)

As evident from Table 5, the organic EL elements of the present invention are excellent in the lifetime of light emission and the stability of chromaticity and generate less dark spots. By using the compounds represented by the general formula (1) shown in Table 5, the lifetime is greatly lengthened and the stability of chromaticity is greatly improved, and also dark spots are greatly lessened, which are further enhanced when the same compound is used as the HTL and the blue light-emitting dopant.

Example 6

An organic EL element 6-1 was prepared by the same way as the organic EL element 2-1 was prepared except that CBP was used in place of the host compound 97.

<<Preparation of Organic EL Elements 6-2 to 6-8>>

Organic EL elements 6-2 to 6-8 were each prepared by the same way as the organic EL element 6-1 was prepared except that the hole-transporting material in the hole-transporting layer, and the host compound and the light-emitting dopant in the light-emitting layer were changed to the compounds shown in Table 6.

Ionization potentials of the compounds used in the hole-injecting layers, the hole-transporting layers and the light-emitting layers were each measured using the UPS. The ΔPL/ΔELs and the UV degradation resistance ratios were each measured by the ways described in the description.

<<Evaluation of Organic EL Elements 6-1 to 6-8>>

For evaluating the obtained organic EL elements 6-1 to 6-8, the non-light-emitting surface of each organic EL element of the present invention was covered with a glass case, an epoxy based photo-curable adhesive (LUXTRACK LC0629B manufactured by Toagosei Co., Ltd.) was applied to the periphery of the glass cover, and then the resulting glass case was placed from above the cathode and was attached to the transparent supporting substrate, followed by curing the adhesive by irradiation with UV light from the side of the glass substrate. Illumination device as shown in FIGS. 5 and 6 were thus formed and subjected to the following evaluations.

The lifetime of light emission, the stability of chromaticity and the dark spots were evaluated by the same way as those were evaluated in Example 3. Chromaticity of emitted light was measured by the same way as that was measured in Example 1, and it was confirmed that the chromaticity was within the preferred range of white light.

Results obtained from the above are shown in Table 6.

TABLE 6

| Organic EL element | HTL Material | IP | Host | Blue light-emitting dopant Material | Maximum emission wavelength (nm) | IP | ΔIP ※1 | ΔPL/ ΔEL | UV degradation resistance ratio | Lifetime (hour) | Stability of Chromaticity | Dark spot | Note |
|---|---|---|---|---|---|---|---|---|---|---|---|---|---|
| 6-1 | Hole-transporting material 1 | 5.56 | CBP | Compound A | 479 | 5.01 | −0.55 | 0.25 | 0.40 | 130 | D | X | Comparative Example |
| 6-2 | 1-81 | 5.12 | CBP | 1-87 | 474 | 4.99 | −0.13 | 0.35 | 0.55 | 250 | B | ○ | Present Invention |

TABLE 6-continued

| Organic EL element | HTL Material | HTL IP | Host | EML Blue light-emitting dopant Material | EML Blue light-emitting dopant Maximum emission wavelength (nm) | EML Blue light-emitting dopant IP | ΔIP ※1 | ΔPL/ΔEL | UV degradation resistance ratio | Lifetime (hour) | Stability of Chromaticity | Dark spot | Note |
|---|---|---|---|---|---|---|---|---|---|---|---|---|---|
| 6-3 | 1-81 | 5.12 | 98 | 1-87 | 474 | 4.99 | −0.13 | 0.63 | 0.90 | 550 | A | ◎ | Present Invention |
| 6-4 | 1-81 | 5.12 | 99 | 1-87 | 474 | 4.99 | −0.13 | 0.60 | 0.83 | 530 | A | ◎ | Present Invention |
| 6-5 | 1-81 | 5.12 | 1 | 1-87 | 474 | 4.99 | −0.13 | 0.62 | 0.76 | 520 | A | ◎ | Present Invention |
| 6-6 | 1-81 | 5.12 | 100 | 1-87 | 474 | 4.99 | −0.13 | 0.68 | 0.75 | 550 | A | ◎ | Present Invention |
| 6-7 | 1-81 | 5.12 | 101 | 1-87 | 474 | 4.99 | −0.13 | 0.66 | 0.72 | 560 | A | ◎ | Present Invention |
| 6-8 | 1-81 | 5.12 | 102 | 1-87 | 474 | 4.99 | −0.13 | 0.66 | 0.73 | 560 | A | ◎ | Present Invention |

※1: (IP of the blue light-emitting dopant) − (IP of HTL)

As evident from Table 6, the organic EL elements of the present invention are excellent in the lifetime of light emission and the stability of chromaticity and generate less dark spots. By using the compounds represented by the general formula (2) shown in Table 5, the lifetime is greatly lengthened and the stability of chromaticity is greatly improved, and also dark spots are greatly lessened.

Example 7

Preparation of Organic EL Element 7-1

An organic EL element 7-1 was prepared by the same way as the organic EL element 2-1 was prepared except that 1-90 was used in place of the hole-transporting material 1, the light-emitting dopant 1-86 was used in place of the light-emitting dopant A, the host compound 1 was used in place of the host compound 97 and the thickness of the light-emitting layer was 120 nm.

<<Preparation of Organic EL Element 7-2>>

In the preparation of the organic EL element 7-1, another molybdenum resistive heating boat in which 200 mg of the host compound 98 was placed was further prepared. The boat was set in a vacuum deposition device as in the preparation of the organic EL element 7-1.

The vacuum chamber was depressurized by $4 \times 10^{-4}$, and then the heating boat in which the hole-transporting material 3 was placed was electrified to be heated so as to form a hole-injecting layer (HIL) having a thickness of 20 nm on the transparent supporting substrate at a deposition rate of 0.1 nm/sec.

The vacuum chamber was depressurized by $4 \times 10^{-4}$, and then the heating boat in which the hole-transporting material 3 was placed was electrified to be heated so as to deposit the hole-transporting material 3 on the transparent supporting substrate at a deposition rate of 0.1 nm/sec. A hole-injecting layer (HIL) having a thickness of 20 nm was thus formed.

Thereafter, the heating boat in which the 1-90 was placed was electrified to be heated so as to co-deposit the 1-90 on the hole-injecting layer at a deposition rate of 0.1 nm/sec. A hole-transporting layer (HTL) having a thickness of 40 nm was thus formed.

Then, the heating boats in each of which the host compound 1 or the 1-86 was placed were electrified to be heated so as to co-deposit the host compound 1 and the 1-86 on the hole-transporting layer at a deposition rate of 0.1 nm/sec for the host compound and a deposition rate of 0.009 nm/sec for the 1-86. A light-emitting layer 1 (EML 1) having a thickness of 40 nm was thus formed.

Subsequently, the heating boats in each of which the host compound 97, Ir(ppy) or Ir(piq)$_3$ was placed were electrified to be heated so as to co-deposit the host compound 97, Ir(ppy)$_3$ and Ir(piq)$_3$ on the light-emitting layer at a deposition rate of 0.1 nm/sec for the host compound, a deposition rate of 0.0005 nm/sec for Ir(ppy)$_3$ and a deposition rate of 0.0003 nm/sec for Ir(piq)$_3$. A light-emitting layer 2 (EML 2) having a thickness of 80 nm was thus formed.

Next, the heating boat in which the electron-transporting material 2 was placed was electrified to be heated so as to deposit the electron-transporting material 2 on the light-emitting layer at a deposition rate of 0.1 nm/sec. An electron-transporting layer having a thickness of 30 nm was thus formed.

Subsequently, lithium fluoride was deposited to form a cathode buffer layer having a thickness of 0.5 nm, and then aluminum was deposited to form a cathode having a thickness of 110 nm. An organic EL element 7-2 was thus prepared.

<<Preparation of Organic EL Element 7-3>>

An organic EL element 7-3 was prepared by the same way as the organic EL element 7-2 was prepared except that the configuration, thickness and the compounds were changed as shown in Table 7.

Table 7 also shows ΔPL/ΔELs measured by the way described in the description.

<<Evaluation of Organic EL Elements 7-1 to 7-3>>

For evaluating the obtained organic EL elements 7-1 to 7-3, the non-light-emitting surface of each organic EL element of the present invention was covered with a glass case, an epoxy based photo-curable adhesive (LUXTRACK LC0629B manufactured by Toagosei Co., Ltd.) was applied to the periphery of the glass cover, and then the resulting glass case was placed from above the cathode and was attached to the transparent supporting substrate, followed by curing the adhesive by irradiation with UV light from the side of the glass substrate. Illumination devices as shown in FIGS. 5 and 6 were thus formed and subjected to the following evaluations.

The lifetime of light emission, the stability of chromaticity and the dark spots were evaluated by the same way as those were evaluated in Example 3. Chromaticity of emitted light was measured by the same way as that was measured in Example 1, and it was confirmed that the chromaticity was within the preferred range of white light.

TABLE 7

| Organic EL element | EML 1 Host | EML 1 Dopant | EML 1 Thickness (nm) | EML 2 Host | EML 2 Dopant | EML 2 Thickness (nm) | ΔPL/ ΔEL | Lifetime (hour) | Stability of Chromaticity | Note |
|---|---|---|---|---|---|---|---|---|---|---|
| 7-1 | 1 | 1-86 | 120 | — | — | — | 0.65 | 400 | B | Present Invention |
| 7-2 | 1 | 1-86 | 40 | 98 | Ir(ppy)$_3$, Ir(piq)$_3$ | 80 | 0.51 | 360 | B | Present Invention |
| 7-3 | 1 | Ir(ppy)$_3$, Ir(piq)$_3$ | 80 | 98 | 1-81 | 40 | 0.46 | 390 | B | Present Invention |

As evident from Table 7, the organic EL elements of the present invention are excellent in the lifetime of light emission, and even two light-emitting layers are provided, the lengthened lifetime and the stability of chromaticity can be both achieved. The same applies to the case where the green and red dopants are used in the light-emitting layer that is nearer to the HTL.

Example 8

Preparation of Organic EL Full-Color Display Device

Figure 7:
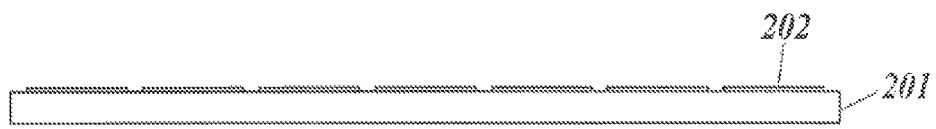
FIG. 7 This is a schematic diagram illustrating a configuration of an organic EL full-color display device.
Figure 7:
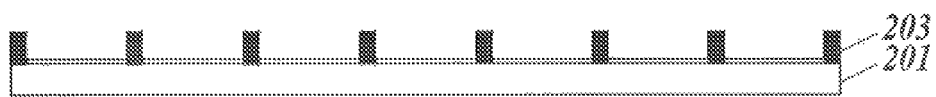
Figure 7:
Figure 7:
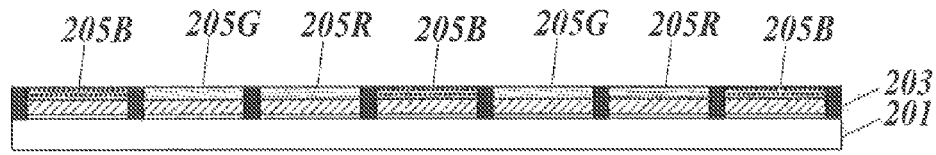
Figure 7:
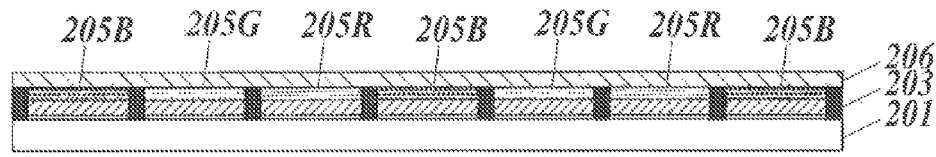

FIG. 7 is a schematic diagram illustrating an organic EL full-color display device. A substrate 201 (NA-45, manufactured by NH Techno Glass Corp.), prepared by forming ITO transparent electrodes (202) having a thickness of 100 nm on a glass substrate, was subjected to patterning at a pitch of 100 μm. On the resulting substrate, partitions 203 (their width were each 20 μm and thicknesses were each 2.0 μm) made from a non-photosensitive polyimide were formed between the ITO transparent electrodes.

Then, compounds for a blue light-emitting layer, compounds for a green light-emitting layer and compounds for a red light-emitting layer were each discharged from an inkjet head (MJ800C, manufactured by Epson Corp.) so as to be injected between the polyimide partitions and on the ITO electrodes, followed by drying at 60° C. for 10 minutes. Light-emitting layers each emitting blue (B), green (G) or red (R) light (205B, 205G and 205R) were thus formed.

Subsequently, the compound 54 was deposited on the light-emitting layers so as to cover the light-emitting layers. Lithium fluoride was then deposited to obtain a thickness of 0.6 nm, and Al was deposited to form a cathode having a thickness of 130 nm (206). An organic EL element was thus prepared.

A voltage was applied to the respective electrodes of the prepared organic EL element, and blue light, green light and red light were observed. Therefore, it is confirmed that the organic EL element can be used as a full-color display device. Chromaticity of emitted light was measured by the same way as that was measured in Example 1, and it was confirmed that the chromaticity was within the preferred range of white light.

| (Compound for Hole-Injecting Layer) | |
|---|---|
| Hole-transporting material 1-87 | 20 parts by mass |
| Cyclohexylbenzene | 50 parts by mass |
| Isopropyl biphenyl | 50 parts by mass |
| (Compound for Blue Light-Emitting Layer) | |
| General formula (2)-1 | 0.7 part by mass |
| General formula (1) 1-86 | 0.04 part by mass |
| Cyclohexylbenzene | 50 parts by mass |
| Isopropyl biphenyl | 50 parts by mass |
| (Compound for Green Light-Emitting Layer) | |
| General formula (2)-1 | 0.7 part by mass |
| Ir(ppy)$_3$ | 0.04 part by mass |
| Cyclohexylbenzene | 50 parts by mass |
| Isopropyl biphenyl | 50 parts by mass |
| (Compound for Red Light-Emitting Layer) | |
| General formula (2)-1 | 0.7 part by mass |
| Ir(piq)$_3$ | 0.04 part by mass |
| Cyclohexylbenzene | 50 parts by mass |
| Isopropyl biphenyl | 50 parts by mass |

INDUSTRIAL APPLICABILITY

The organic electroluminescence element of the present invention is excellent in a long lifetime, low-voltage driving and stability of chromaticity, generates less dark spots, and can be suitably used in an illumination device and a display device.

DESCRIPTION OF REFERENCE SIGN

1 Display
3 Pixel
5 Scanning line
6 Data line
7 Power line
10 Organic EL element
11 Switching transistor
12 Driving transistor
13 Capacitor
A Display unit
B Control unit
101 Organic EL element
102 Glass cover
105 Cathode
106 Organic EL layer
107 Glass substrate with transparent electrode
108 Nitrogen gas
109 Desiccant 201 Glass substrate
202 ITO transparent electrode
203 Partition
204 Hole-injecting layer
205B, 205G, 205R Light-emitting layer
206 Al

The invention claimed is:

1. An organic electroluminescence element comprising at least one light-emitting layer provided between an anode and a cathode, wherein
a contribution ratio of the light-emitting layer is 0.3 or more and 1.0 or less, the contribution ratio ($\Delta PL/\Delta EL$) of the light-emitting layer being defined as a ratio of a decay rate of photoluminescence intensity ($\Delta PL$) to a decay rate of electroluminescence intensity ($\Delta EL$).

2. The organic electroluminescence element of claim 1, wherein
the light-emitting layer comprises at least one phosphorescent compound.

3. The organic electroluminescence element of claim 2, wherein
a hole-transporting layer is provided between the anode and the light-emitting layer and adjacent to the light-emitting layer, and
an ionization potential of the at least one phosphorescent compound ranges from −0.3 to 0.2 eV relative to an ionization potential of at least one hole-transporting material contained in the hole-transporting layer.

4. The organic electroluminescence element of claim 3, wherein
a hole-injecting layer is provided between the anode and the hole-transporting layer, and
an ionization potential of at least one hole-injecting material contained in the hole-injecting layer ranges from −0.2 to 0.3 eV relative to a work function of the anode and ranges from −0.3 to 0.2 eV relative to the ionization potential of the at least one hole-transporting material contained in the hole-transporting layer.

5. The organic electroluminescence element of claim 3, wherein
the hole-transporting layer comprises at least one organic metal complex.

6. The organic electroluminescence element of claim 5, wherein
the organic metal complex is represented by a general formula (1);

[Chemical Formula 1]

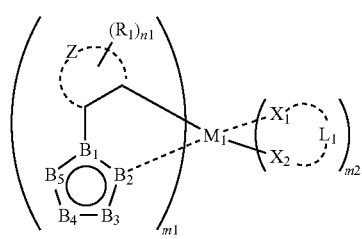

General formula (1)

wherein $R_1$ represents a substituent; Z represents a group of non-metal atoms necessary for forming a five to seven-membered ring; n1 represents an integer from 0 to 5; $B_1$ to $B_5$ each represent a carbon atom, a nitrogen atom, an oxygen atom or a sulfur atom and at least one of $B_1$ to $B_5$ represents a nitrogen atom, wherein a monocyclic nitrogen-containing aromatic hetero ring consists of these five atoms; $M_1$ represents a metal of Group 8 to 10 of the periodic table; $X_1$ and $X_2$ each represent a carbon atom, a nitrogen atom or an oxygen atom; $L_1$ represents a group of atoms forming a bidentate ligand together with $X_1$ and $X_2$; m1 represents an integer from 1 to 3; m2 represents an integer from 0 to 2; and m1+m2 equals to 2 or 3.

7. The organic electroluminescence element of claim 5, wherein
the phosphorescent compound in the light-emitting layer adjacent to the hole-transporting layer and the at least one organic metal complex in the hole-transporting layer are the same.

8. The organic electroluminescence element of claim 2, wherein
at least one of the phosphorescent compound(s) has a maximum emission wavelength of 480 nm or less.

9. The organic electroluminescence element of claim 2, wherein
the phosphorescent compound in the light-emitting layer is represented by the general formula (1).

10. The organic electroluminescence element of claim 2, wherein
the light-emitting layer comprising the at least one phosphorescent compound comprises a compound represented by a general formula (2);

[Chemical Formula 2]

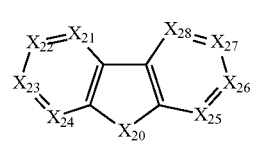

General formula (2)

wherein $X_{20}$ represents O or S; $X_{21}$ to $X_{28}$ each represent $C(R_{20})$ or N; $R_{20}$ represents a hydrogen atom or a substituent; and at least one $R_{20}$ is represented by a following general formula (b1);

[Chemical Formula 3]

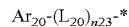

General formula (b1)

wherein $L_{20}$ represents a divalent liking group derived from an aromatic hydrocarbon ring or an aromatic hetero ring; n23 represents an integer from 0 to 3; in the case where n23 is 2 or more, $L_{20}$s may be the some or different from each other; * represents a linking site to a scaffold of the general formula (2); and $Ar_{20}$ represents a group represented by a following general formula (b2);

[Chemical Formula 4]

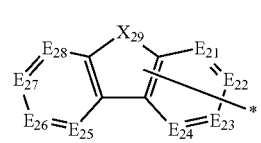

General formula (b2)

wherein $X_{29}$ represents $N(R_{21})$, O or S; $E_{21}$ to $E_{28}$ each represent $C(R_{22})$ or N; $R_{21}$ and $R_{22}$ each represent a hydrogen atom, a substituent or a linking site to $L_{70}$; and * represents a linking site to $L_{20}$.

11. The organic electroluminescence element of claim 10, wherein
   a layer comprising the compound represented by the general formula (2) is formed by a wet method.

12. The organic electroluminescence element of claim 1, wherein
   a UV degradation resistance ratio of the at least one light-emitting layer as a single film is 0.6 or more.

13. The organic electroluminescence element of claim 1, wherein
   the organic electroluminescence element emits white light.

14. An illumination device comprising the organic electroluminescence element of claim 1.

15. A display, device comprising the organic electroluminescence element of claim 1.

* * * * *